(12) United States Patent
Yoshida et al.

(10) Patent No.: US 6,885,908 B2
(45) Date of Patent: Apr. 26, 2005

(54) METHOD OF DETERMINING MOVEMENT SEQUENCE, ALIGNMENT APPARATUS, METHOD AND APPARATUS OF DESIGNING OPTICAL SYSTEM, AND MEDIUM IN WHICH PROGRAM REALIZING THE DESIGNING METHOD

(75) Inventors: Koji Yoshida, Kanagawa (JP); Junya Kiyohara, Kanagawa (JP); Isao Ono, Kanagawa (JP); Yoshihiro Tatsuzawa, Kanagawa (JP); Shigenobu Kobayashi, Tokyo (JP)

(73) Assignee: Nikon Corporation, Tokyo (JP)

( * ) Notice: Subject to any disclaimer, the term of this patent is extended or adjusted under 35 U.S.C. 154(b) by 50 days.

(21) Appl. No.: 09/900,016

(22) Filed: Jul. 9, 2001

(65) Prior Publication Data

US 2001/0053962 A1 Dec. 20, 2001

Related U.S. Application Data

(63) Continuation of application No. 09/023,204, filed on Feb. 13, 1998.

(30) Foreign Application Priority Data

| Feb. 14, 1997 | (JP) | 9-030518 |
| Mar. 11, 1997 | (JP) | 9-056373 |
| Jun. 25, 1997 | (JP) | 9-168420 |
| Dec. 17, 1997 | (JP) | 9-348342 |
| Dec. 24, 1997 | (JP) | 9-355176 |

(51) Int. Cl.[7] ............................................. G06F 19/00
(52) U.S. Cl. ..................... 700/191; 700/56; 700/279; 701/129
(58) Field of Search ............... 700/56–60, 191–192, 700/121, 36–37, 279, 28, 33, 186; 382/321; 159/195; 701/129

(56) References Cited

U.S. PATENT DOCUMENTS

| 4,677,301 A | 6/1987 | Tanimoto et al. ............ 250/548 |
| 4,780,617 A | 10/1988 | Umatate et al. ............ 250/548 |
| 5,137,363 A | 8/1992 | Kosugi et al. .............. 356/401 |

(Continued)

FOREIGN PATENT DOCUMENTS

| EP | 0 715 215 A1 | 6/1996 |
| JP | 61-44429 | 3/1986 |
| JP | 6-275496 | 9/1994 |

OTHER PUBLICATIONS

Lin et al., "An Effective Heuristic Algorithm for the Traveling–Salesman Problem", *Operations Research*, vol. 21: 498–516, 91973).

(Continued)

*Primary Examiner*—Kidest Bahta
(74) *Attorney, Agent, or Firm*—Staas & Halsey LLP

(57) ABSTRACT

A determining method of movement sequence and a positioning apparatus of the invention are arranged in such a manner that, in order to measure positions of plural marks as being measurement targets provided on a wafer within a shorter time, a group including executable movement sequences is generated out of a group of movement sequence candidates, each indicating a measurement order of these marks, and a movement sequence that accomplishes a movement operation between the marks within the shortest time is obtained from the group thus generated.

For efficiently searching an optical system as a globally optimal solution within a shorter computation time, independently of an initial solution given, a designing method of optical system of the invention obtains the optimal solution of the optical system to be designed, using an evolutionary computation method (genetic algorithm) having a genetic operator for handling continues values explicitly. Particularly, from a partial space defined by a predetermined continuous occurrence probability distribution of occurrence probabilities set based on parent individuals, child individuals to be candidates in the next generation population are generated according to the occurrence probabilities.

39 Claims, 42 Drawing Sheets

U.S. PATENT DOCUMENTS

| | | | | |
|---|---|---|---|---|
| 5,140,366 A | * | 8/1992 | Shiozawa et al. | 355/53 |
| 5,200,677 A | | 4/1993 | Dueck et al. | 318/567 |
| 5,243,195 A | | 9/1993 | Nishi | 250/548 |
| 5,243,665 A | | 9/1993 | Maney et al. | 382/8 |
| 5,365,051 A | | 11/1994 | Suzuki et al. | 250/201.2 |
| 5,521,036 A | | 5/1996 | Iwamoto et al. | 430/22 |
| 5,790,258 A | | 8/1998 | Mitome et al. | 356/401 |
| 5,907,405 A | * | 5/1999 | Mizutani et al. | 356/399 |
| 6,034,376 A | | 3/2000 | Shiraishi | 250/559.29 |
| 6,097,473 A | | 8/2000 | Ota et al. | 355/53 |
| 6,141,107 A | | 10/2000 | Nishi et al. | 356/401 |
| 6,333,786 B1 | * | 12/2001 | Uzawa et al. | 356/401 |

OTHER PUBLICATIONS

Walk et al., "Some Remarks on Computer–aided Design of Optical Lens Systems", *Journal of Optimization Theory and Applications*, vol. 59(2): 173–181, (1988).

Chen et al., "Genetic–Algorithm and Its Application In ENS Design", *SPIE*, vol. 2863: 216–221.

Narahari et al., "Modeling Reentrant Manufacturing Systems with Inspection Stations", *Journal of Manufacturing Systems*, vol. 15, No. 6, pp 367–378, (1996).

* cited by examiner

Fig.8

| ATTRIBUTE | | VALUE OF PARAMETER SET IN EMBODIMENT |
|---|---|---|
| START POINT ST | X | 186.5 (mm) |
| | Y | 155.5 (mm) |
| END POINT EN | X | 215 (mm) |
| | Y | 133 (mm) |
| ACCELERATION OF WAFER STAGE 10 | X | 0.34 g |
| | Y | 0.2 g |
| MAX SPEED OF WAFER STAGE 10 | X | 270 (mm/sec) |
| | Y | 200 (mm/sec) |
| SETTLING TIME OF WAFER STAGE | | 0.032 (sec) |
| TIME NECESSARY FOR MEASURING COORDINATES OF ONE ALIGNMENT MARK | | 0.5 (sec) | g: ACCELERATION OF GRAVITY (=9.80m/sec)

Fig.9

| CHIP AREA | COORDINATES OF CENTER | CHIP AREA | COORDINATES OF CENTER |
|---|---|---|---|
| 12 | (83, 105) | 41 | (149, 83) |
| 13 | (83, 127) | 46 | (149, 193) |
| 14 | (83, 149) | 51 | (171, 83) |
| 15 | (83, 171) | 52 | (171, 105) |
| 21 | (105, 83) | 55 | (171, 171) |
| 22 | (105, 105) | 56 | (171, 193) |
| 25 | (105, 171) | 62 | (193, 105) |
| 26 | (105, 193) | 63 | (193, 127) |
| 31 | (127, 83) | 64 | (193, 149) |
| 36 | (127, 193) | 65 | (193, 171) |

| | START | 12(1) | 12(2) | 12(3) | 12(4) | 13(1) | 13(2) | |
|---|---|---|---|---|---|---|---|---|
| 12(1) | 0.378296 | X | 0.109449 | 0.132981 | 0.132981 | 0.142 | 0.142 | |
| 12(2) | 0.45237 | 0.109449 | X | 0.132981 | 0.132981 | 0.142 | 0.142 | |
| 12(3) | 0.45237 | 0.132981 | 0.132981 | X | 0.109449 | 0.242 | 0.242 | |
| 12(4) | 0.378296 | 0.132981 | 0.132981 | 0.109449 | X | 0.242 | 0.242 | |
| 13(1) | 0.45237 | 0.142 | 0.142 | 0.242 | 0.242 | X | 0.109449 | |
| 13(2) | 0.45237 | 0.142 | 0.142 | 0.242 | 0.242 | 0.109449 | X | |
| ⋮ | | | | | | | | |
| 64(3) | 0.123721 | 0.36533 | 0.439407 | 0.439407 | 0.365333 | 0.439407 | 0.439407 | |
| 64(4) | 0.123721 | 0.439407 | 0.513481 | 0.513481 | 0.439407 | 0.513481 | 0.513481 | |
| 65(1) | 0.1595 | 0.439407 | 0.513481 | 0.513481 | 0.462 | 0.462 | 0.513481 | |
| 65(2) | 0.1595 | 0.36533 | 0.439407 | 0.439407 | 0.462 | 0.462 | 0.513481 | |
| 65(3) | 0.084955 | 0.36533 | 0.439407 | 0.439407 | 0.365333 | 0.439407 | 0.439407 | |
| 65(4) | 0.102346 | 0.439407 | 0.513481 | 0.513481 | 0.439407 | 0.513481 | 0.513481 | |
| END | X | 0.483852 | 0.557926 | 0.557926 | 0.483852 | 0.557926 | 0.557926 | |

(UNIT:SEC)

| | 64(3) | 64(4) | 65(1) | 65(2) | 65(3) | 65(4) |
|---|---|---|---|---|---|---|
| ⋮ | | | | | | |
| | 0.109449 | 0.242 | 0.242 | 0.242 | 0.242 | 0.439407 |
| | X | 0.242 | 0.109449 | 0.109449 | 0.132981 | 0.513481 |
| | 0.109449 | X | 0.242 | 0.242 | 0.132981 | 0.513481 |
| | 0.242 | 0.242 | X | 0.109449 | 0.132981 | 0.439407 |
| | 0.242 | 0.142 | 0.109449 | X | 0.132981 | 0.513481 |
| | 0.142 | 0.142 | 0.132981 | 0.132981 | X | 0.109449 |
| | 0.272 | 0.091992 | 0.132981 | 0.272 | 0.109449 | 0.172 |
| | 0.150519 | | | | | |

Fig. 10

GENE REPRESENTATION: | a | b | c | d | e | d1 | d2 | d3 | d4 | d5 |

METHOD OF DETERMINING MOVEMENT SEQUENCE, ALIGNMENT APPARATUS, METHOD AND APPARATUS OF DESIGNING OPTICAL SYSTEM, AND MEDIUM IN WHICH PROGRAM REALIZING THE DESIGNING METHOD

This is a Continuation Application of application Ser. No. 09/023,204, filed Feb. 13, 1998.

BACKGROUND OF THE INVENTION

1. Field of the Invention

The present invention relates to a determining method of movement sequence and an alignment apparatus, for example, for reducing the time of alignment between a pattern of an original plate and marks on a substrate in exposure apparatus, to a designing method and apparatus of an optical system such as a projection optical system of the exposure apparatus or a lens system for camera, and to a medium in which a program for realizing the designing method is recorded.

2. Related Background Art

In general, the exposure apparatus is arranged in such a way that, before carrying out exposure of the second layer or a layer thereafter into chip areas (or shot areas) on a wafer (photosensitive substrate) in which predetermined circuit patterns are to be formed, alignment is accomplished between a pattern of an original plate for the second or subsequent layer and the chip areas by use of EGA (a statistical arithmetic method). The EGA (Enhanced Global Alignment) is a technique for measuring positions of alignment marks (measured areas) provided mainly in the peripheral area of a plurality of selected chip areas to obtain a residual rotation error of the wafer, linear expansion or contraction of the wafer, an offset of the wafer, etc. and, based thereon, aligning all the chip areas of the wafer, for example, as disclosed in Japanese Laid-open Patent Application No. Sho 61-44429. As another technique of a further development of the EGA, U.S. Pat. No. 4,780,617 discloses an alignment technique for obtaining a residual rotation error of each chip area itself, an orthogonality error of the chip areas, and linear expansion or contraction of each chip area itself and performing alignment so as to minimize even these errors.

Particularly, when the technique of Japanese Laid-open Patent Application No. Hei 6-275496 is applied, because of the many alignment marks to be measured, the measurement time will be very long unless the alignment marks are measured as efficient as possible. For example, let us consider an example in which there are 76 exposed chip areas (areas indicated by number 01 to number 76 in the figure) in the first layer of the wafer W and four alignment marks are provided for each of the chip areas, as shown in FIG. 1. In this case, in the alignment of wafer by the EGA, the operator first selects a plurality of chip areas that are inside the outermost region and at vertices of polygon (for example, twenty chip areas hatched in FIG. 2), on an empirical basis. Coordinates of the designed center of each chip area (representing the position of each chip area) are stored in a memory of a main control system. Positions of four alignment marks of each chip area (defined by coordinates of the center thereof) are also stored in the memory of the main control system. Accordingly, the exposure apparatus was arranged to measure the position of each alignment mark according to the following movement sequence empirically seeming best, by executing the EGA.

Specifically, for example, when a measuring point of an alignment optical system is at a start point ST (x: 186.5, y: 155.5), an XY stage with a wafer mounted thereon moves so that a right upper alignment mark of a chip area closest to the start point ST (the chip area 64 in FIG. 2) comes to the measuring point of the alignment optical system (so as to be in the measuring area). After completion of the position measurement of the alignment mark, the XY stage moves so as to measure the positions of the four alignment marks counterclockwise. Next, the XY stage moves so as to measure coordinates of the right upper alignment mark of a chip area closest clockwise (the chip area 63 in FIG. 1). After that, the XY stage moves so as to measure coordinates of the four alignment marks counterclockwise. Repeating this operation, the XY stage moves to measure the positions of the alignment marks of the all chip areas selected and return the measuring point of the alignment optical system to the end point EN (x: 215, y: 133). Of course, such controls of movement were also employed that the XY stage moved so as to measure the positions of the alignment marks of each chip area clockwise and that after completion of the position measurement of the all alignment marks of a chip area, the XY stage moved so as to measure the alignment marks of a chip area closest counterclockwise.

However, the movement sequence of the XY stage in the position measurement of each alignment mark was determined empirically as described above, and no consideration was given to efficient movement control of the XY stage for the position measurement of each alignment mark.

The reason is that there arises the following problem in obtaining the movement sequence of the XY stage for the position measurement of alignment marks using the statistical measurement process such as the EGA. For example, where there are n alignment marks to be measured on the wafer, the number of conceivable stage movements for movement between alignment marks is at most $_nP_2=n(n-1)$ (even though the turnaround time differs depending upon the positive or negative movement direction of the stage) and computation thereof can be done quickly. Therefore, the overall turnaround time is determined uniquely as soon as the measurement process order is determined. However, there are n! way as to the order for the measurement process of n alignment marks, and the computation time becomes too long when the all possible solutions are computed using the producing and checking method of the all conceivable orders. Particularly, if n>13, the computation is practically impossible ("Practical Course: Invitation to Traveling-Salesman Problems I, II, III," Operations Research 39 (1994), No. 1: pp 25–31, No. 2: pp 91–96, No. 3: pp 156–162). Accordingly, the conventional alignment methods did not involve a step of finding the optimum movement sequence under practical operation conditions.

Now, let us focus attention on the optical system such as the projection optical system of the aforementioned exposure apparatus. The designing of the optical system including lens elements has been known heretofore and is known as a very difficult issue. This is because various factors, such as multiple dimensions, a super-multimodal property, strong dependent relation between variables, or complex constraints, make the issue tough. In addition, as criteria for evaluation of the optical system to be designed there exist numerous evaluation criteria such as the Seidel's five aberrations, the size, or the cost.

In the conventional designing method of optical system the basic search is a local search in the neighborhood of an initial or starting solution. If the initial solution is not appropriate, the result will fall into a local solution, so that the search will end unsuccessfully. It was thus the conventional practice to employ a method for changing the initial solution in a trial and error manner in order to find an optical system having the aimed performance. Since the conventional search basically allowed optimization of only one evaluation criterion, the designing process was changed to a single-objective process by setting a tradeoff ratio, in spite of the many evaluation criteria (Yoshiya Matsui: Lens Designing Method, Kyoritsu shuppan (1986); Jihei Nakagawa: Lens Design Engineering, Tokai daigaku shuppankai (1986); Toru Kusakawa: Lens Optics, Tokai daigaku shuppankai (1988)).

It is not possible to preliminarily know the tradeoff ratio for obtaining the optical system having the aimed performance. It is thus the present status that loads on experts are very heavy in the search for the initial solution for local search and in the search for the tradeoff ratio between the evaluation criteria.

Further, the conventional method for modifying the optical system is a method for, with data of one optical system preliminarily given as initial data by the designer, altering plural parameters, including radii of curvatures of boundary surfaces in respective optical elements (lens elements, reflectors, etc.) belonging to this optical system, distances between the boundary surfaces, and refractive indices of spaces (the lens elements and aerial lenses between the lens elements) located between the boundary surfaces, using an index of increase or decrease of a performance function indicating the performance of the lens optical system at that time.

Then the same improving procedure is repeated using the data of the optical system represented by the plural parameters after the alteration, as a new solution (i.e., the optical system to be improved). For example, if good or bad optical performance is reflected to increase or decrease of the performance function, the plural parameters will be altered so as to increase the performance function and updated each to the parameters after the alteration, as values of new parameters.

On the other hand, the genetic algorithm (GA) is known as one of optimization techniques, which imitates the evolutionary process of organism on an engineering basis. This genetic algorithm (hereinafter referred to as GA) is a generate and test method, which is characterized in that the essential point is only that dominance can be evaluated between two solution candidates. Therefore, it does not require the condition of differentiability of the performance function or the like and is thus effective to problems with complex constraints. The GA also has the feature of performing a search using a population of plural solution candidates and is drawing attention as a global search technique. Further, the GA is also drawing attention as a multi-objective optimization technique for handling the plural evaluation criteria explicitly and finding a Pareto optimal solution set by a single search.

For example, M. WALK AND J. NIKLAUS, "Some Remarks on Computer-Aided Design of Optical Lens System" (JOURNAL OF OPTIMIZATION THEORY AND APPLICATION: Vol. 59, No. 2, pp. 173–181, NOVEMBER 1988) and X. CHEN AND K. YAMAMOTO, "Genetic algorism and its application in lens design" (SPIE, Vol. 2863, PP. 216–221) describe the technology of application of the above GA to the design of optical system.

SUMMARY OF THE INVENTION

The present invention concerns a movement control of a stage with a wafer mounted thereon for measuring positions of plural measurement target areas (including alignment areas) provided on the wafer in a shorter time, in alignment between a photomask or a reticle (hereinafter referred to generally as "reticle") and each chip area on the wafer, and more particularly, the invention relates to a determining method of movement sequence and an alignment apparatus to minimize the overall turnaround time of the stage movement associated with the sequential measurement process.

The inventors examined the conventional alignment technology described above and found the following issues.

First, the determining method of movement sequence in the measurement process carried out for alignment must obtain an optimum solution or a near-optimum solution to the permutation optimization problem within a shorter computation time. As described above, in the case of the movement sequence of the stage, an ideal process is to produce all possible measurement orders (movement sequences) of alignment mark positions and to find the shortest turnaround time (the overall movement time excluding the measurement times) as an optimum solution out of these candidates generated. However, when examination is made as to the order of measurement of the wafer having n alignment marks, n! paths must be checked only for the order of measurement of positions of the n alignment marks on the wafer. Especially, if n>13, the computation time will become so enormous that it is practically impossible to obtain a solution. Therefore, in order to increase the throughput of the EGA, it is necessary to obtain the optimum solution or the near-optimum solution of the movement sequence of measurement process more efficiently.

Second, the determination of movement sequence of measurement process needs to take account of the tradeoff between the permissible computation time for obtaining the optimum solution or the near-optimum solution and the quality of the obtained solution. Specifically, the computation for obtaining the optimum solution of the movement sequence for the position measurement of alignment marks is carried out on the occasion of exchange of reticles of different exposure patterns or on the occasion of exchange of wafers from the reason that positions for the measurement process are designated arbitrarily wafer by wafer, even though they have a common exposure pattern. Therefore, permissible computation times vary depending upon the circumstances. For example, the time for exchange of reticles and alignment of the reticle (the reticle loading time) is normally 20 sec or so. The time for loading a first wafer in a certain lot (the wafer loading time) is normally 5 sec or so.

An object of the present invention is, therefore, to provide a determining method of movement sequence for obtaining a solution of a preferable movement sequence within a short time and an alignment apparatus provided with an arithmetic unit for carrying out the determining method. The determining method of movement sequence according to the present invention is a method to increase the throughput of EGA, in which a near-optimum solution of the movement sequence is first obtained within a very short computation time, then solutions of movement sequences to make shorter the movement time for the measurement process of alignment mark positions are successively produced as long as the computation time allows, and the optimum solution of the movement sequence is generated finally (if the sufficient, permissible computation time is given). This can provide a solution in a quality consistent with the permissible computation time given (the better the longer the permissible computation time), depending upon the circumstances of computational resources that can be used.

The determining method of movement sequence according to the present invention is carried out prior to an alignment step of performing alignment between a transfer position of a pattern of an original plate (a mask or a reticle) and each chip area on a substrate (wafer), the alignment step being a step of measuring positions of measurement target areas while successively moving the measurement target areas (alignment marks) on the substrate into a measuring area of a measuring system (an alignment optical system). The method according to the present invention determines the movement sequence indicating the measurement order of the alignment marks within a shorter time, thereby drastically increasing the throughput of the EGA.

Specifically, the determining method of movement sequence according to the present invention comprises an arithmetic step of obtaining a solution of a most preferable movement sequence with respect to an overall movement time between the measurement target areas by use of a predetermined search technique. This arithmetic step includes at least a first step of generating a group including a plurality of executable movement sequences out of a group of movement sequence candidates each indicating a measurement order of plural measurement target areas, and a second step of selecting a movement sequence that completes the movement operation between the plural target areas within the shortest time out of the group thus generated.

Further, the determining method of movement sequence according to the present invention comprises a pre-step executed prior to the above arithmetic step, the pre-step being a step of producing a movement time management table in which for each of the plural measurement target areas, a movement time is recorded as a time necessary for movement of the target area of interest from a position thereof at the time of completion of position measurement of either one of the plural measurement target areas into the measuring area of the measuring system. This movement time management table also includes such information that for a pair of measurement target areas selected out of the plurality of measurement target areas, after completion of the position measurement of one measurement target area selected, the other measurement target area selected is prohibited from moving from a position thereof at the time of completion of the position measurement of the one measurement target area into the measuring area of the measuring system.

Particularly, the search technique executed in the above arithmetic step includes at least either one of a method based on operations-research technique, a genetic algorithm (hereinafter referred to as GA) as an evolutionary computation method, and a combination thereof. The method based on operations-research technique includes at least either one of a linear programming method, a Lin and Kernighan's approach (hereinafter referred to as LK method), and a k-OPT method.

The above GA can include as a genetic operator a search technique like an improving method such as the above method based on operations-research technique (the linear programming method (NN Method), the LK method (S. Lin and B. W. Kernighan, An Effective Heuristic Algorithm for the Traveling Salesman Problem, Operations Research 21 (1973) pp 498–516), or the k-OPT method (including the 2-OPT method and 3-OPT method) ("Practical Course: Invitation to the Traveling-Salesman Problems I, II, III," Operations Research 39 (1994) No. 1: pp 25–31, No. 2: pp 91–96, No. 3: pp 156–162). By this, a solution of a most preferable movement sequence out of solutions found at that time can be always obtained even on the way of computation for seeking the movement sequence. If a further computation time is given, a solution of a more preferable movement sequence can be obtained. Therefore, according to the present invention, a good solution of a movement sequence consistent with the computation time permitted can be obtained even if the computation is interrupted or even if a limitation is preliminarily imposed on the computation time.

On the other hand, the alignment apparatus according to the present invention comprises at least a measuring device (measuring system) for measuring each of positions of plural alignment marks, a moving device for effecting relative movement between the plural alignment marks and a measuring area of the measuring device, an arithmetic section for carrying out the above-stated determining method of movement sequence, and a control section for controlling the moving device so as to move the plural alignment marks successively into the measuring area of the measuring device, according to a solution of a movement sequence obtained by the arithmetic section.

Further, the alignment apparatus according to the present invention comprises a memory for storing a movement time management table in which for each of the plural alignment marks a movement time is recorded as a time necessary for movement of the alignment mark of interest from a position thereof at the time of completion of position measurement of either one of the plural alignment marks into the measuring area of the measuring device. The movement time management table stored in this memory also includes such information that for a pair of alignment marks selected out of the plural alignment marks, after completion of the position measurement of one alignment mark selected, the other alignment mark selected is prohibited from moving from a position thereof at the time of completion of the position measurement of the one alignment mark into the measuring area of the measuring device.

The GA applied as the above search technique is used, for example, as an approach for the case to find the shortest-length path in visiting each city only once and all cities, but there has been and is no example of application to optimization of the movement sequence for the position measurement of alignment marks in the steppers or the like.

As described above, in the present invention, the computation of optimization (how efficiently the XY stage is moved) of the movement sequence for the position measurement by the search technique (the linear programming method, the LK method, the k-OPT method, or the GA) is carried out prior to the measurement of the positions of plural alignment marks. Based on the computation result, the alignment apparatus according to the present invention operates to move the XY stage so as to bring each of the alignment marks into the measuring area of the alignment optical system. Then the position of each alignment mark is measured by the alignment optical system.

Since the movement sequence for alignment was determined empirically before, it was not always the movement sequence for good or optimal alignment. In contrast, the present invention allows us to find a good or optimal movement sequence and can thus increase the throughput of EGA.

Meanwhile, in the case of the conventional designing method and modifying method of optical system described previously, once the performance function reaches a locally maximal value, no further improvement is made even by execution of further improving procedures. An optical system associated with the parameters obtained under such circumstances is a locally optimal solution or a locally optimal optical system and a possibility that it is a true optimal solution or a globally optimal solution, is very low. Accordingly, the performance of the optical system as a solution achieved by the conventional designing method and modifying method of optical system is dependent on the optical system first given as an initial solution by the designer. This means that a possibility that the optimal solution will not come out is extremely high if the modality of the optical system of the optimal solution is greatly different from that of the optical system first given as an initial solution by the designer.

In the conventional technology for designing the optical system by use of the genetic algorithm, since the genetic operator used in the GA was able to handle only discrete numbers, the plural parameters featuring the optical system, which were originally continuous variables, needed to be digitized as discrete values and it was thus hard to obtain a solution with sufficient accuracy within a practical time.

Specifically, the conventional technology for executing the GA in a discrete fashion often utilizes the coding/crossover procedures as shown in FIG. 3 to FIG. 5, in which each of parameters constituting a parent individual or a child individual is expressed by a binary code and in which the binary codes are used in combination with one point crossover, two point crossover, or uniform crossover. FIG. 3 is a drawing to show a step of generating one set of parameters of child individuals from one set of parameters of parent individuals expressed by binary codes, by the one point crossover, FIG. 4 is a drawing to show a step of generating one set of parameters of child individuals from one set of parameters of parent individuals expressed by binary codes, by the two point crossover, and FIG. 5 is a drawing to show a step of generating one set of parameters of child individuals from one set of parameters of parent individuals expressed by binary codes, by the uniform crossover.

In the discrete GA as described above, the phase structure (binary codes) of a genotype space is greatly different from that (actual values) of a phenotype space. This means that a character (property) of a parent individual becomes unlikely to be inherited by a child individual newly generated. Therefore, even if parent individuals of a certain generation approach the optimal solution, child individuals of the next generation could deviate from the optimal solution with an extremely high probability to be farther therefrom than their parent individuals. This raises the problem that wasteful searches increase considerably.

Namely, for achieving sufficient accuracy in the discrete GA, it is necessary to make the degree of digitization of each parameter finer. This inevitably increases the gene information and causes considerable increase of computation time. Conversely, if each parameter is roughly digitized in order to obtain a solution within a practical computation time, there will arise a risk of failing to find the optimal solution where the optimal solution exists in a narrowest gap between discrete numbers.

When consideration is given to the evaluation criteria of the optical system designed, there are many evaluation criteria contradicting with each other in the actual performance aspect (for example, resolution and distortion). In either one of the conventional technology described above, a plurality of evaluation criteria are integrally expressed in the form of a performance function by preliminarily weighting the reciprocity among the evaluation criteria uniquely.

However, whether the preset weighting is valid or not can be first checked after various optimal solutions have been obtained with changing weights of the respective evaluation criteria. A solution adapted for each evaluation criterion is generally called a Pareto optimal solution, and there are plural Pareto optimal solutions corresponding to various weightings.

Therefore, where there exist plural evaluation criteria of the optical system designed, multi-objective optimization needs to be effected so as to fit each evaluation criterion. In the case of the conventional designing method and modifying method of optical system, the resultant solution cannot be always determined to be the optimal solution.

The present invention has been accomplished to solve the above problem. A principal object of the present invention is to provide a designing method and apparatus of optical system for obtaining an optical system as a globally optimal solution within a practical time, independent of initial data preliminarily given, and a medium in which a program for realizing the designing method is recorded. Specifically, the present invention relates to a designing method, apparatus, and so on for designing an optical system including at least one optical element (lens element, reflector, etc.), for example, such as a lens for photography, a lens for microscope, or a projection optical system in the projection exposure apparatus of the one-shot exposure method or the scanning exposure method (e.g., a step-and-repeat type stepper or a step-and-scan type stepper), and also enables optimal relocation (i.e., correction for locations) where the lens elements belonging to the optical system to be designed are not processed exactly in designed values, and optimization of combination of lens elements where a plurality of optical systems including such lens elements not processed in the designed values are produced.

A designing method of optical system according to the present invention is a method for designing an optical system including at least one optical element (a lens element, a reflector, or the like) by use of an evolutionary computation method (genetic algorithm), which is characterized in that the optical system is optimized by use of a genetic operator for directly handling continuous values. Specifically, the designing method of optical system comprises at least a selection step of selecting at least two parent individuals from a generation population of n ($\geq 1$, wherein n=1 indicates an initial population) having a plurality of individuals of data of the optical system to be designed, a child generation step of newly generating a population consisting of a plurality of child individuals by applying a genetic operator, being at least either one of a crossover operator and a mutation operator, to the parent individuals selected, and a survival selection step of generating a next generation population.

Particularly, an individual that is a candidate for the optical system to be designed is given as a real vector having components, for example, including curvatures of boundary surfaces specifying the lens element, the reflector, or the like included in the optical system to be designed, a distance between the boundary surfaces, and a refractive index of a space located between the boundary surfaces, whereby mapping or coding is effected from the data of the optical system of the individual (phenotype) to the genotype. The optimization of the optical system does not have to be made for the all components of the real vector, but can be done individually for a specific vector component (at least one of the plural parameters featuring the optical system to be designed).

In the designing method of optical system according to the present invention, the above child generation step is the step of generating the child individuals by at least either one of the crossover operator (a crossover step) and the mutation operator (a mutation step). Namely, from the inside of a partial space defined by a predetermined continuous occurrence probability distribution of occurrence probabilities set based on components of real vectors of the parent individuals selected, the crossover operator generates as a child individual a real vector having a value occurring according to the occurrence probabilities. From the inside of a partial space defined by a predetermined continuous occurrence probability distribution of occurrence probabilities increasing with approaching at least one parent individual out of the parent individuals selected, the mutation operator generates as a child individual a real vector having a component of a value occurring according to the occurrence probabilities.

In a search process in which the above selection step, child generation step, and survival selection step are executed repetitively, the child individuals newly generated from the parent individuals selected succeed to characters (properties) of their parent individuals, thereby avoiding wasteful searches. In the initial stage of the search process, the parent individuals are apart from each other and the individuals are also scattered in various spaces, depending upon distances between the parent individuals. The search is thus done in a wide range. With progress in searches (with increase in the number of executions of the above steps), the distances between the parent individuals become shorter, so that more child individuals will be generated in a partial space including the optimal solution, depending upon the distances between the parent individuals.

The above crossover operator is a genetic operator that directly handles continuous values, which can be selected, for example, from UNDX (Ono, I. and Kobayashi, S: A Real-coded Genetic Algorithm for Function Optimization Using Unimodal Normal Distribution Crossover, Proceeding of 7th International Conference on Genetic Algorithms, pp. 246–253 (1997)), BLX-α (N. J. Radcliffe: Formal Analysis and Random Respectful Recombination, Proceeding of the Fourth International Conference on Genetic Algorithms, pp. 222–229, 1991); NDX (I. Ono, M. Yamamura and S. Kobayashi: A Genetic Algorithm with Characteristic Preservation for Function Optimization, Proceedings of IIZUKA '96, pp. 511–514, 1996); or UNDX (Ono, I. and Kobayashi, S: A Real-coded Genetic Algorithm for Function Optimization Using Unimodal Normal Distribution Crossover, Proceeding of 7th International Conference on Genetic Algorithms, pp. 246–253 (1997)).

Further, the above survival selection step is to select individuals to be left as individuals in the next generation population out of the n-th generation population including the parent individuals and the population of the child individuals newly generated.

In the above survival selection step, in order to realize the multi-objective optimization, individuals satisfying at least either criterion out of one or two or more evaluation criteria are selected from the population including the child individuals generated. This selection of individuals is carried out preferably so as to select individuals to be left as individuals in the next generation in order in proportion to fitness values of the respective individuals from the fittest to a predetermined evaluation criterion.

Further, in the designing method of optical system according to the present invention, the above survival selection step is preferably a step of generating the next generation population by replacing individuals not selected in the n-generation population with the selected individuals.

This designing method of optical system according to the present invention can be realized in the form of a program described in a predetermined language, and this program is carried out, for example, by a computer having basic components of an arithmetic circuit with memories (RAM, ROM), input/output sections, an arithmetic section, a memory section, and a control section. Particularly, when carried out by the computer, the program for realizing the designing method of optical system should be preferably optically or magnetically recorded in a predetermined recording medium such as CD, MO, FD, a hard disk, a magnetic tape, or ROM.

According to the above constitution, the present invention can automatically generate an optical system as being a globally optimal solution independent of the initial solution given. Namely, the invention makes it possible to find an optimal solution or a near-optimal solution of plural parameters (components of a real vector) featuring the optimal optical system within a practical time from the initial solution arbitrarily given.

In the conventional designing method and modifying method of optical system, it is also conceivable to employ a method for obtaining a plurality of local optimal solutions by repeating such an operation that once a search falls in a local optimal solution and if little change appears in increase or decrease of the performance function with repetition of improving procedure, the local optimal solution of the optical system obtained at this time is once stored as a solution candidate on the memory and that the improving procedure is carried out again for a new optical system to be improved, obtained by arbitrarily changing one or more parameters out of the plural parameters of the solution, thereby obtaining another local optimal solution. However, as the optical system becomes more complex with increase in the number of optical elements, the number of local optimal solutions becomes so large in general. It is, therefore, difficult to obtain the globally optimal solution by this method.

Since plural optical systems as multi-objective optimal solutions, which must exist in correspondence to a plurality of conflicting evaluation criteria, can be selected simultaneously in the above survival selection step, when a plurality of evaluation criteria for evaluation of optical system are given, a plurality of Pareto optimal solutions or a plurality of Pareto near-optimal solutions can be obtained within a practical time by performing the multi-objective optimization for simultaneously handling the plural evaluation criteria.

Further, according to the present invention, an optimal solution or a near solution to the optimal solution of the parameters featuring the optimal optical system can be obtained within a practical computation time even in a range satisfying constraints on (plural) specific parameters arbitrarily designated by the user. For example, even in the case where the constraints given are that the first surface of the first lens must be convex and that a refractive index of a glass material of the second lens must be x (e.g., 1.5266), y (e.g., 1.6010), or z (e.g., 1.7294), the multi-objective optimization can be done within the range satisfying such constraints.

BRIEF DESCRIPTION OF THE DRAWINGS

FIG. 8 is a table to show the performance of the wafer stage etc.;

FIG. 9 is a table to show chip areas positions of which are to be measured, and coordinates of their centers (representing the positions of the chip areas);

FIG. 10 is a table to show a movement time management table;

DETAILED DESCRIPTION OF THE PREFERRED EMBODIMENTS

The embodiments of the determining method of movement sequence and alignment apparatus according to the present invention will be described using FIG. 6 to FIG. 25. The embodiments are examples to find the optimum movement sequence indicating the order of measurement of alignment mark positions in the EGA (Enhanced Global Alignment: aligning by the statistical arithmetic method) in the step-and-repeat type (one-shot type) projection exposure apparatus. It should be noted that the present invention can also be applied to the step-and-scan type exposure apparatus for synchronously scanning the reticle relative to the wafer.

Figure 6:
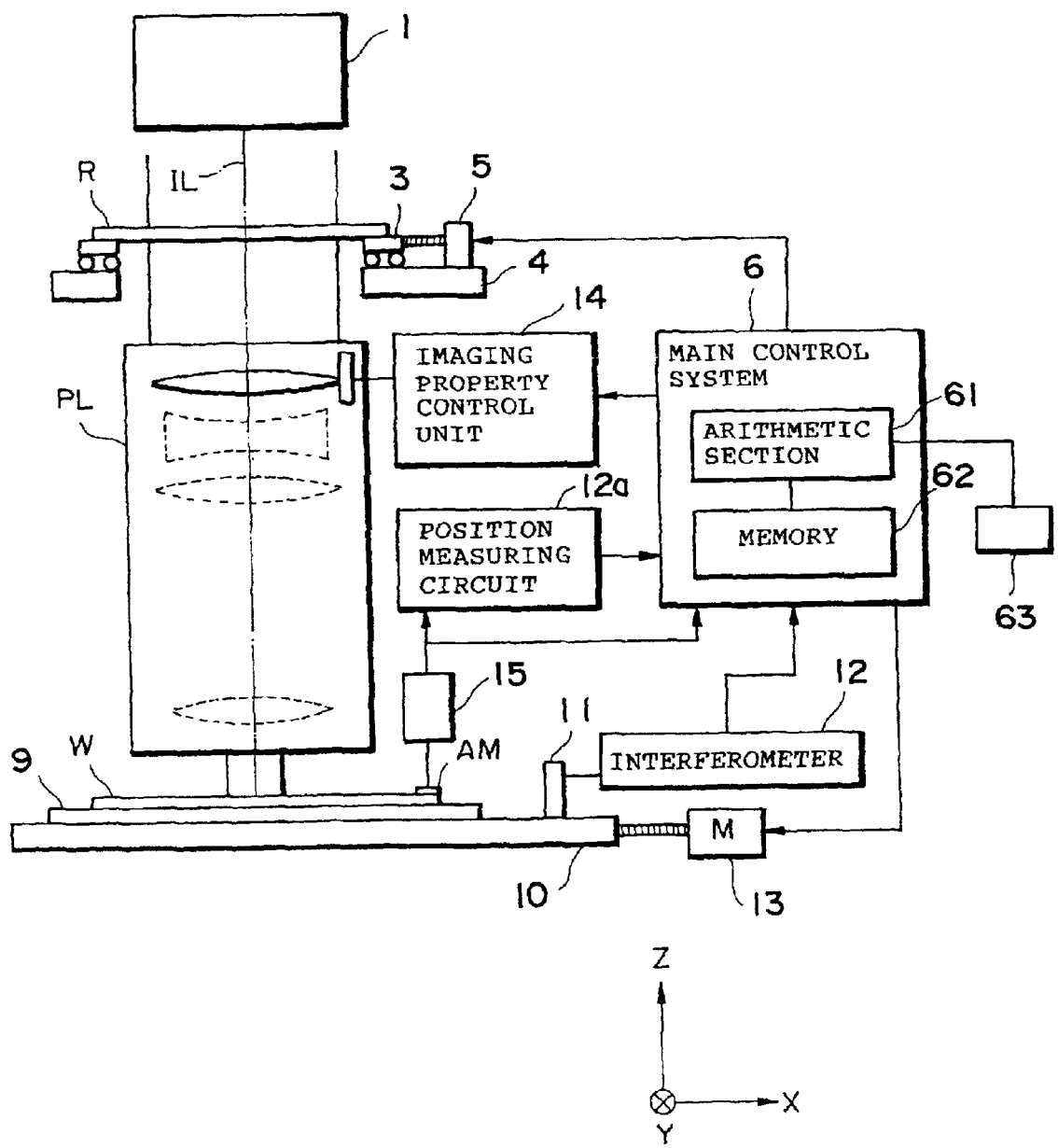
FIG. 6 is a drawing to show the overall structure of the projection exposure apparatus (stepper) including the alignment apparatus provided with the arithmetic section for realizing the determining method of movement sequence according to the present invention.

FIG. 6 shows the structure of a projection exposure apparatus (stepper). In this FIG. 6 the reticle R is illuminated under almost uniform illuminance by exposure light IL emitted from illumination optical system 1. The reticle R is held on reticle stage 3 and the reticle stage 3 is supported so as to be movable and finely rotatable in a two-dimensional plane on base 4. Main control system 6 for controlling the operation of the whole apparatus controls the operation of the reticle stage 3 through driving device 5 provided on the base 4.

The above main control system 6 has an arithmetic section 61 for carrying out the determining method of movement sequence according to the present invention and a memory 62 in which a movement time management table (see FIG. 10) is stored. This main control system 6 receives instructions from the operator or the like through input device 63 such as a keyboard or a pointing device.

An image of a pattern of the reticle R illuminated by the exposure light IL is projected through a projection optical system PL onto each chip area on the wafer W. The wafer W is mounted on wafer stage 10 through wafer holder 9. The wafer stage 10 is composed of an XY stage for two-dimensionally aligning the wafer W on a plane normal to the optic axis of the projection optical system PL, a Z-stage for aligning the wafer W in a direction (Z-direction) parallel to the optic axis of the projection optical system PL, a stage for finely rotating the wafer W, and other components.

A moving mirror 11 is fixed on the top surface of the wafer stage 10 and a laser interferometer 12 is positioned opposite to the moving mirror 11. Although the moving mirror 11 is illustrated in a simplified form in FIG. 6, where the orthogonal coordinate system is defined with the X-axis and Y-axis in the plane normal to the optic axis of the projection optical system PL, the moving mirror 11 is composed of a plane mirror having a reflective surface normal to the X-axis and a plane mirror having a reflective surface normal to the Y-axis. The laser interferometer 12 is composed of two X-axis laser interferometers for emitting a laser beam to the moving mirror 11 along the X-axis and a Y-axis laser interferometer for emitting a laser beam to the moving mirror 11 along the Y-axis, and the one X-axis laser interferometer and one Y-axis laser interferometer measure X-coordinate and Y-coordinate of the wafer stage 10.

An angle of rotation of the wafer stage 10 is measured from a difference between measured values by the two X-axis laser interferometers. The information about the X-coordinate, Y-coordinate, and angle of rotation measured by the laser interferometer 12 is supplied to position measuring circuit 12a and to the main control system 6. The main control system 6 controls the alignment operation of the wafer stage 10 through driving device (linear motor M) 13 while monitoring the coordinate data supplied. The same interferometer system as on the wafer side is also provided on the reticle side, though not illustrated in FIG. 6.

Further, the projection optical system PL of FIG. 6 is equipped with imaging property controlling device 14. The imaging property controlling device 14 controls the projection magnification and distortion of the projection optical system PL, for example, by adjusting a space between predetermined lenses out of a group of lenses composing the projection optical system PL or by adjusting the pressure inside the lens chamber between predetermined lenses. The main control system 6 also controls the operation of the imaging property controlling device 14.

This embodiment uses an off-axis alignment optical system of an image processing type as a method for obtaining a position of an alignment mark (coordinates of the center thereof). However, the position of the alignment mark can also be obtained by receiving diffracted light by the alignment optical system of the TTL (through the lens) type.

The off-axis alignment optical system (device) 15 is placed beside the projection optical system PL of FIG. 6. This alignment system 15 forms an image of a cross alignment mark AM on an image pickup surface of an X-axis image pickup device composed of a two-dimensional CCD for the X-axis and also forms the image on an image pickup surface of a Y-axis image pickup device composed of a two-dimensional CCD for the Y-axis. The image of the alignment mark AM and an image of an index mark provided on an index screen (not illustrated) are superimposed on each of the image pickup surfaces of the image pickup devices. Image signals of the image pickup devices are supplied to the position measuring circuit 12a, which calculates amounts of positional deviation in the X-axis direction and in the Y-axis direction between the image of the alignment mark AM and the image of the index mark.

Accordingly, in FIG. 6, the position measuring circuit 12a obtains coordinates of the alignment mark AM on the stage coordinate system (X, Y) from the positional relation between the image of the alignment mark AM on the wafer W and the index mark on the index screen and the measurement results of the laser interferometer 12 in that case, and supplies the coordinate data thus measured to the main control system 6.

Figure 7:
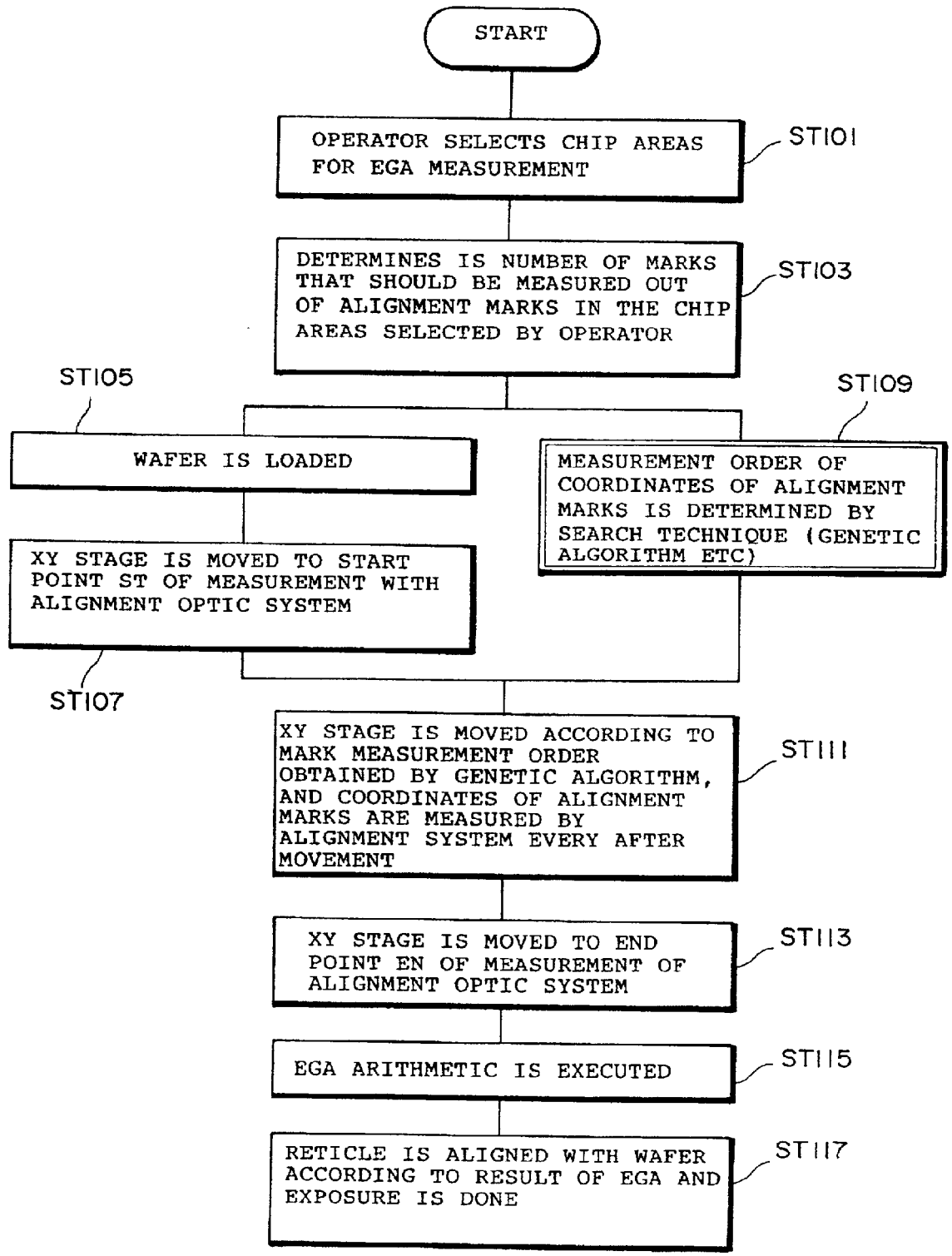
FIG. 7 is a flowchart for explaining the measurement process of alignment mark position for the EGA arithmetic.

FIG. 7 is a flowchart for explaining the position measurement of alignment mark for the EGA arithmetic being the statistical arithmetic method. The movement control of the XY stage for the position measurement of alignment mark will be described along this flowchart.

First, the operator selects a plurality of chip areas for the EGA measurement from the all chip areas in the wafer W and the data is supplied to the main control system 6 (step ST101). The operator is allowed to select the all chip areas.

Then the operator determines which or how many marks should be measured out of the plural alignment marks AM mainly provided in the peripheral region of each chip area, and the information is supplied to the main control system 6 (step ST103). In this embodiment there are four cross alignment marks AM (which permit two-dimensional coordinate measurement) positioned per each chip area.

The present invention permits use of an arrangement in which two alignment marks AM are positioned per each chip area or an arrangement of a linear alignment mark AM (permitting one-dimensional coordinate measurement) for each chip area. It is necessary to obtain coordinates of ten alignment marks AM on a one-dimensional basis, in order to obtain (1) residual rotation error $\Theta$ of the wafer, (2) orthogonality error W of the stage coordinate system (or shot arrangement), (3) linear expansion or contraction Rx, Ry of the wafer, (4) offset (translation) OX, OY of the wafer (the center position), (5) residual rotation error $\theta$ of the circuit pattern (chip pattern) on each shot area of the wafer, (6) orthogonality error w of the coordinate system (chip pattern) on the wafer, and (7) linear expansion or contraction rx, ry in two orthogonal directions of the chip pattern (see Japanese Laid-open Patent Application No. Hei 6-275496).

Next, the main control system 6 sends a command to a loader (not illustrated) to make the loader mount (or load) the wafer W to be exposed on the wafer holder 9 (step ST105). In this case, the XY stage 10 moves to a predetermined mount position for receiving the wafer W.

After the wafer W is mounted on the wafer holder 9 to be sucked by vacuum, the main control system 6 moves the XY stage 10 so as to locate the measuring point (representing the measuring area) of the alignment optical system 15 at the start point ST, for carrying out the EGA (step ST107).

In the main control system 6, almost at the same time as the arithmetic section 61 sends the load command of wafer W described above, the arithmetic section 61 starts finding a sequence of a short time indicating a measurement order of the chip areas and alignment marks AM given in steps ST101 and ST103 by a search technique (a linear programming method, a Lin and Kernighan's approach, a K-Opt method, or a genetic algorithm) (step ST 109). The arithmetic executed in this arithmetic section 61 will be described hereinafter. Designed center coordinates of the respective chip areas and designed coordinates of the respective alignment marks AM are preliminarily recorded in the memory 63 in the main control system 6.

Next, in step ST111, the main control system 6 moves the XY stage according to the measurement order of the alignment marks AM obtained by the genetic algorithm in the arithmetic section 61. A position of each alignment mark AM is measured by the alignment optical system, whereby an amount of positional deviation thereof is measured relative to the index mark. At this time values of the laser interferometer 12 are also read, whereby coordinates of the alignment mark AM are obtained on the stage coordinate system (X, Y) by the position measuring circuit 12a. The coordinate values measured are supplied to the main control system 6.

At the time of completion of the measurement of positions of the all alignment marks as being measurement targets, the main control system 6 moves the XY stage so as to move the measuring point of the alignment optical system 15 to the end point EN (step ST113).

The arithmetic section of the main control system 6 further performs the EGA arithmetic, based on the information about the positions of the plural alignment marks measured, thereby obtaining the error parameters, expansion or contraction of the wafer, rotation of each chip area, etc. (step ST115).

Then the main control system 6 moves the XY stage 10 to coordinates of each chip area to be exposed, according to the computation result of EGA or compensates for expansion or contraction of chip area or the like by the imaging property controlling device 14, and then performs exposure (step ST117).

Next described is the optimization of movement sequence for the position measurement of alignment marks. A path (order) of the position measurement of alignment marks is obtained in the arithmetic section 61 in the main control system 6, and preconditions necessary for the arithmetic will be described first.

FIG. 8 to FIG. 13 are drawings to illustrate the preconditions necessary for obtaining the movement sequence for the position measurement of alignment marks, in order to compare the effect of the present invention with the conventional technology. Of course, this is just an example, and it should be noted that the conditions including the size of chip area, the number of chips, the positions of alignment marks, the number of alignment marks, and so on can be changed freely.

FIG. 8 shows data of the stepper used in the present embodiment, including the start point ST and end point EN of the wafer stage 10.

Accelerations and maximum speeds of movement of the wafer stage 10 are as shown in FIG. 8, because the time of movement in the X-direction is different from that in the Y-direction because of the difference between the weights of the Y-stage, mechanisms, and so on.

In this embodiment, the time necessary for measurement of a position of one alignment mark is set to 0.5 sec, as shown in FIG. 8.

FIG. 9 shows coordinates of centers of twenty chips (X, Y in units of mm) denoted by numerals 12, 13, 14, 15, 21, 22, 25, 26, 31, 36, 41, 46, 51, 52, 55, 56, 62, 63, 64, 65 in the coordinate system on the wafer, and the twenty chip areas are those measured in this embodiment.

FIG. 10 is a drawing to show the movement time management table preliminarily stored in the memory 62. From this movement time management table, moving times between alignment marks are found where four alignment marks are provided for each of the twenty chip areas being measurement targets. For example, in this movement time management table, the time indicated by F in the drawing represents a time necessary for the third alignment mark in the chip area 12 on the wafer W to move from a position thereof at the time of completion of the measurement of the position of the second alignment mark of the chip area 65 on the wafer W to the measuring point of the alignment optical system 15. This movement time management table also includes movement prohibition information for indicating prohibited movement. This movement prohibition information is indicated by symbol "X" in the drawing.

Figure 11:
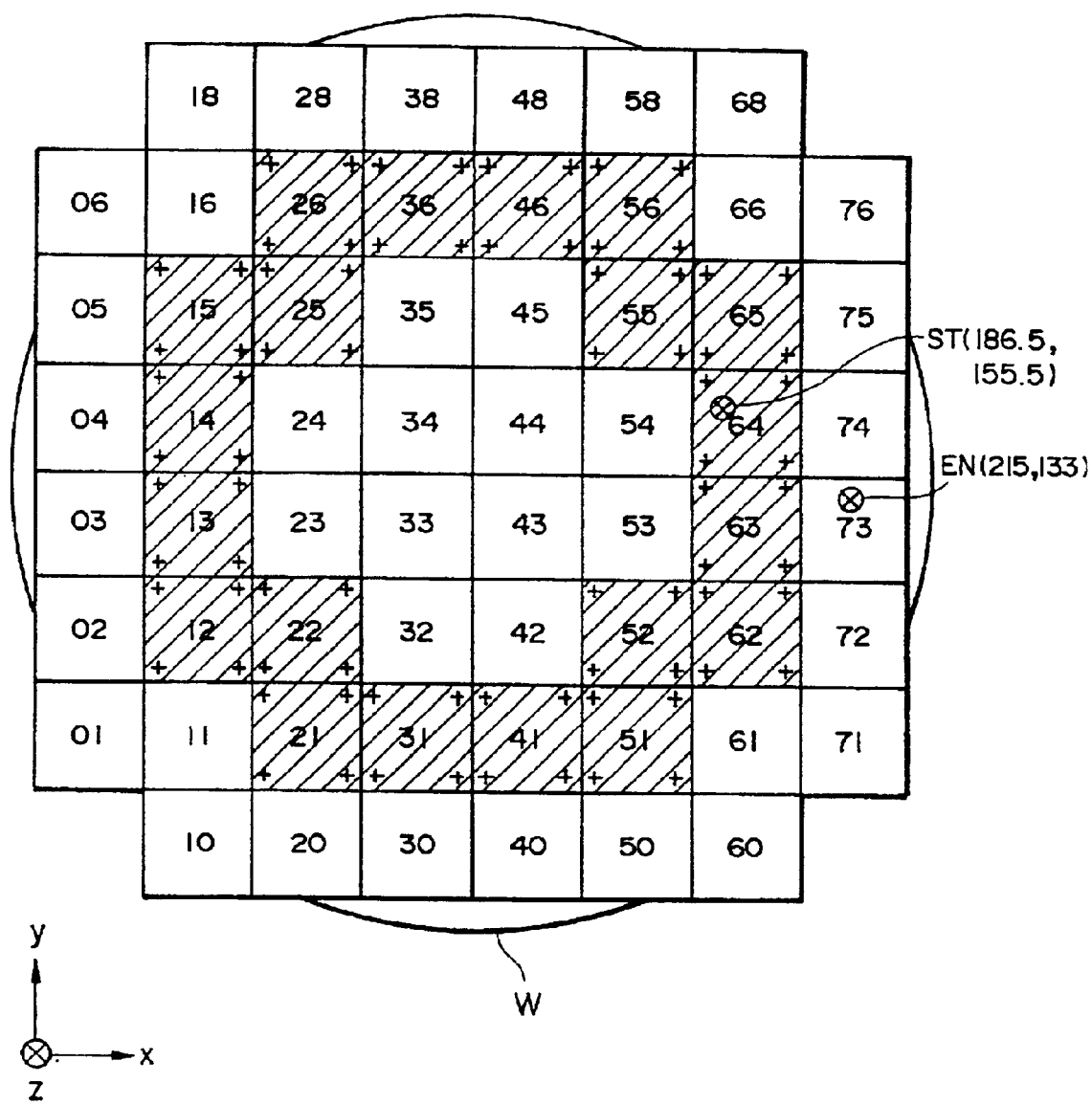
FIG. 11 is a drawing to show locations of chip areas and alignment marks provided on a wafer.

FIG. 11 is a drawing to show an arrangement of the chip areas on the wafer. Particularly, the chip areas indicated by hatching are those where the position measurement of the alignment marks specified in FIG. 9 is carried out. The size of each chip area is 22 mm (in the X-direction)×22 mm (in the Y-direction). Distances between centers of chip areas are 22 mm in the X-direction and 22 mm in the Y-direction.

Figure 12:
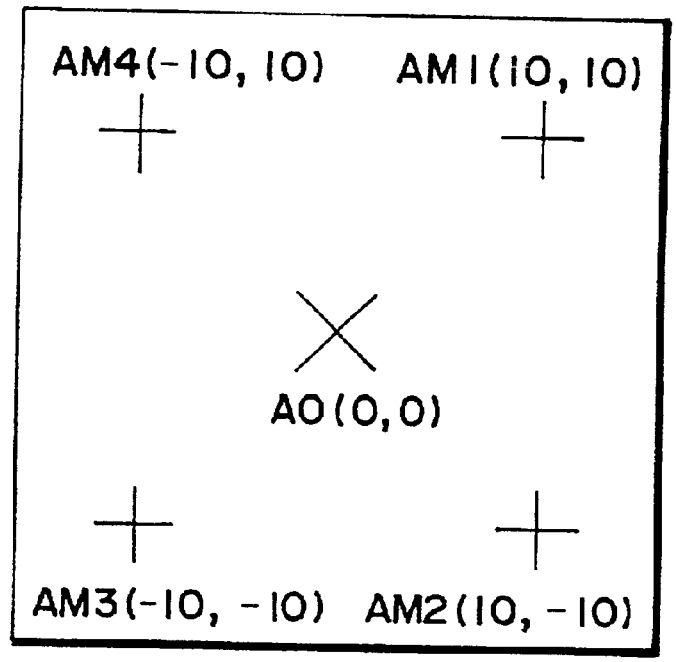
FIG. 12 is a drawing to show a first arrangement example of alignment marks in a chip area.
Figure 13:
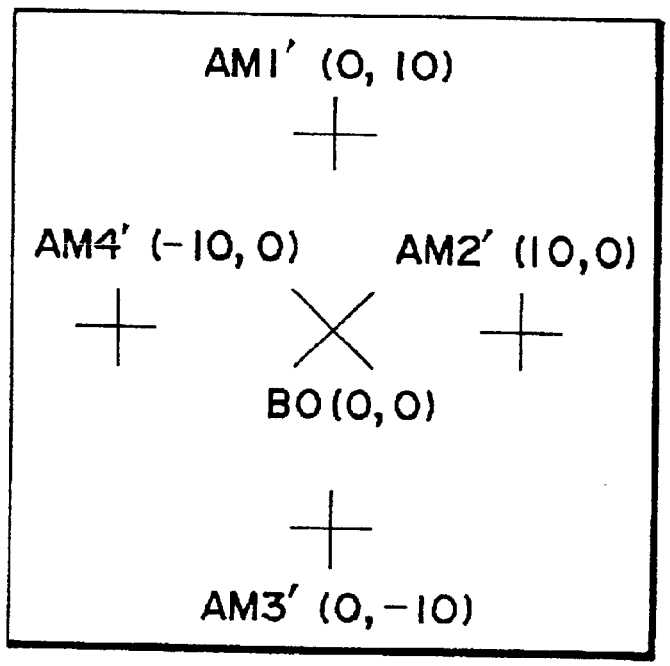
FIG. 13 is a drawing to show a second arrangement example of alignment marks in a chip area.

Next, FIG. 12 shows cross alignment marks AM disposed in each chip area to be a measured object. In this embodiment there are four alignment marks AM1 to AM4 in each chip area as a measured object. When the center coordinates A0 of the chip area are defined by (0, 0), the position measurement of the alignment marks in the chip area is set to be carried out in the order of AM1 (10, 10), AM2 (10,−10), AM 3 (−10,−10), and AM4 (−10, 10). Of course, this is just an example, and the alignment marks AM 1' to AM4' can be positioned as shown in FIG. 13 on the chip area.

The position measurement of the alignment marks is started after the wafer stage 10 has been moved so that the optic axis of the alignment optical system 15 (or the measuring point on the wafer W by the alignment optical system 15) was aligned with the start point ST (X=186.5, Y=155.5). The position measurement is terminated at the time of arrival of the optic axis of the alignment optical system 15 (the measuring point on the wafer) at the end point EN (X=215, Y=133).

Since the measurement time at each alignment mark AM is constant, the optimization of movement sequence means eliminating waste movement time from the movement sequence as much as possible. Let us consider a time from a point of completion of the position measurement at an arbitrary alignment mark AM (a start point of a unit movement sequence) to a point of start of the measurement process at another arbitrary alignment mark AM (an end point of the unit movement sequence). In the case where there are n alignment marks AM, the number of cases of arbitrary unit movement sequences is at most n×(n−1). Since the shortest movement times of the respective unit movement sequences are uniquely determined from the aforementioned preconditions, these are computed first and the movement time management table obtained (see FIG. 10) is stored in the memory 62. After completion of the operation up to this point, the optimum movement sequence can be obtained by optimization of selection and order to determine which unit movement sequences should be selected out of the unit movement sequences and used in what order (in the sense of minimizing the final measurement process sequence of coordinates of alignment marks AM). Accordingly, to minimize the overall movement time of the movement sequence means to optimize the movement sequence for the position measurement of alignment marks AM, which is an object of the present invention. This method will be described below.

Figure 14:
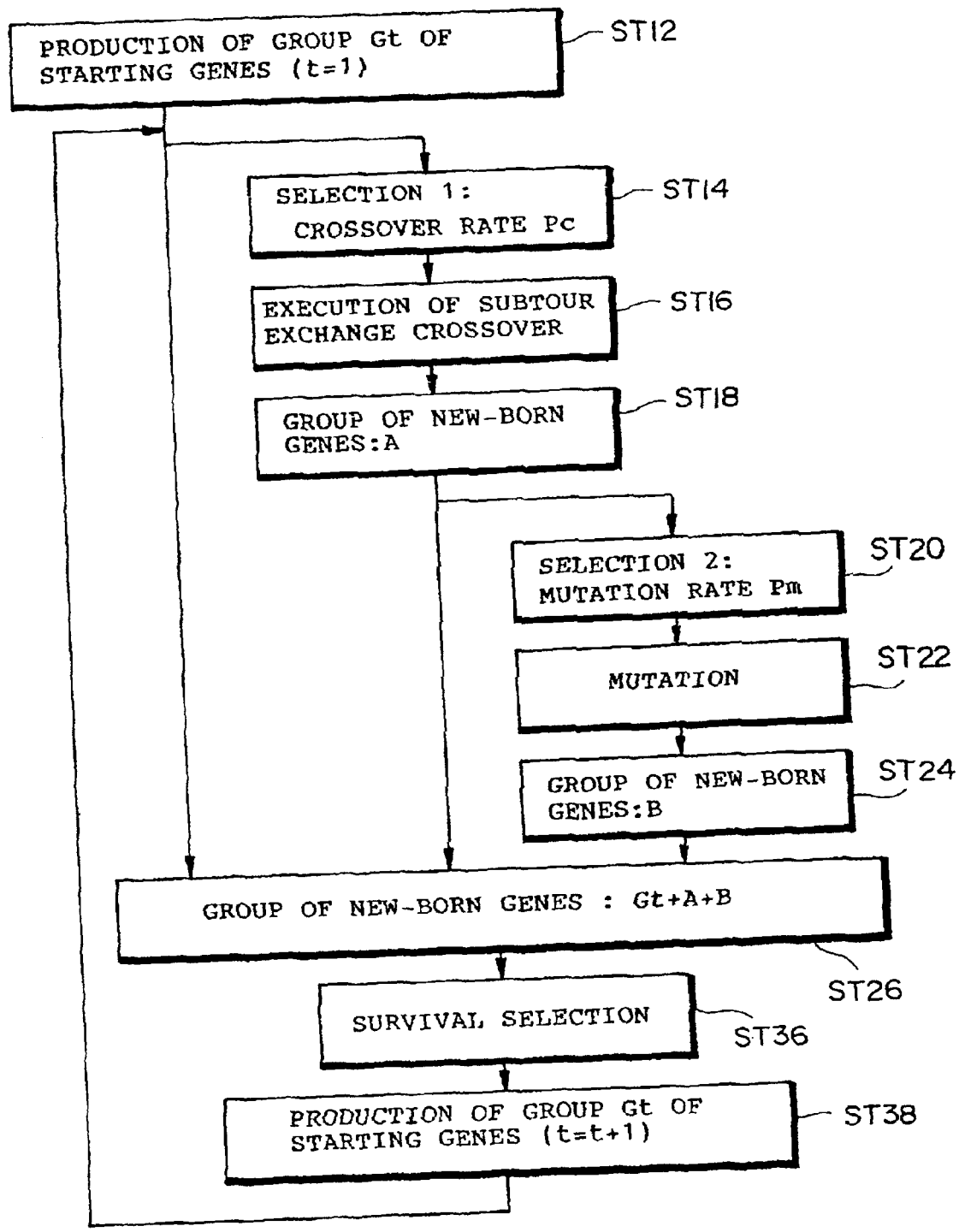
FIG. 14 is a diagram to show an example of flowchart for explaining an example of the genetic algorithm applied as a search technique of movement sequence.
Figure 15:
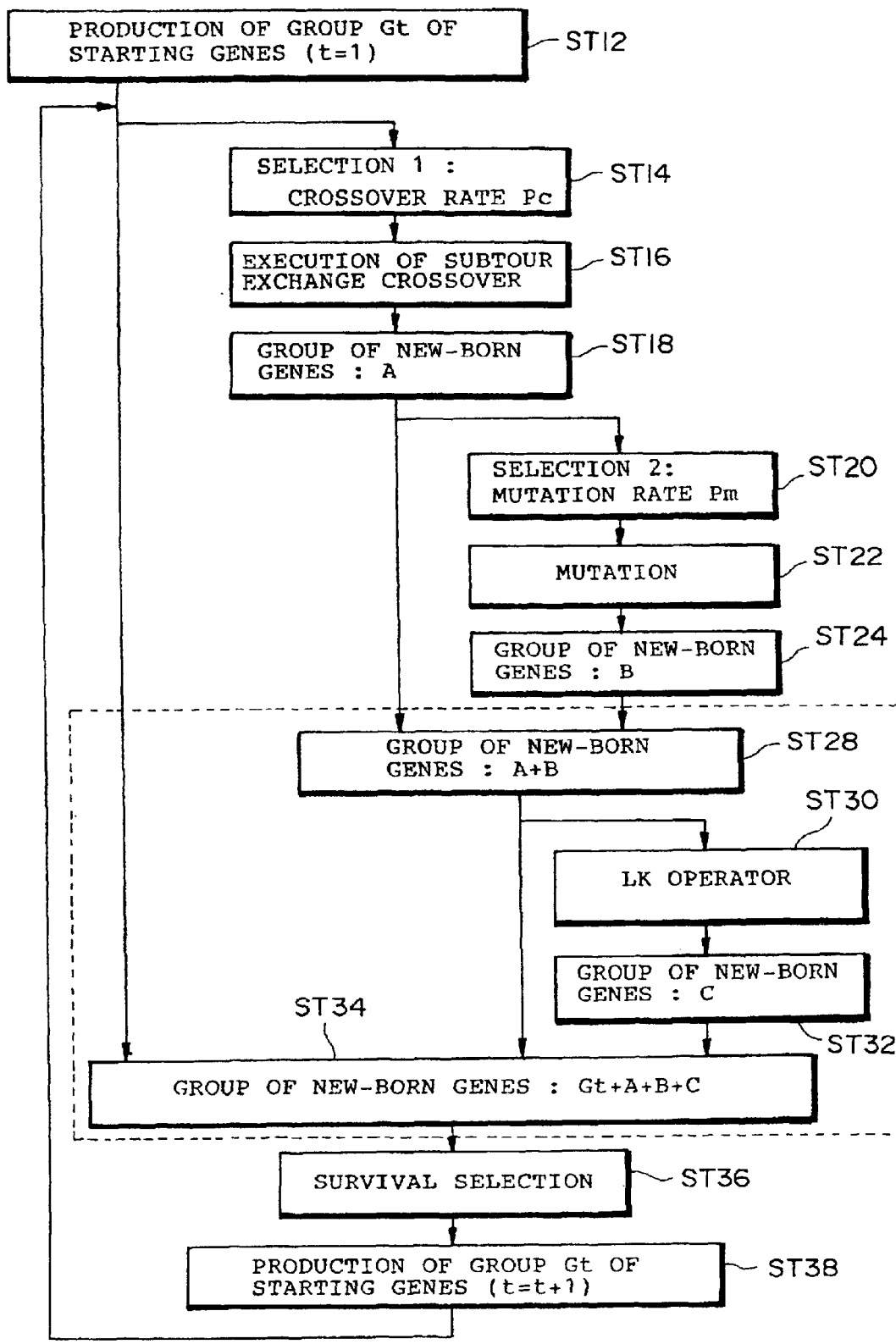
FIG. 15 is a diagram to show an example of flowchart for explaining another example of the genetic algorithm applied as a search technique of movement sequence.

This embodiment is arranged to automatically obtain the optimum solution of the order (movement sequence) of position measurement of alignment marks (a solution of a movement sequence to minimize the overall movement time), using the genetic algorithm (GA: Genetic Algorithm), which is a typical example of the evolutionary computation method. FIG. 14 and FIG. 15 illustrate examples of the operation of the genetic algorithm.

The name of the GA was given, because individual operations thereof could be compared to genes, as will be described below.

An initial solution in the GA is arbitrary. Accordingly, the genetic algorithm can be readily combined with another search method and it is also easy to incorporate only an advantage of another search method into a genetic operator. Therefore, proper analysis of problem and programmer's experiences in evolutionary computation are required to achieve an efficient approach with high degrees of freedom of design.

The GA of this embodiment can be classified roughly into GA as a combinatorial optimization approach placing the main point on crossover, ES (Evolutional Strategy) as a continuous value optimization approach placing the main point on mutation, and, different in classification from these, GP (Genetic Programming) directed to the source and process procedures of program, but the essence of the all algorithms is identical.

In the GA, a group search is carried out with plural (N) agents called "genes," and the GA thus has such a property that even if a part of the group falls into a local optimum solution but if the other gene finds a better solution the search is led to the better solution. Since it is a multipoint search, it takes some time, but can efficiently search the optimum solution. A plurality of pairs (parents) are selected from the gene group consisting of the N genes and each of the gene pairs P bears children C resembling their parents. Further, some children C experience mutation in part of gene. Among these genes, descendents having genes with higher evaluation are made to survive with higher probability in the next generation. Since the size of the group is normally fixed to N throughout generations except for special cases, descendents having genes with lower evaluation will gradually become extinct. Repetition of such alteration of generation will find plural (N) genes with the optimum solution appearing in the group sooner or later.

This embodiment adopts the Subtour Exchange Crossover (SXX) famous as an approach by GA in order to improve the movement sequence. In this way the optimization problem of movement sequence for the position measurement of alignment marks in the stepper is formulated by the GA. Examples of models for the alteration of generation used in the GA include the MGG (Minimum Generation Gap) model in which the all genes are paired without any unmarried person and best two genes out of each family including a pair and children born are left to the next generation (H. Satoh, M. Yamamura and S. Kobayashi, Minimum Generation Gap Model for GAs Considering Both Exploration and Exploitation, Proceedings of IIZUKA '96, pp. 494–497), and the Elitist model in which good people out of the all parents and children are left preferentially (D. E. Goldberg, Genetic Algorithm in Search, Optimization and Machine Learning, Addison-Wesley Publishing Company Inc., 1989). The MGG model is used if the true optimum solution is desired to obtain finally even with some computation time; whereas the Elitist model is used if a good solution can be found in the early stage of the computation process and even if a computation time longer than that in the MGG model is necessary for obtaining the true optimum solution. Thus, they can be used selectively based on how to make the trade-off between the computation time and the quality of solution. In this embodiment, an example using the Elitist model will be described as an example of such selective use.

Before describing the GA shown in the flowcharts of FIG. 14 and FIG. 15 in detail, each of operators shown in the algorithms will be described first.

Figure 16:
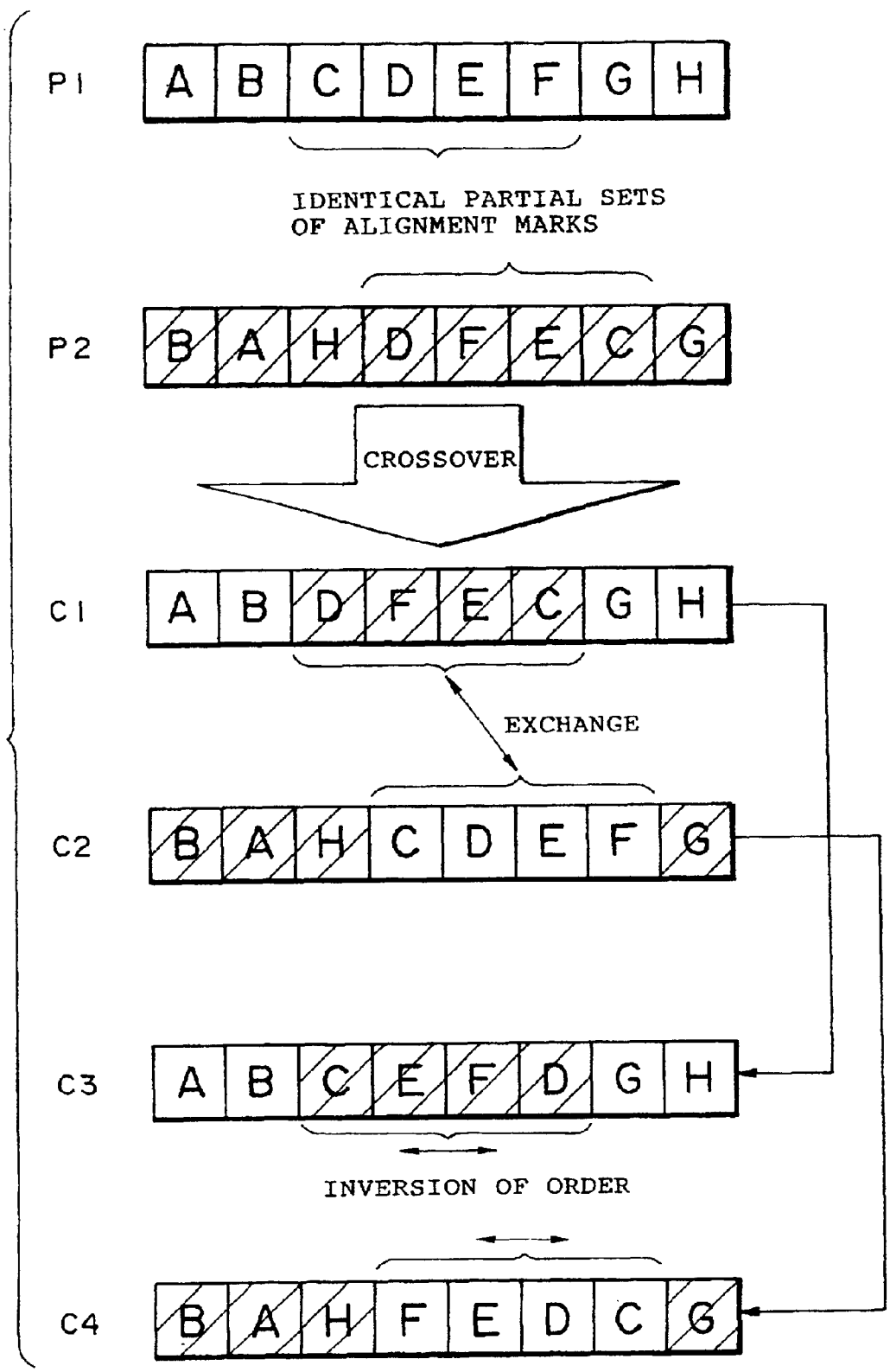
FIG. 16 is a drawing for explaining a crossover operator in the genetic algorithm.
Figure 17:
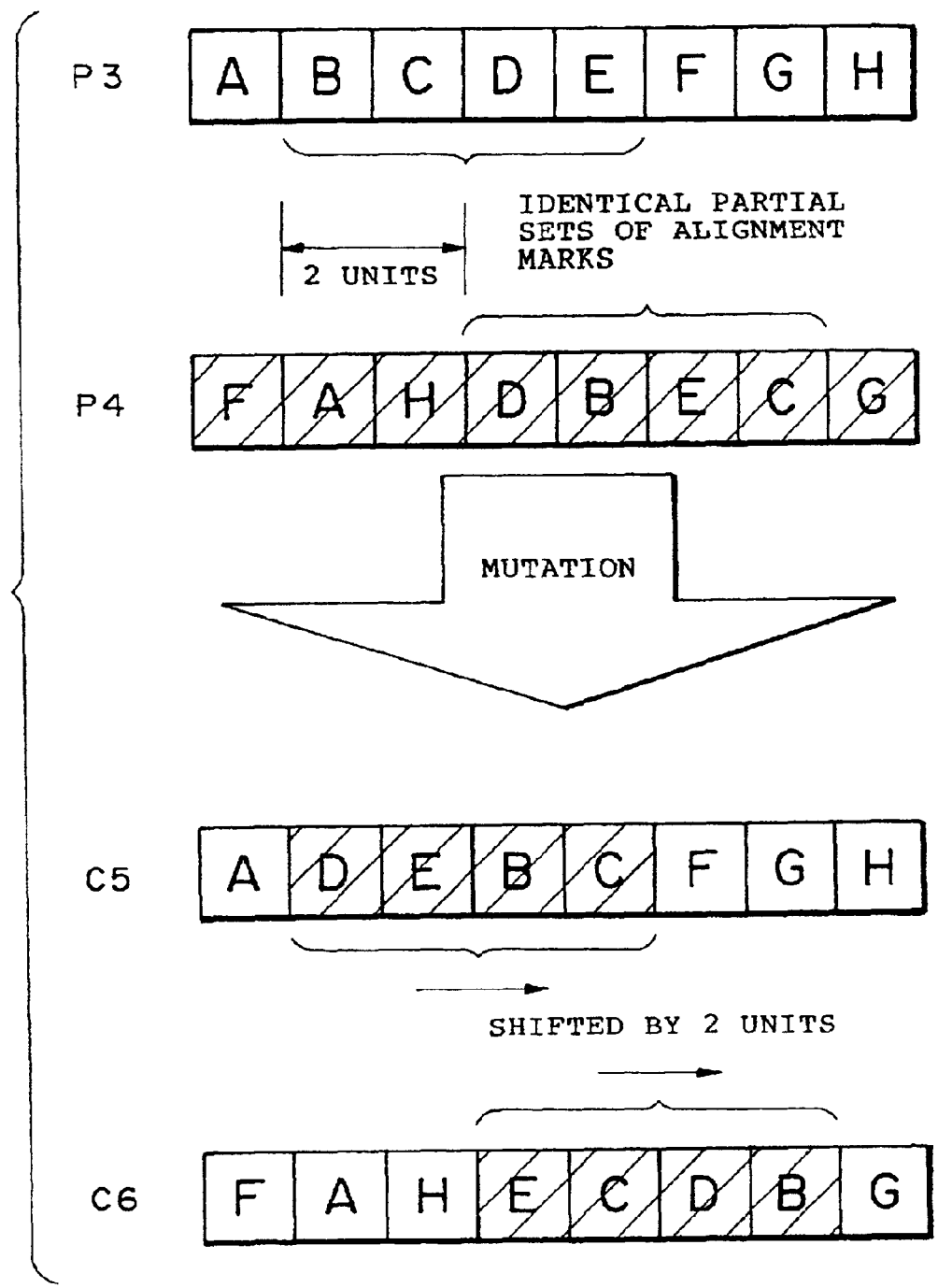
FIG. 17 is a drawing for explaining a mutation operator (cyclic shift) in the genetic algorithm.

In FIG. 16 and FIG. 17 P1, P2, C1, C2, etc. represent measurement orders of alignment mark positions, imitating the genes. One unit is defined as a position of one measurement of an alignment mark. One gene is expressed by a string of n units corresponding to n alignment marks. Since in this embodiment the number of chip areas position-measured is 20 and the number of alignment marks in each chip area is 4, one gene is composed of 20×4=80 units. For simplification of description, the description will be given as to an example in which eight alignment marks are measured and denoted by A to H. Namely, each operator will be explained using an example in which one gene is composed of eight units.

FIG. 16 is a drawing to illustrate a crossover operator for subtour exchange crossover, which is one of the genetic operators. The concept of the crossover operator is to make from two parents two or more children having characteristics of the both parents. The subtour exchange crossover operator is applied to a pair of genes P1 and P2 randomly selected out of plural genes. At this time the crossover operator searches portions having a common partial set of alignment marks in the genes P1 and P2. The third unit to the sixth unit of the gene P1 are a set of alignment marks C, D, E, and F. Further, the fourth unit to the seventh unit of the gene P2 are also a set of alignment marks C, D, E, and F.

These common portions (subtours) are exchanged between the gene P1 and the gene P2. Namely, new genes of C1 and C2 are generated. In this embodiment genes C3 and C4 are further generated by inversion of the partial information of the exchanged portions from the genes C1 and C2. Namely, the two parents have four children.

FIG. 17 is a drawing to illustrate a mutation operator, which is one of the genetic operators. The concept of the mutation operator is to generate children having characteristics that their parents do not have. FIG. 17 illustrates the mutation operator, particularly, for improvement in the movement order of object (the order of position measurement of alignment marks: cyclic shift). The mutation operator is applied to a pair of genes P3 and P4 randomly selected out of plural genes.

This mutation operator first searches portions having a common partial set of alignment marks in the genes P3 and P4. In FIG. 17, the second unit to the fifth unit of the gene P3 are a set of alignment marks B, C, D, and E, while the fourth unit to the seventh unit of the gene P4 are a set of alignment marks B, C, D, and E. Thus, the two sets are identical.

A difference of units between such partial strings appearing in the genes P3 and P4 is defined as a number of shifts. In FIG. 17 the partial string starts from the second unit in the gene P3 while the partial string starts from the fourth unit in the gene P4; therefore, there is the difference of two units and thus the number of shifts is 2. Then the units appearing in the partial set of alignment marks are shifted in order and in cycle by the number of shifts, thus generating new genes C5 and C6. This means that the gene C5 is obtained in such a way that the partial set of BCDE in the gene P3 is shifted once to be CDEB and then it is shifted once more to be DEBC. The gene C6 is also obtained in the same way.

The contents of each operator were detailed above and now, returning to the flowcharts of FIG. 14 and FIG. 15, the procedures of application of each operator will be described.

First, genes of a gene group consisting of genes numbering N preliminarily set (for example, N=80) are generated randomly (step ST12). Each gene in this group is determined as one for measuring each of the all positions of the alignment marks numbering n (for example, n=80) once. Each of the genes can be a solution generated (or updated) by an approach based on the rule of thumb, an approach based on the linear programming method (for example, the nearest neighbor method which will be called the NN method and the details of which will be described hereinafter, or the like), or the Lin and Kernighan's approach (hereinafter referred to as the LK method the details of which will be described hereinafter) with an initial solution being a constraint satisfying solution generated arbitrarily; or a solution generated (or updated) by the LK method with an initial solution being a constraint satisfying solution generated by the approach based on the linear programming method (for example, the NN method or the like). Since the generation t at this time is t=1, the gene group of the first generation will be called G1. The overall movement times of movement sequences are computed for the position measurement of alignment marks of individual genes in the gene group G1 of the first generation. For example, the overall movement times are 64.278 sec for the first gene, 63.448 sec for the second gene, . . . , 56.163 sec for the twenty fifth gene, and 53.046 sec for the twenty sixth gene.

In one alteration of generation, first, the crossover is carried out in the number of crossovers according to a crossover rate preliminarily set (Pc=0.4):N×Pc times (80× 0.4=32 times) out of the group of the N (=80) genes. A pair of (two) genes as objects of one crossover are sampled without replacement (or without permitting crossover of a same gene) preferentially from the shortest measurement time out of the gene group. This selection of the paired genes is carried out the number of crossovers times by sampling with replacement (permitting one gene to be selected plural times for different pairs) out of the gene group. One of specific, applicable methods for preferentially selecting the genes of short measurement time is the roulette wheel selection, which will be described in step ST36. Another applicable method is a method for selecting N×Pc×2 genes in order from the shortest overall movement time of movement sequence out of the gene group and randomly selecting pairs of N×Pc genes therefrom.

When the crossover operator is applied to each of these gene pairs (step ST16), new genes numbering N×Pc×2 (80×0.4×2=64) are generated. This operator produces a group of new-born genes A (=N×Pc×2). (step ST18).

Next, the "mutation of ordinal shift of position measurement of alignment marks" is carried out A×Pm times (64× 0.4=25.6 times: which is raised to an integer, 26) according to the rate of "mutation of ordinal shift of position measurement of alignment marks" preliminarily set (Pm=0.4) out of these newborn genes. Selection of one gene as an object of one "mutation of ordinal shift of position measurement of alignment marks" is carried out by random sampling with replacement (permitting one gene to be selected as a mutation object plural times) out of the gene group (step ST20: selection 2). When the "mutation operator of ordinal shift of position measurement of alignment marks" is applied to the totally twenty six genes selected (step ST22), new genes numbering A×Pm (twenty six genes) are generated. This operator produces a group of new-born genes B (=A×Pm= N×Pc×2×Pm) (step ST24).

By the process heretofore, there are the gene group G1 of the first generation (N=80), the newborn gene group A (64), and the new-born gene group B (26). Totally, there are the genes numbering N×{1+2×Pc×(1+Pm)} (170 genes) (step ST26). In the case of the GA in the flowchart shown in FIG. 14, the steps up to this point correspond to multiplication of new-born genes by the genetic operators. In the case of the GA in the flowchart shown in FIG. 15, multiplication by the LK operator detailed hereinafter is introduced immediately after this point.

After completion of multiplication of new-born genes in each generation (i.e., in one loop in the flowchart shown in FIG. 14 or FIG. 15), in the final step of the loop a survival process is carried out to select genes to be left as a gene group of the next generation (i.e., an initial gene group in the next loop) and to dismiss the other genes (step ST36). Namely, the movement times are checked for the all movement sequences corresponding to the individual genes included in the new-born gene group A and the new-born gene group B generated by the genetic operators (the new-born gene group C is further added in the case of the GA in the flowchart shown in FIG. 15) in addition to the initial gene group Gt. Then the best gene, which is a gene to achieve a movement sequence having the shortest movement time among them, is outputted. At this time, if S different genes all are the best, these S genes are left unconditionally in the next generation. Further, (N–S) genes are also selected out of the remaining (170-S) genes by such a selecting method as to select a gene corresponding to a movement sequence of a shorter movement time more preferentially. These genes are also left in the next generation (i.e., in the (t+1)-th generation). Namely, the survival process is carried out so as to select totally N genes including those of the movement sequences of the shortest movement time and the other genes (step ST36). This selection method is not one for selecting N movement sequences from the shortest movement time, but is one for selecting epistatic movement sequences with a higher priority but still leaving a possibility of selecting even a hypostatic movement sequence (of longer movement time), though low. The reason why the possibility of selecting a hypostatic movement sequence is left is that the true optimum solution is not always derived from a group of epistatic movement sequences, but is also possibly derived from a group of hypostatic movement sequences. Meanwhile, if a solution derived from a hypostatic movement sequence is also still hypostatic in the next generation, it will be naturally dismissed. Therefore, it will not be a hindrance against finding of the true optimum solution. The roulette wheel selection can be applied as a selection method of this type. For example, supposing in the optimization problem of movement sequence there are three candidates X, Y, Z as solutions of movement sequences and their movement times are 10 sec, 20 sec, and 20 sec, respectively, it is contemplated that the inverse of the time is set as a fitness value of each solution. At this time, supposing one solution is selected out of these three solutions by roulette wheel selection, probabilities of selection of the solutions X, Y, and Z are 0.5, 0.25, and 0.25, respectively. The eighty new genes thus selected compose a set of genes of the next generation, Gt+1. Then, returning to step ST14, the same process with the genetic operators is repeated.

As apparent from the algorithm to repeat this alteration of generation, for example, supposing exchange of reticle takes 10 sec and within that period the computation is completed, for example, up to the fortieth generation, the shortest movement sequence for position measurement of alignment marks can be obtained among the group of genes (solutions) of the fortieth generation. Supposing exchange of reticle takes 11 sec and within that period the computation is completed up to the forty first generation, the shortest movement sequence for position measurement of alignment marks can be obtained among the group of genes (solutions) of the forty first generation.

Further, as shown in FIG. 15, the LK method can be incorporated as one of the genetic operators into the GA in order to obtain the optimum solution or the best solution more efficiently. In this case, the LK method (hereinafter referred to as an LK operator) is applied to plural genes (for example, to the all genes) in the gene group including the new-born genes obtained after the application of the crossover operator and mutation operator (step ST30). Thus, a new-born gene group C (the number of new-born genes included in C is N×2×Pc×(1+Pm)) is newly produced herein (step ST32). Namely, immediately before the survival, there exist the genes numbering 2×N×2×Pc×(1+Pm) (Step ST34). The preset crossover rate Pc, the preset mutation rate Pm, the GA, etc. are stored in the memory 62 of the main control system 6 (FIG. 6).

Since the above embodiment minimizes the overall movement time of the movement sequence for position measurement of alignment marks by applying the GA to the projection exposure apparatus, it makes possible scheduling of the order (path) of position measurement of each alignment mark.

The present embodiment also makes possible the optimization in which the local search by the crossover operator is merged with the global search by the mutation operator. In addition, since the best solution of each generation is presented every alteration of generation by the GA, a near-optimum solution consistent with a computation time can be outputted even with interruption of computation within the allowed computation time.

The crossover operator, SXX, in the present embodiment can be replaced by another crossover operator used in approaches to TSP, such as OX: Order Crossover (L. Davis, "Applying Adaptive Algorithms to Epistatic Domains," Proceedings of International Joint Conference on Artificial Intelligence (IJCAI), 1985), PMX: Partially Mapped Crossover (D. E. Goldberg and R. Linge, "Alleles, Loci, and the Traveling Salesman Problem," Proceedings of International Conference on Genetic Algorithms (ICGA), 1985), or EAX: Edge Assembly Crossover (Nagata, Ono, and Kobayashi: "Proposal and evaluation of edge assembly crossover: New crossover of TSP considering tradeoff between character heredity and degree of freedom of crossover," System and Information Joint Symposium '96, Keisoku Jido Seigyo Gakkai, 1996).

Next described is the difference between the determining method of movement sequence according to the present invention and the conventional determining method of movement sequence. Specifically, for clearly expressing the difference between the solution of movement sequence obtained by the present invention (the result of execution of the determining method according to the present invention) and the solution of movement sequence obtained by the conventional technology (the result of execution of the conventional determining method), the following description shows the difference of measurement path in the serial movement sequence, i.e., the difference in a path of a locus drawn by measuring light on one wafer (a locus of the point where the measuring light arrives), and the difference in the overall movement time of movement sequence necessary for measuring positions of alignment marks on one wafer.

Figure 18:
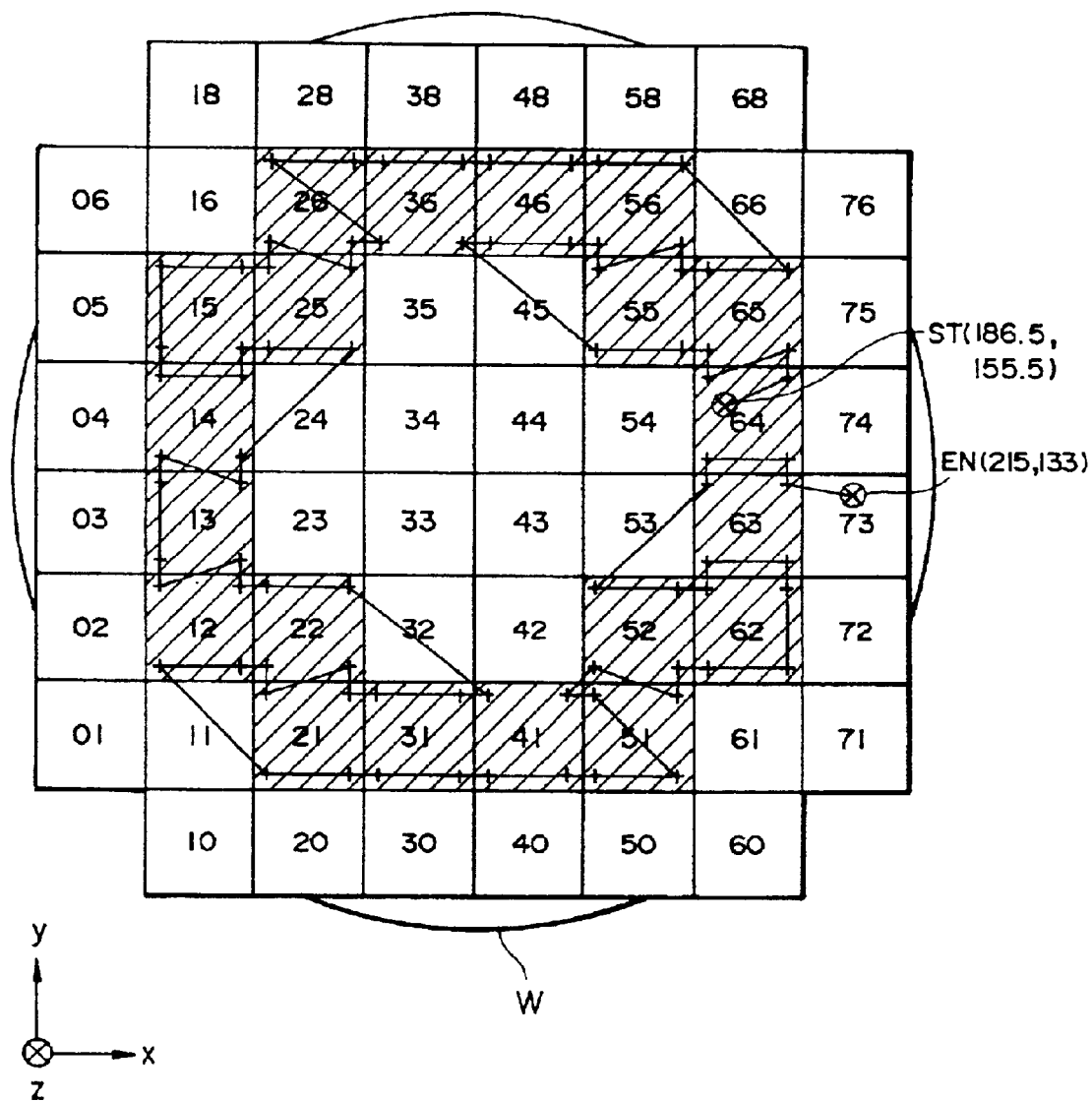
FIG. 18 is a drawing to show a solution of a movement sequence obtained by the determining method of movement sequence according to the present invention.

For guaranteeing the true optimum solution, all constraint satisfying solutions (feasible basic solutions) that can be generated must be checked and it requires enormous computational complexity, which is not practical. For examination, alterations of generation, which seemed sufficient to converge, were made in the GA using the MGG model under such preset conditions that the group size was somewhat large, the crossover rate was somewhat high, and the mutation rate was sufficiently high in comparison with the group size. When the alterations of generation were made with a sufficient time from an initial group generated at random, the convergent solution (the true optimum solution) was the movement sequence as shown in FIG. 18. The route passed the nearest alignment marks after or before the start point ST and the end point EN and there existed no seemingly long path. The overall movement time was 49.052 sec. After that, the convergent solution this time was handled as a substitute for the "true optimum solution." In this GA the computation was continued up to the 500th generation (for about thirty hours) under the setting conditions that the group size N was N=160, the crossover rate Pc was Pc=0.5, and the mutation rate Pm was Pm=0.4. A solution regarded as the convergent solution first appeared near the 300th generation and approximately twenty hours were consumed up thereto. This GA can finally reach the optimum solution with the sufficient time consumed, but it is not practical to apply the GA as it is. Thus, the approaches by the GAs shown in FIG. 14 and FIG. 15 above involve some means to find the optimum solution quickly.

Figure 1:
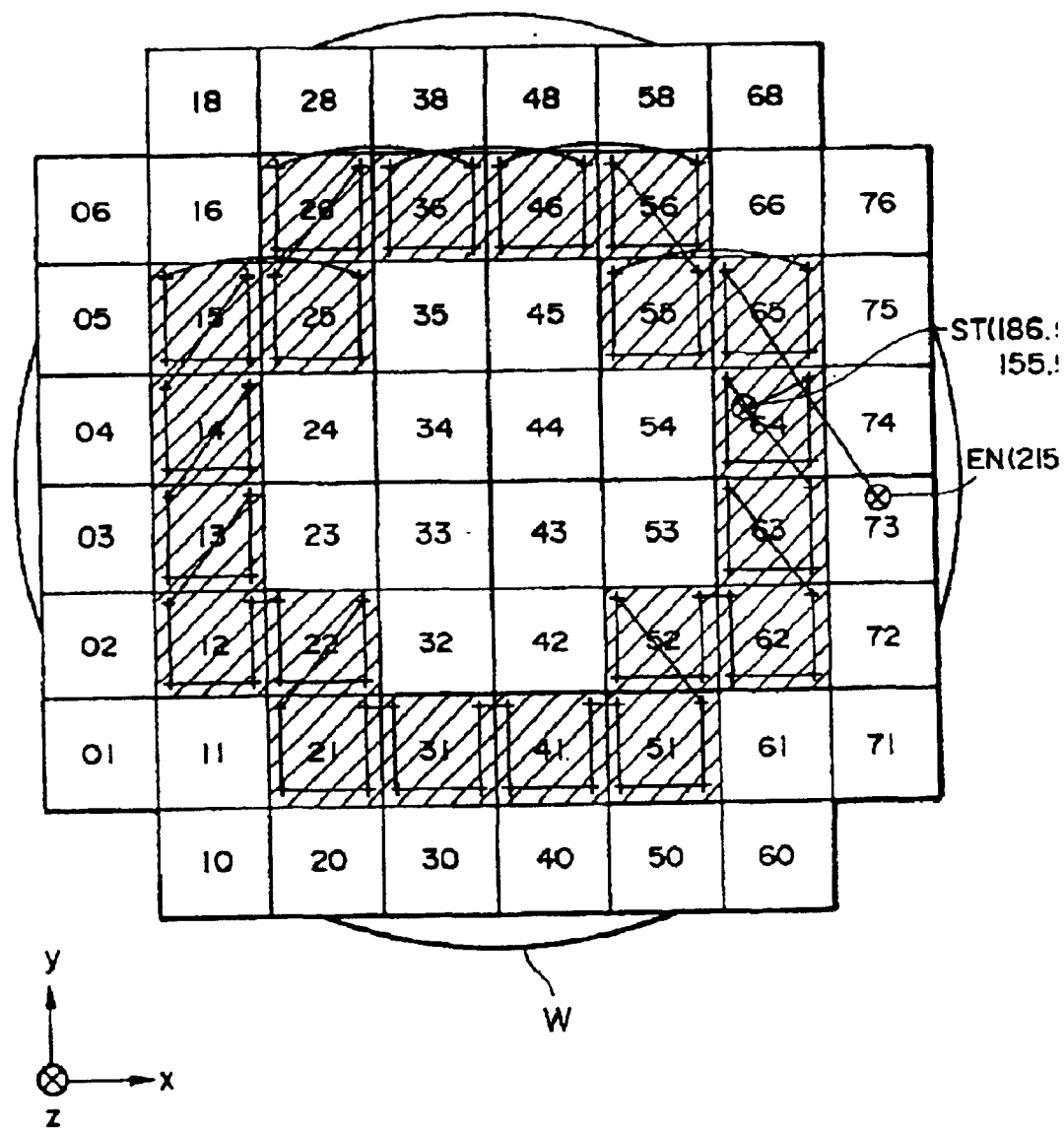
FIG. 1 is a drawing to show a solution of a movement sequence (the first example) obtained by the conventional approach based on the rule of thumb.
Figure 2:
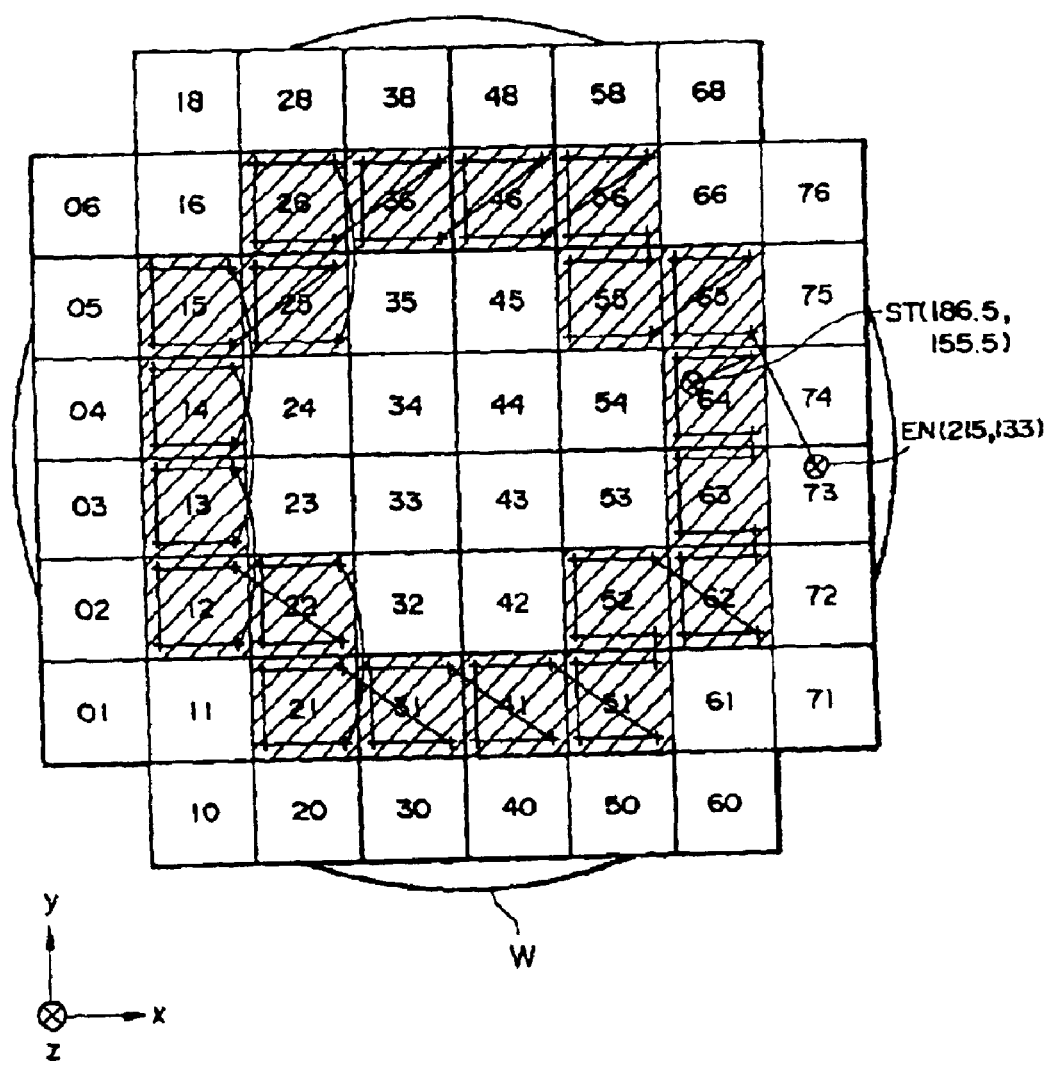
FIG. 2 is a drawing to show a solution of a movement sequence (the second example) obtained by the conventional approach based on the rule of thumb.
Figure 3:
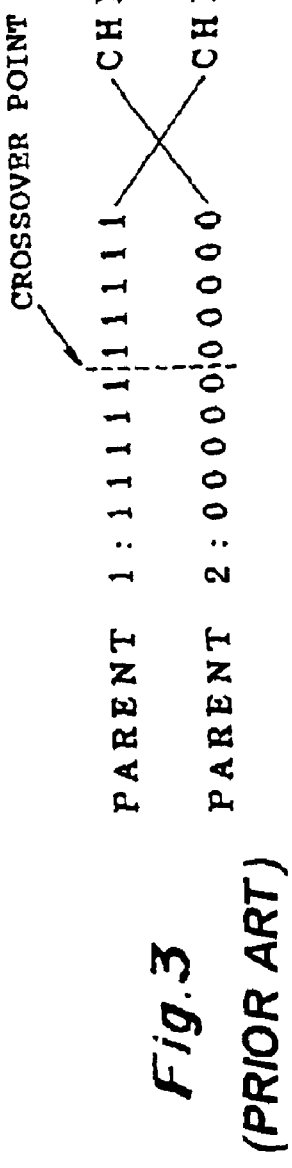
FIG. 3 to FIG. 5 are drawings for explaining the coding/crossover procedures in the conventional designing method of optical system using the discrete GA.
Figure 4:
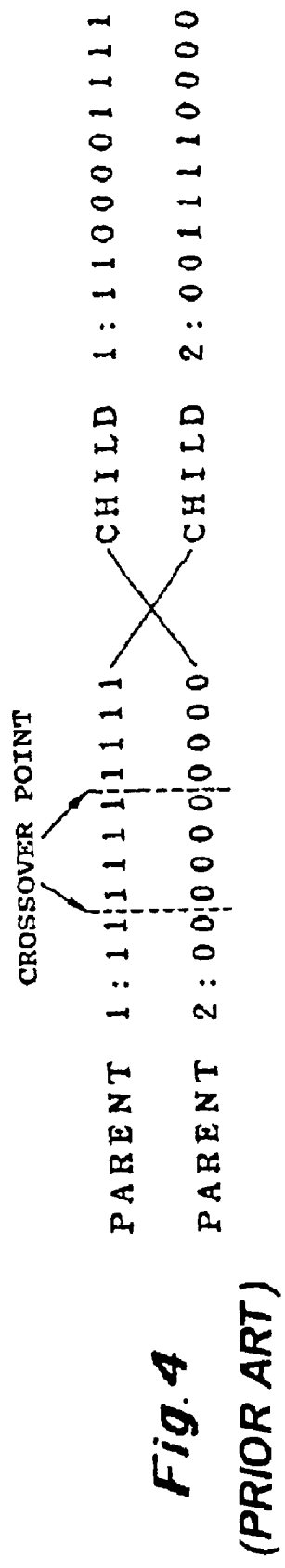
Figure 5:
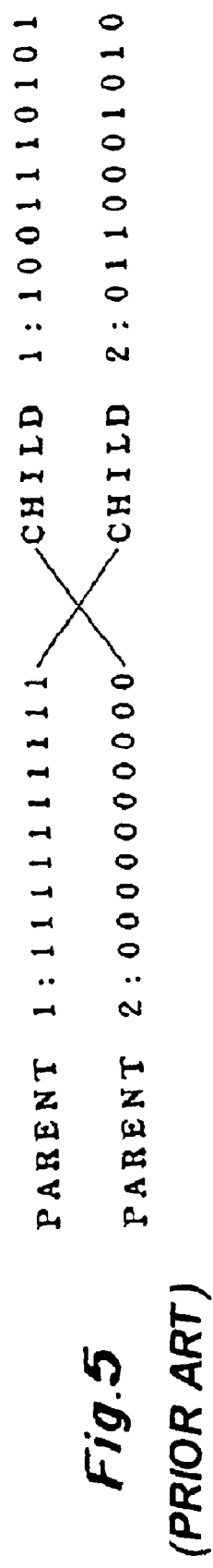

FIG. 1 and FIG. 2 show solutions of movement sequences for the position measurement of alignment marks being measurement targets, which were obtained by the prior-art determining method described previously. These movement sequences obtained by the prior-art approach are utilized from an empirical hope that they might not be the optimum solution, but may be satisfactorily good solutions. In the following description this approach is thus called "approach based on the rule of thumb."

When the approach based on the rule of thumb is applied, the operator determines the movement sequence that seems empirically good, according to the arrangement of chip areas to be measured. For example, a movement sequence obtained by the approach based on the rule of thumb is as follows. First, when the chip area 64 closest to the start point ST is selected as a first chip area to be measured, the measurement is carried out clockwise from the alignment mark AM1 (see FIG. 12) of this chip area via AM2 and AM3 to AM4 in order (of course, the measurement can be carried out counterclockwise in the order of AM1, AM4, AM3, and AM2). After completion of the position measurement of the all alignment marks given to the chip area 64, the measurement is continued to measure the positions of the all alignment marks of the chip area 63. Subsequently, the positions of the all alignment marks of the chip area 62 are measured in the same manner and then the positions of the all alignment marks in the all chip areas are successively measured.

With the approach based on the rule of thumb used herein, the optimization of movement sequence for the position measurement of alignment marks was not effected taking account of such a route that before completion of the position measurement of the all alignment marks of one chip area, the measuring point visited an alignment mark of another chip area and thereafter again visited the remaining alignment marks of the first chip area. Therefore, the approach based on the rule of thumb takes a short time for computation, but it fails to effect the optimization taking full account of the various conditions of the positions of the respective alignment marks, except for restriction conditions such as the performance of the stage or the chip areas.

The solution obtained by the approach based on the rule of thumb was as shown in FIG. 1 where the measurement was conducted clockwise for the positions of the alignment marks in each chip area. The overall movement time of the resultant movement sequence (from the start point ST to the end point EN) was 53.149 sec. When the measurement was conducted counterclockwise for the positions of the alignment marks in each chip area, the overall movement time of the resultant movement sequence (from the start point ST to the end point EN) was 52.757 sec. In contrast, the overall movement time of the resultant movement sequence according to the optimum solution obtained by the GA of the MGG model described above was 49.052 sec. It is thus seen that the overall movement time can be shortened by about 3 sec from that of the movement sequence obtained by the approach based on the rule of thumb.

Linear Programming Method: Nearest Neighbor Method (NN Method)

In general, even if a solution of local partial movement sequences is optimum, a movement sequence having such partial movement sequences will not be always an optimum solution. When this problem is solved by the linear programming method to obtain a solution, the resultant solution is not always the (globally) optimum solution. However, since the determining method of movement sequence according to the present invention is a method for generating a good solution, or a locally optimum solution very quickly, it is used as an effective near-optimum obtaining method where the point is to obtain a solution in a short time.

The nearest neighbor method (the NN method), which is one of most popular search methods, will be described herein as an embodiment by the linear programming method. The NN method is a method for repeating such an operation as to arbitrarily select one starting point and choose a nearest neighbor point thereto as a next point.

A point selected once will be excluded in order from a candidate group of next selection. In the search process of the best unit movement sequence, when there are plural candidates for the unit movement sequence selected next (or when there are plural candidates having an identical and shortest movement time of unit movement sequence for movement to the start point of the next position measurement of alignment mark) and if the all cases are searched, the search could be a search of all solutions in the worst case. For the purpose of decreasing the computation time by avoiding it, an idea to randomly select several points out of the next candidate points at each point (for example, in such a way as to preliminarily assume that p points are selected in the highest case and arbitrarily determine how many points should be selected between 1 and p, at each point) can be introduced.

In this embodiment the above number p is set to 1 and a solution is sought by the NN method while a search start position is selected from the end point EN and the all alignment marks. The reason is that when the above number p is 1 and if the search start position is fixed at the start point ST, we can find merely one solution. In this embodiment, however, the measurement start position is set to be the start point ST and the measurement end position to be the end point EN. In order to satisfy this constraint, the start point ST must follow the end point EN. Therefore, after the solution is obtained by the NN method, the units of the gene need to be shifted so as to start from the start point ST and end at the end point EN.

For quickly carrying out the algorithm of this type, it is preferable to make a movement time management table of movement patterns preliminarily contemplated and to write unit movement times of the respective patterns in the memory or the like. With a list of candidates for movement from a certain point to a next point, it is effective to sort the candidates in the order of unit movement times from the smallest. This operation makes it possible to select points not having passed yet one by one from the top of the candidate list. The same table of movement patterns is also utilized for increasing the efficiency of calculation of movement time similarly in the LK method and the evolutionary computation method.

Figure 19:
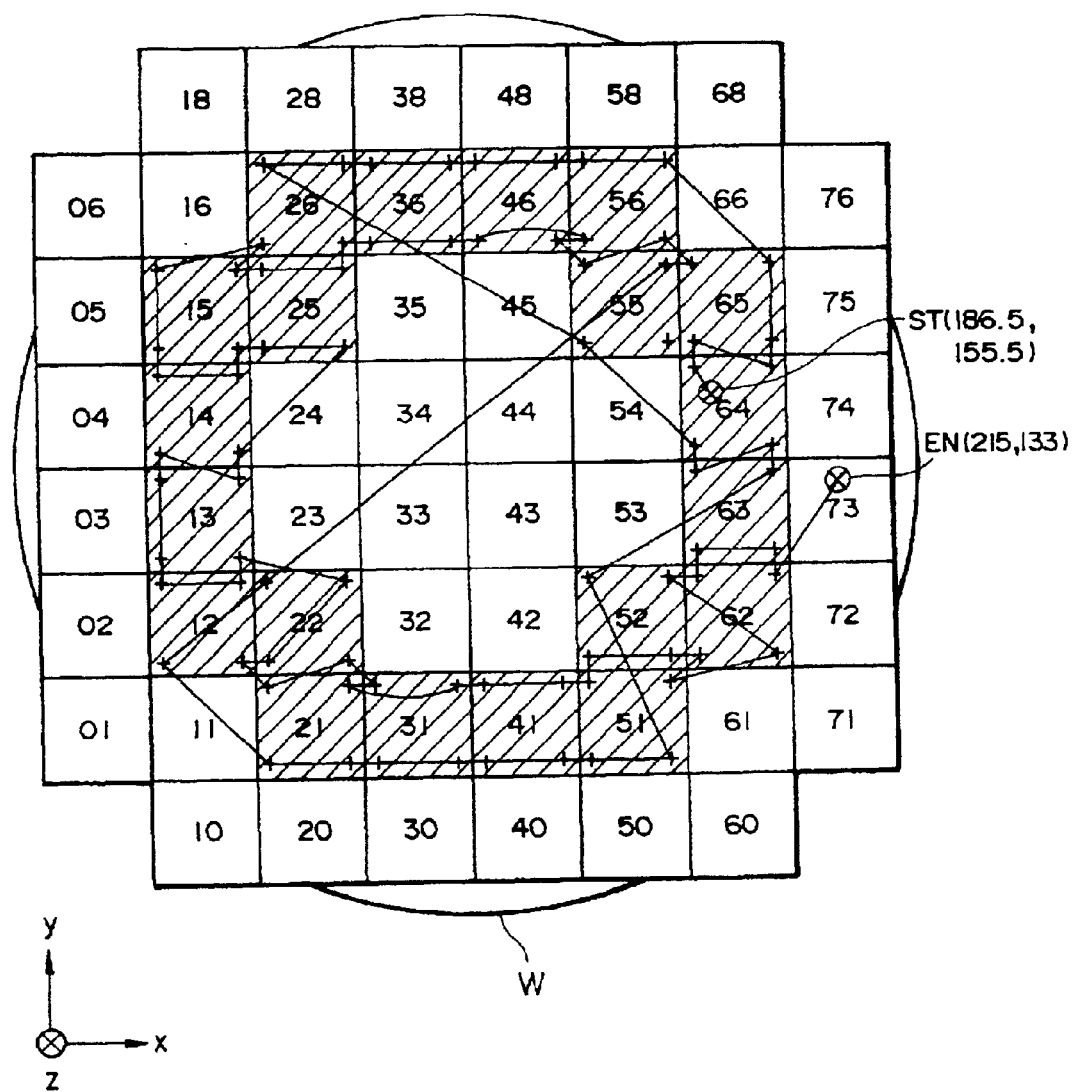
FIG. 19 is a drawing to show a solution of a movement sequence obtained by the determining method of movement sequence according to the present invention, to which the linear programming method (NN method) is applied.
Figure 20:
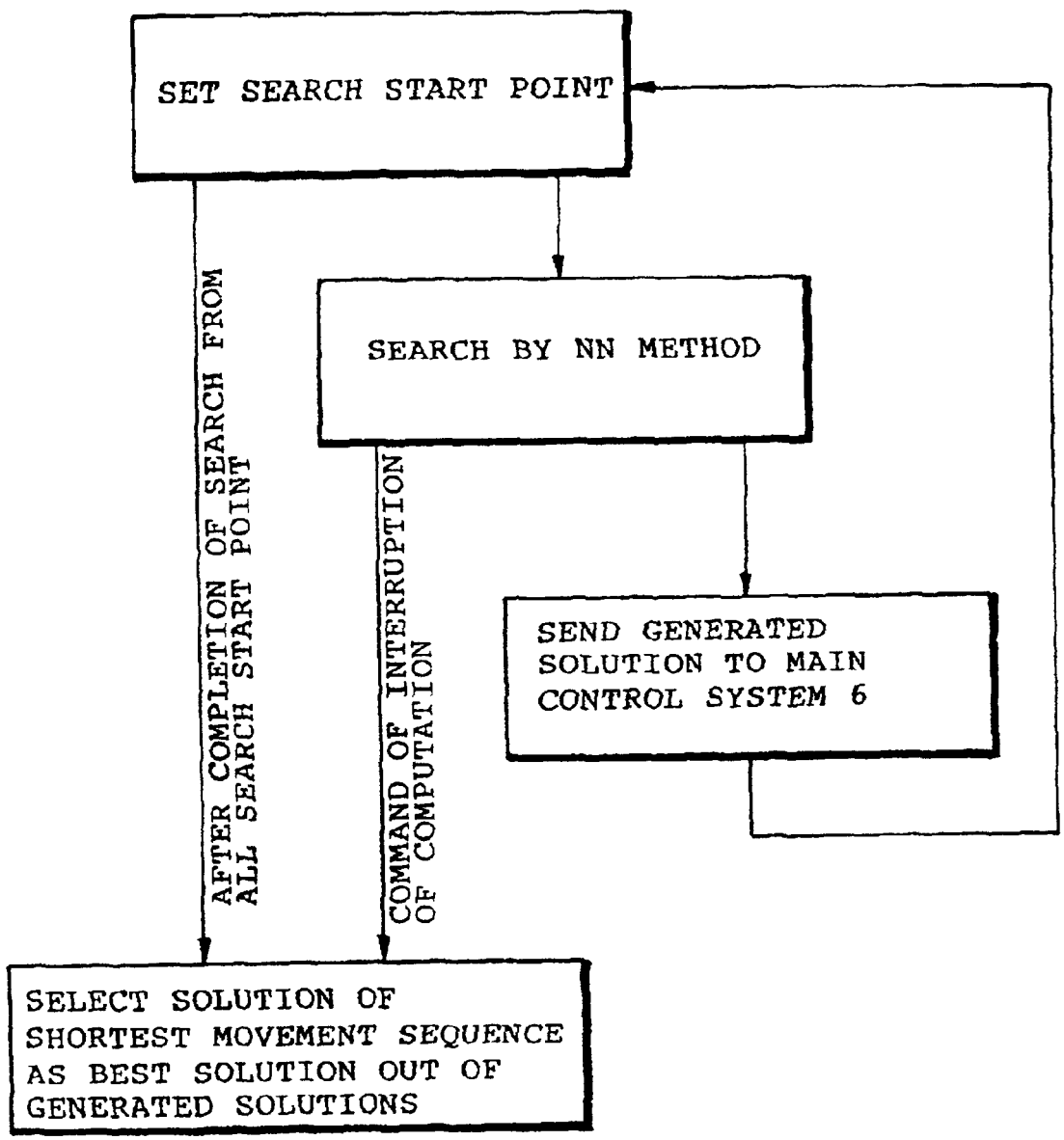
FIG. 20 is a flowchart for explaining the determining method of movement sequence according to the present invention, to which the NN method is applied.
Figure 21:
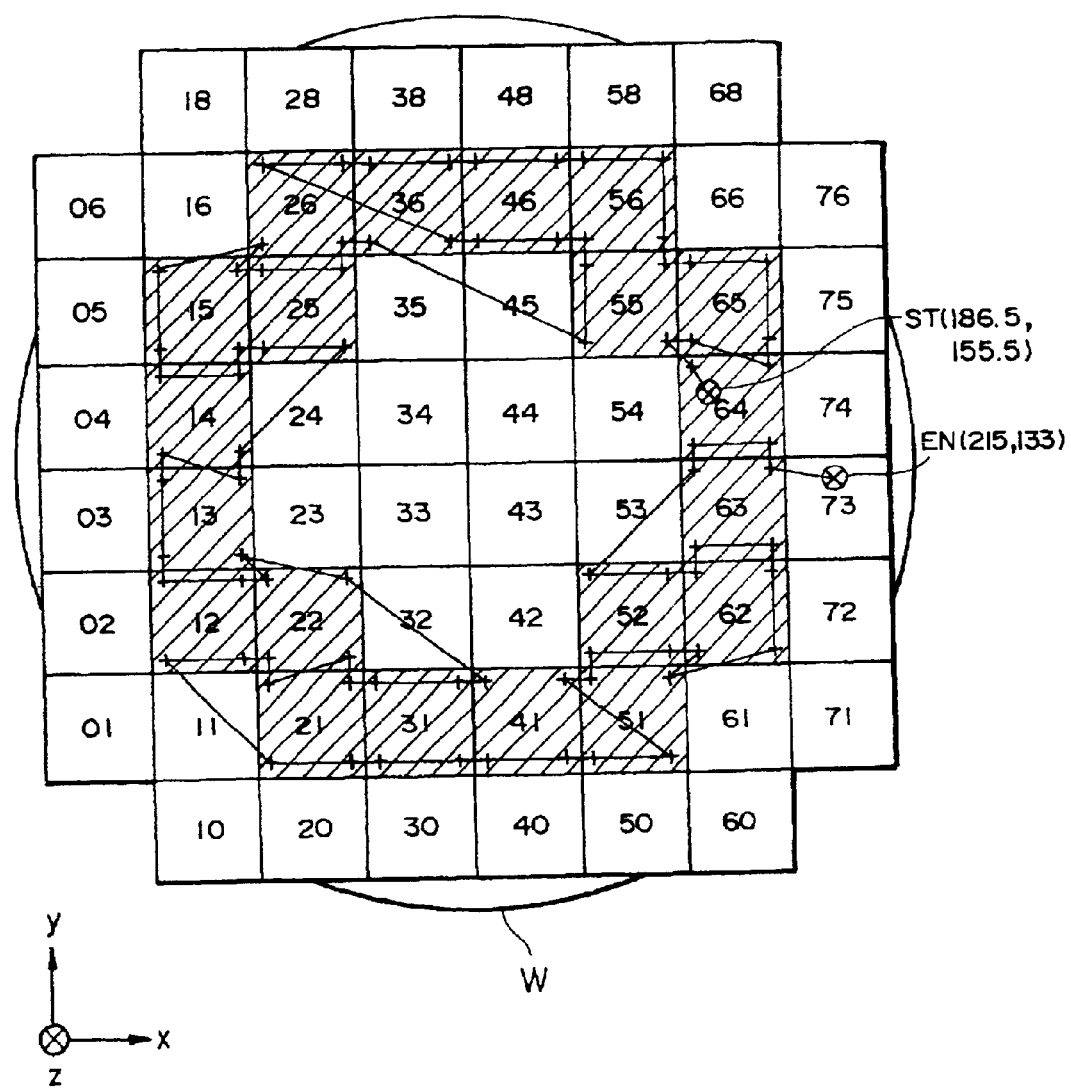
FIG. 21 is a drawing to show a solution of a movement sequence obtained by the determining method of movement sequence according to the present invention, to which the LK method utilizing initial solutions obtained by the NN method is applied.
Figure 22:
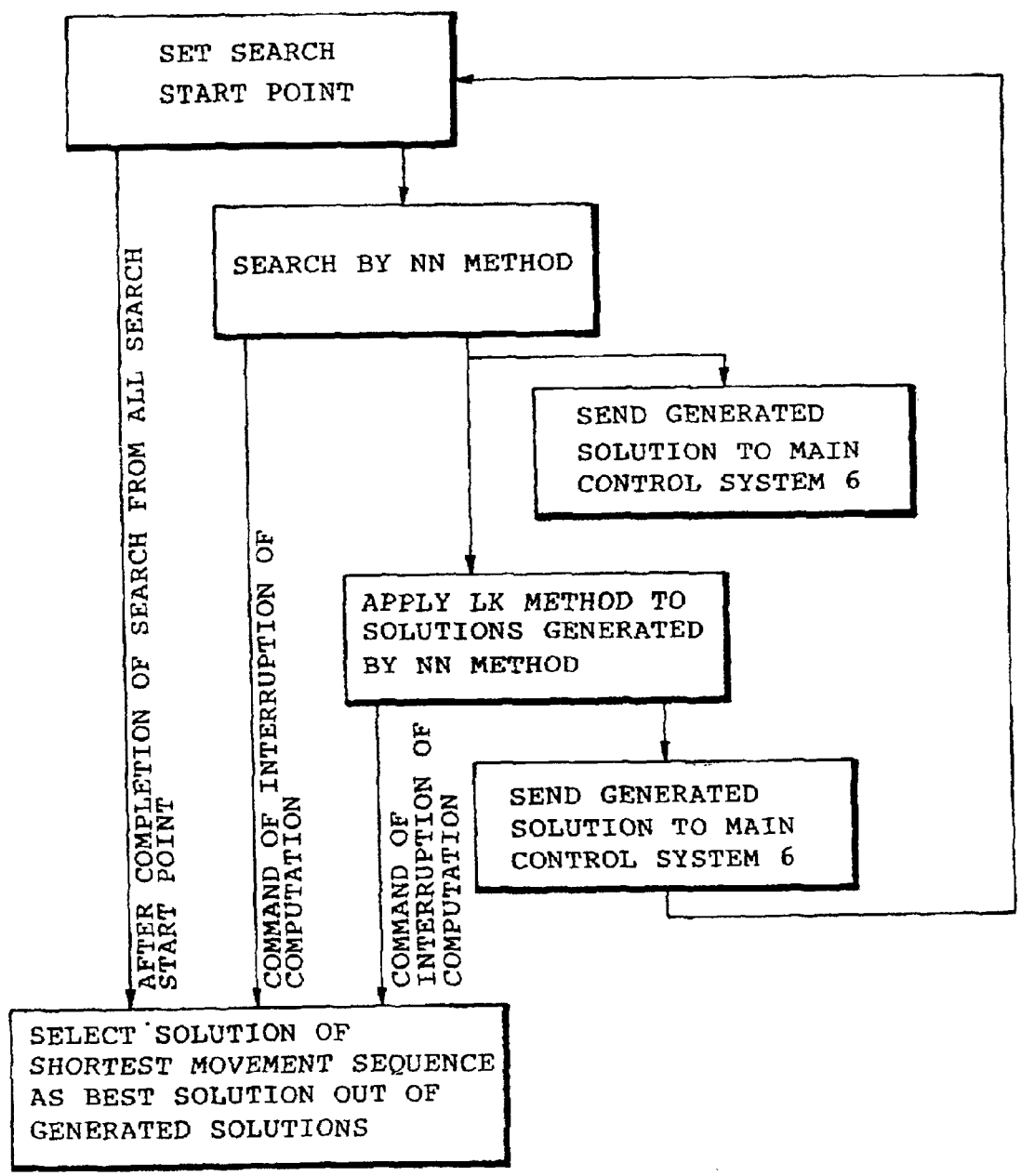
FIG. 22 is a flowchart for explaining the determining method of movement sequence according to the present invention, to which the LK method is applied.

By employing such a method that every time a new solution is generated by the NN method, the best solution at that point is recorded in the memory 62 of the main control system 6, the best solution by the NN method at that time can be obtained even with interruption of computation on the way. For example, the operation in this embodiment is carried out according to the flowchart shown in FIG. 20. Eighty one solutions were generated by the NN method and the computation time for generation of the eighty one solutions was about 0.03 sec. As a result, the best solution by the NN method in this embodiment was as shown in FIG. 19, and the overall movement time of the movement sequence for the position measurement of the alignment marks (from the start point ST to the end point EN) was 49.614 sec.

Lin and Kernighan's Approach (the LK Method)

The LK method is famous as a quick near-optimum obtaining method for symmetric TSP (Traveling Salesman Problem), i.e., as a technique capable of obtaining a near-optimum solution in a very short turnaround time of computation and is a technique of development of the k-OPT method, which is the general name of the 2-OPT method and the 3-OPT method. Details of these techniques will be described hereinafter. The TSP is a problem: given an arbitrary city matrix for n (n>1) cities, find a minimum-length tour that visits each city only once and the all cities. There are symmetric and asymmetric TSPs. The symmetric TSP is a TSP for an object in which the overall pathlength is invariant even with inversion of the tour order from the sequential city visit order given for the matrix of n cities. Conversely, the asymmetric TSP is a TSP for an object in which the overall pathlength will vary with inversion of the tour order from the above city visit order.

The TSP was originally the problem considered in order to minimize the length of the tour, for example, assuming that a matrix of cities are located randomly on a two-dimensional plane or the like. In such a city matrix space the shortest path between two arbitrary cities (i.e., an arbitrary unit path) is given uniquely by connecting the two cities by a straight line; therefore, once the visit order of the cities is determined, the minimum-length tour path according to the visit order can be obtained uniquely. Accordingly, finding a city visit order (city permutation) to minimize the length of the path to visit the all cities is equivalent to obtaining a solution to the TSP. Therefore, even if the objective problem is not directed to minimization of the path itself (i.e., a distance in a physical space) and if it is converted to one equivalent to the optimization of permutation, the approach of TSP can be applied as it is. For example, the technique of TSP can be applied as it is, to the problem to determine the movement sequence so as to minimize the overall movement time for the position measurement of the all alignment marks in the one-shot exposure type stepper. The movement times of unit movement sequences in this case are not distances between two arbitrary alignment marks, but they are the times as the memory contents in the movement time management table stored in the memory 62 (because the movement along the X-direction and the movement along the Y-direction of the wafer stage can be made independently and simultaneously). Let us consider below application of the "LK method" which can be regarded as an improvement of the k-OPT method.

The NN method is a "generating method" to generate a solution from nothing, while the k-OPT method and LK method are so-called "improving methods" for initially giving a certain initial solution (here, in the case of the "constraint satisfying problem" to require an output solution to satisfy a specific constraint, a necessary condition is that the initial solution is a feasible basic solution) and successively improving the solution. Particularly, the LK method is a method for repetitively performing such an operation as to extract a part of a tour sequence of the initial solution and to invert the partial order, thereby effecting repetitive improvements even in a solution after improved, as long as an improvement is possible.

In one improvement, if the sum of lengths of paths (two cut paths) at the both ends of the partial sequence extracted is smaller than that before the inversion, the length of the entire path will be shortened by the difference between them. Therefore, this method is efficient, because attention is focused only on the lengths of the two cut paths and computation is unnecessary for the total pathlength. This single improvement is called 2-OPT. After accomplishment of 2-OPT, when 2-OPT is again carried out in a combination of one end of the partial path extracted with another end this time, three ends are changed as a whole. This is called 3-OPT. These are generally called k-OPT. In the k-OPT the value of k is preliminarily given. Therefore, the k-OPT had a problem that it was not sufficiently adaptable to the case wherein the optimum k value varied depending upon the initial solution to be improved. However, the LK method updates k in k-OPT (from 2) one by one as long as an improvement is made. Thus the LK method overcame the problem in the k-OPT method.

If the method is so arranged that every generation of a solution by the LK method the best solution at that point is stored in the memory 62 of the main control system 6, the best solution by the LK method at that time can be obtained even with interruption of computation on the way. For example, the operation of this embodiment is carried out according to the flowchart shown in FIG. 22.

In this embodiment the LK method is applied to near-optimum solutions obtained by the NN method. The LK method generates one improved solution per initial solution. Since one improved solution is generated per initial solution, the number of initial solutions should be determined preferably as high as possible. This embodiment employs an approach method for using eighty one solutions obtained by the NN method as initial solutions and improving them.

The computation time was about 0.14 sec for obtaining eighty one solutions by applying the LK method to the all eighty one solutions resulting from the forward search of the NN method. Since the computation time becomes longer with more improved portions by the LK method, it is not simply proportional to the number of initial solutions to be improved. The result of this experiment showed that when the solutions by the NN method were used as initial solutions of the LK method, the best solution was the solution of the movement sequence shown in FIG. 21 and the overall movement time of-the movement sequence was 49.117 sec.

Approach Based on the Evolutionary Computation Method

Next described is the approach based on the evolutionary computation method according to the present invention. An initial group is first generated. Since the shortest movement times of the above unit movement sequences are already recorded in the two-dimensional table (see FIG. 10), for example, if a movement sequence is arbitrarily produced so as to pass each alignment mark only once without duplication with reference to this table, a gene indicating an arbitrary feasible basic solution can be generated. Using plural genes (each of which is a feasible basic solution) arbitrarily generated as described, as an initial group, preliminary experiments were repetitively conducted with different group sizes, crossover rates, and mutation rates. The preliminary experiments verified that the same solution as the optimum solution, which was obtained by 20-hour computation by the GA of the MGG model described above, was generated within about 20 seconds under such setting conditions that the group size N=the number of alignment marks, the crossover rate Pc=0.4, and the shift mutation rate Pm=0.4 and that the LK operator was applied to the all genes.

Further, experiments were conducted using the solutions obtained by the above LK method as initial solutions. It is highly possible that a solution obtained by the NN method+ the LK method (i.e., by the LK method using the solutions obtained by the NN method, as initial solutions) is a local solution in the optimization problem of measurement process sequence of coordinates of the alignment marks (which is a locally optimum solution, but is not a true optimum solution or a globally optimum solution). This thus raises a risk of biasing the solution search space in the global search by the GA (i.e., a risk of search biased to near the local solution). In order to avoid it, the initial group should desirably include a solution of good quality representing a completely different movement sequence, as well as the best solution by the NN method+the LK method. If the added solution, though representing the completely different movement sequence, is not of good quality, it will be dismissed to be extinct soon in the GA. Therefore, this example employed a method for sampling solutions without replacement by the number equivalent to the group size (N) at predetermined probabilities, each at a probability consistent with an evaluation value of each solution, out of the solutions obtained by the NN method and the solutions obtained by applying the LK method to the all solutions obtained by the NN method, in addition to the best solution obtained by the NN method+ the LK method (the roulette wheel selection). This group of solutions was used as an initial gene group in the GA.

With the above group being used as an initial gene group and under such setting conditions that the group size N=the number of alignment marks, the crossover rate Pc=0.4, and the shift mutation rate Pm=0.4 and that the LK operator was applied to the all genes, the GA stably generated a solution superior to that by the LK method within 2 sec and also generated the same solution as the optimum solution obtained after 20-hour computation by the GA of the MGG model, within 10 sec.

Figure 23:
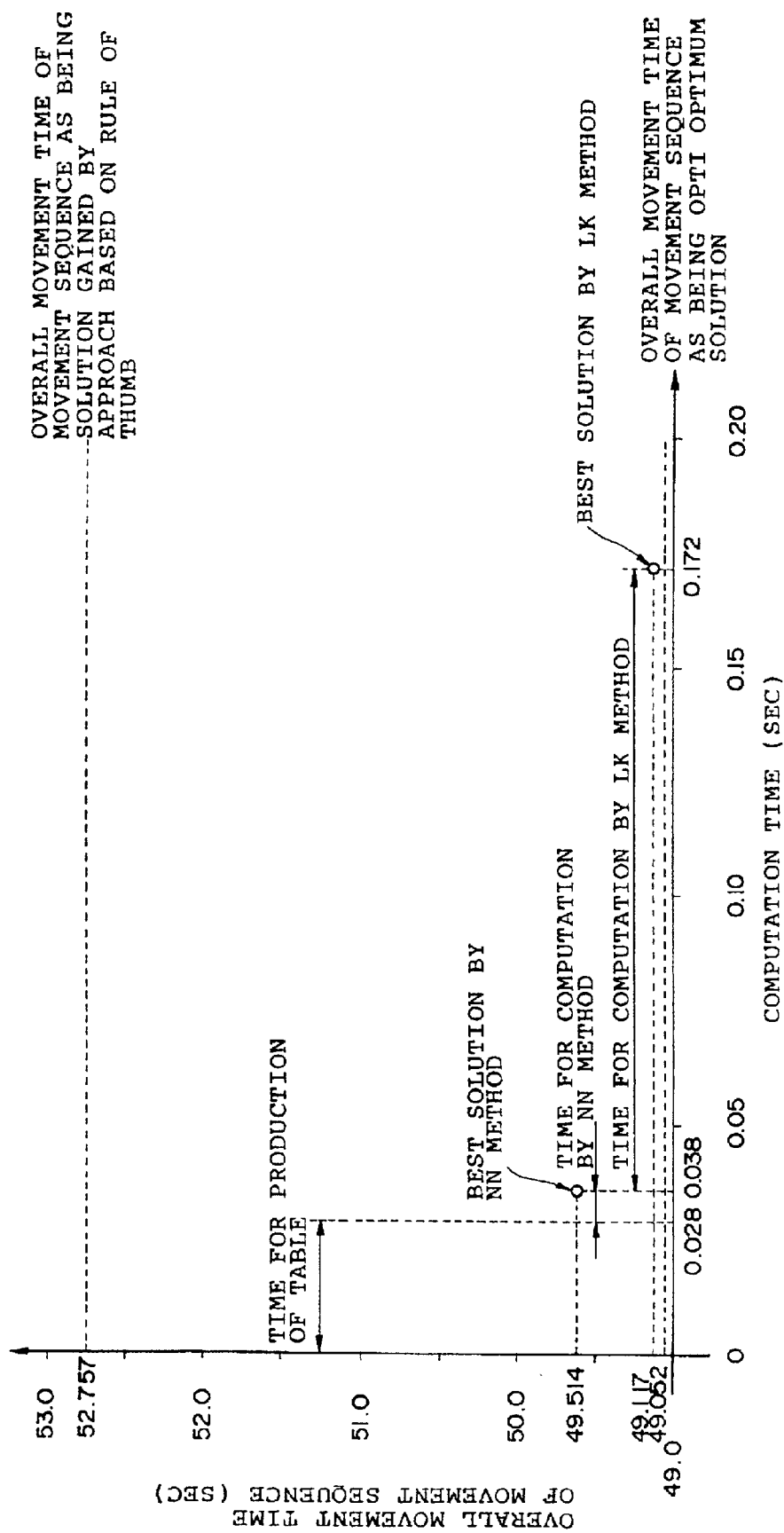
FIG. 23 is a drawing to show the relation between the computation time of the approach based on the rule of thumb, the NN method, and the LK method, and the overall movement time of the movement sequences obtained thereby.
Figure 24:
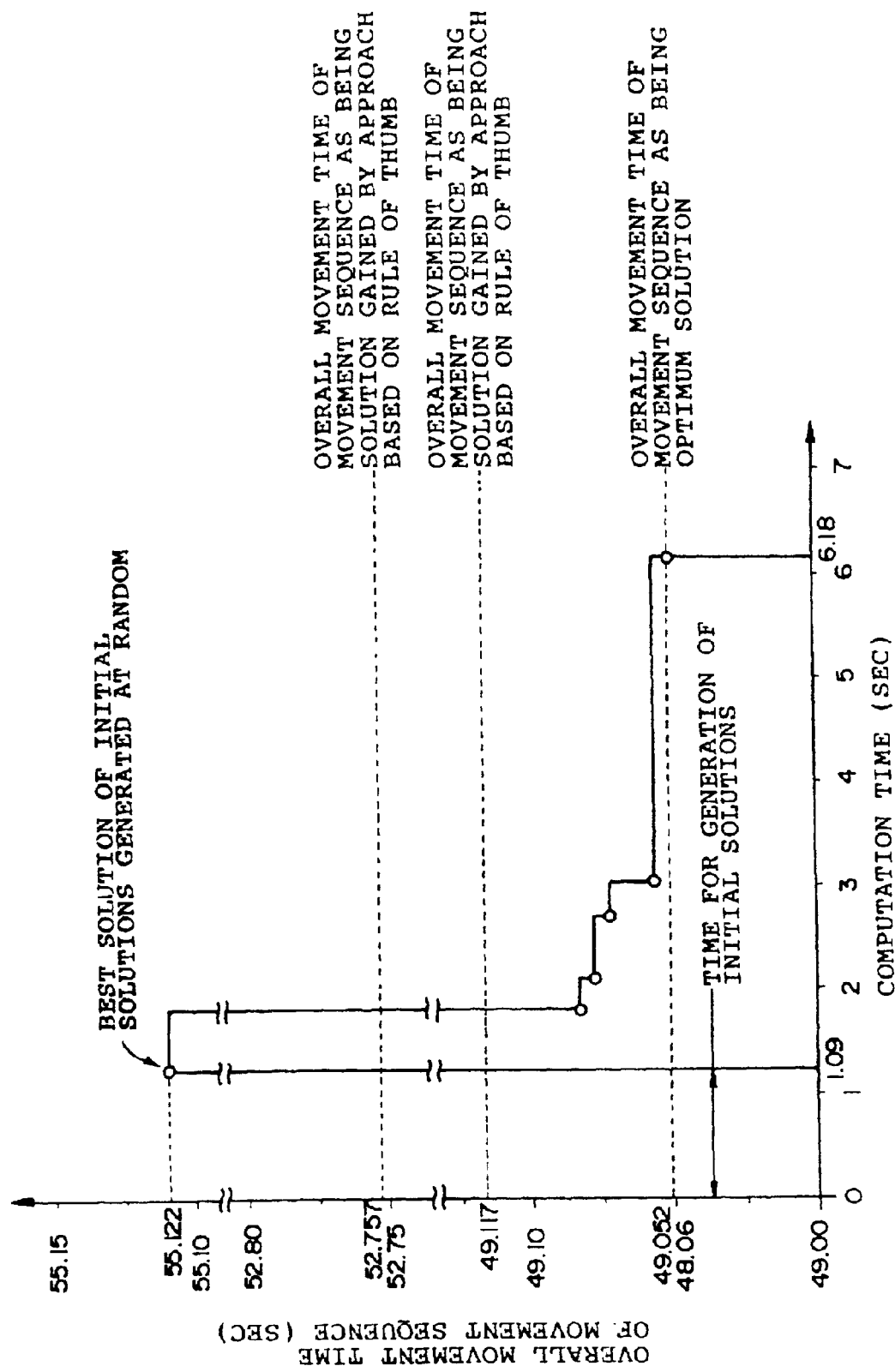
FIG. 24 is a drawing to show the relation between the computation time of the GA using randomly generated feasible base solutions as an initial group and the overall movement time of the movement sequence obtained.
Figure 25:
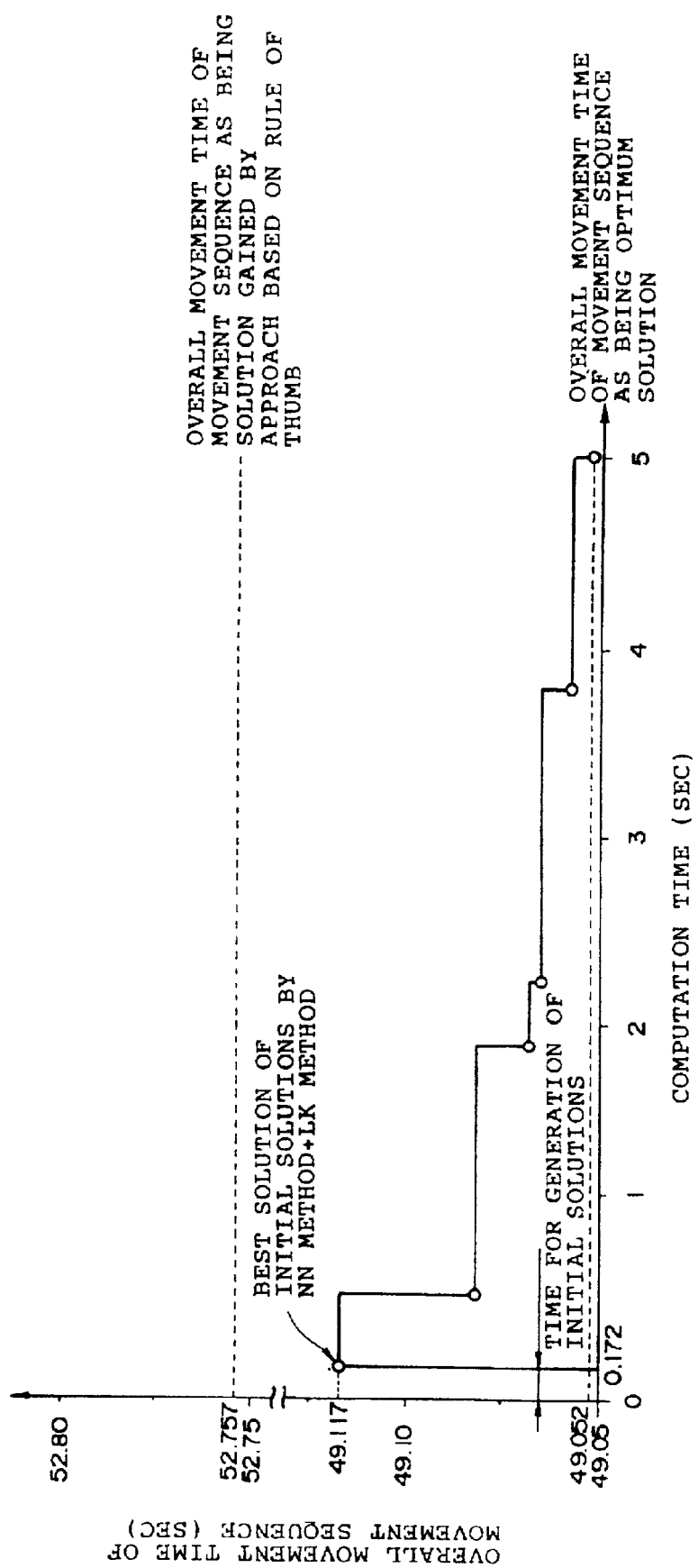
FIG. 25 is a drawing to show the relation between the computation time of the GA using plural solutions obtained by the NN method+the LK method as an initial group and the overall movement time of the movement sequence obtained thereby.

FIG. 23 to FIG. 25 are drawings to show relations among the various approaches described above, computation times necessary for such approaches, and overall movement times of movement sequences obtained by the approaches. The ordinate indicates the overall movement time of movement sequence obtained and the abscissa the computation time. The units are sec.

FIG. 23 is a drawing to illustrate the overall movement time of the movement sequence of the solution obtained by the approach based on the rule of thumb, the time necessary for obtaining the best solution by the NN method and the overall movement time of the movement sequence being the solution that time, and the computation time necessary for obtaining the best solution by the LK method using the solution set by the NN method as initial solutions and the overall movement time of the movement sequence being the solution that time.

FIG. 24 is a drawing to show the result achieved when the GA was applied to an initial group as being a set of solutions consisting of the feasible basic solutions randomly generated as described above. Further, FIG. 25 is a drawing to show the result achieved when the GA was applied to an initial group as being a set of solutions obtained by the NN method+the LK method. It is apparent from either figure that the best solution is updated with progress in alteration of generation. For comparison's sake, FIG. 24 and FIG. 25 also show the overall movement time of the movement sequence of the solution obtained by the approach based on the rule of thumb and the overall movement time of the movement sequence of the best solution obtained by the LK method using the solution set by the NN method as an initial solution group. The best solution obtained by the GA shown in FIG. 24 was obtained in the computation time of 6.18 sec and the overall movement time of the movement-sequence being the best solution obtained was 49.052 sec. Similarly, the best solution obtained by the GA shown in FIG. 25 was obtained in the computation time of 5.00 sec and the overall movement time of the movement sequence obtained was 49.052 sec.

The above experiments were conducted on a workstation provided with the CPU of 200 MHz. It should be noted that the above computation times naturally differ depending upon the performance of the CPU or the like.

Next described referring to FIG. 26 to FIG. 49 are embodiments of the designing method and apparatus of optical system according to the present invention, and the recording medium in which the program for realizing the designing method is recorded. In the drawings the same portions will be denoted by the same reference symbols and the description thereof will be omitted.

Figure 26:
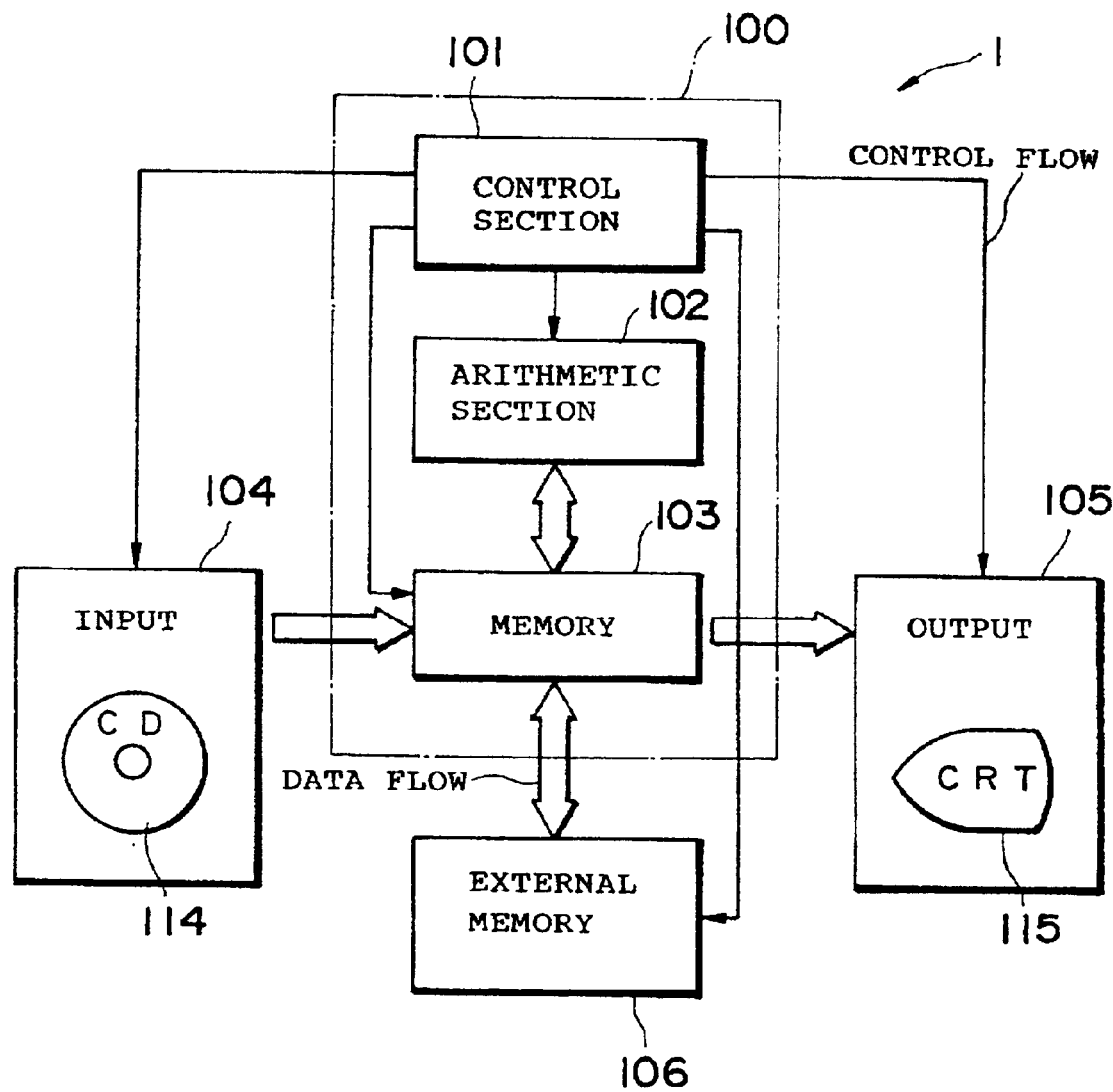
FIG. 26 is a drawing to show a designing apparatus of optical system according to the present invention and a medium in which a program for realizing the designing method of optical system according to the present invention is recorded.

The designing method of optical system according to the present invention can also be realized by a program described in predetermined language. This program is executed, for example, by an arithmetic circuit having memories (RAM, ROM) or by a computer 1 as shown in FIG. 26. Particularly, the computer 1 shown in FIG. 26 has a main control system 100 composed of control section 101, arithmetic section 102, and storage section 103 (memory) and also has peripheral devices, including input section 104, output section 105, and external storage device 106 such as a hard disk. Examples of the output section 105 include display devices such as CRT 115 or a liquid-crystal display. When the designing method of optical system according to the present invention is executed by the computer 1 as shown in FIG. 26, it is preferred to record the program for realizing the designing method of optical system in the above external storage device 106 or to optically or magnetically record the program in a predetermined recording medium such as CD 115, MO, FD, a magnetic tape, or ROM.

For easier understanding, definitions of terms used in this specification will be described below.

Individual: autonomous individual featured by genes;
Population: set of individuals;
Population size: number of individuals allowed to exist in a population;
Gene: basic component representing genetic information;
Allele: value that each gene can take;
Chromosome: genes expressed in the form of a string (a string of characters), a vector (a string of numerals), or a mixture thereof;
Locus: position of a gene on a chromosome;
Phenotype: external expression of a character revealed by a chromosome;
Genotype: gene expression (internal expression) for defining a character;
Coding: mapping from phenotype to genotype;
Decoding: inverse mapping from genotype to phenotype;
Fitness value: scalar evaluation value which indicates a degree of fitness of an individual to an environment (in the case where the object is the optimization problem, a fitness value is a value of an objective function itself or a value of a penalty function taking account of constraints);

Genetic operations: operations of crossover, mutation, and selection;

Selection: selection for survival of individuals according to their fitness values (to make a pair of individuals for mating, taking account of difference in fitness value);

Crossover: recombination of genes between individuals (to make new individuals by mutual recombination of chromosomes of a pair of individuals between them);

Mutation: replacement with an allele (to replace a value of a certain locus with another allele);

Generation: one cycle of genetic operations;

Diversity: degree of preserving diversity of gene;

Parallel algorithms: model in a distributed population;

Migration: exchange of individuals between plural populations.

In the following description we will consider two evaluation criteria and first check the global search capability of the designing method where the designing method of optical system according to the present invention is applied to design of a lens system of three lenses and a lens system of four lenses while the two evaluation criteria are converted to a single objective (the first embodiment). Next, we will handle the two evaluation criteria as multiple objectives to show excellent multi-objective optimization capability of the designing method of optical system according to the present invention as to design of a lens system of three lenses (the second embodiment).

In the embodiments of the designing method of optical system according to the present invention, supposing the user sets the focal length f, brightness F, and field angle 2w as design specifications of lens system, let us consider optimization of radii of curvature ri of respective lens surfaces (boundary surfaces of optical elements composing the optical system), thicknesses of lenses, and distances di between the lenses. It is assumed that the refractive indices of glasses and the number N of lenses are preliminarily given. A radius of curvature of a lens surface located closest to the film surface (the image plane) and a distance from the lens surface to the film surface will be corrected so as to satisfy the focal length given by tracing of paraxial rays. Accordingly, design of a lens system of N lenses is equivalent to optimization of a (4N−2)-dimensional function.

A lens system designed is evaluated based on three spot diagrams produced by letting totally eleven rays around the principal ray pass through the lens system at three angles of incidence of 0°, 0.65 w°, and w°. The two evaluation criteria are distortion (D) and resolution (R). The distortion D is given as a distance between an ideal image position (f·tan w) and an image point of the principal ray. The resolution R is given as a standard deviation to indicate a degree of dispersion of image points of the other ten rays than the principal ray from the image point of the principal ray, as shown in the following Equation 2.

$$D = \sum_{WE(0,0.65W,W)} \sqrt{(x_0 - x_{ideal})^2 + (y_0 - y_{ideal})^2}$$

$$R = \sum_{WE(0,0.65W,W)} \sqrt{\sum_{k=1}^{10} [(x_k - x_0)^2 + (y_k - y_0)^2]/10}$$

In the equations, (xideal, yideal) represents the ideal image position, (x0, y0) the position of the image point of the principal ray, and (xk, yk) positions of the respective image points of the other ten rays.

Next, the genetic algorithm (GA) will be explained.

The GA is an engineering model imitating the evolutionary process of organism, and a general algorithm thereof is formed as follows. Specifically, it is composed of the following operations.

(1) Generation of Initial Population

A plurality of individuals (solution candidates) are generated and are used as an initial population.

(2) Selection for Reproduction

Individuals to be parents (parent individuals) are selected from the population.

(3) Generation of Children

Child individuals (new solution candidates) are generated by applying the crossover operator and/or the mutation operator to the parent individuals.

(A) Selection for Survival

Individuals to form a next-generation population are selected from the population of the individuals in the current generation population and the child individuals generated in above step (3).

(5) The above steps (2) to (4) are repeated before a predetermined end condition is satisfied.

Design items of the GA are classified roughly into design of coding/crossover-mutation and design of generation model. The design of coding/crossover-mutation involves the design of a representation method for representing individuals and the design of a generating method for generating new individuals, and is dependent on a problem region. Since the performance of the GA is greatly affected by the design of coding/crossover-mutation, it is a very important design item.

On the other hand, the design of generation alteration model involves the design of a selecting method for selecting parents to generate children and the design of a selecting method for selecting individuals to be left in the next generation population. By well managing this design, it becomes possible to search at a time a set of solutions in plural tradeoff relations in the multi-objective optimization.

The design of coding/crossover will be described below.

In the embodiments of the designing method of optical system according to the present invention, real vector representation is employed as coding. An individual is expressed by a real vector (r1, r2, . . . , rn, d1, d2, . . . , dn) components of which are radii of curvature and distances between surfaces (parameters featuring each candidate of optical system to be designed).

Figure 27:
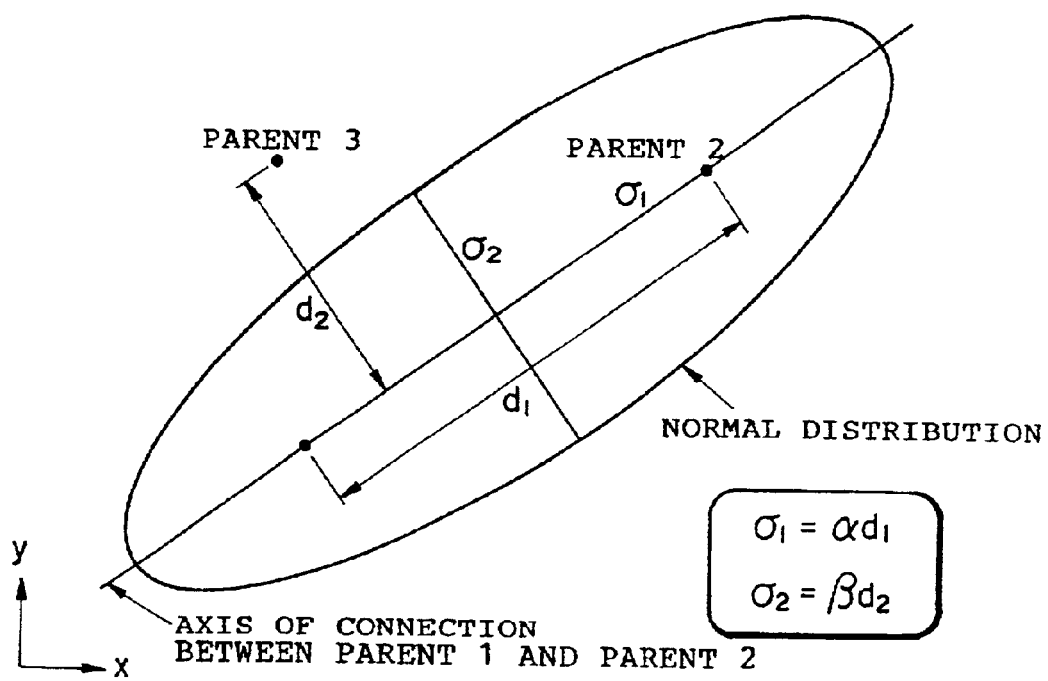
FIG. 27 is a drawing for explaining the crossover operator in the designing method of optical system according to the present invention.

In this embodiment UNDX (Ono, I. And Kobayashi, S: A Real-coded Genetic Algorithm for Function Optimization Using Unimodal Normal Distribution Crossover, Proceeding of 7$^{th}$ International Conference on Genetic Algorithms, pp. 246–253 (1997)) is adopted as a crossover operator. The UNDX generates, from two parents of parent 1 and Parent 2 out of selected parents, two children according to a normal distribution set around them, as shown in FIG. 27. The standard deviation of the normal distribution is set so that a component σ1 along the major-axis direction connecting the both parents is proportional to a distance between the parents (σ1=αd1 where d1: the distance between Parent 1 and parent 2) and so that a component σ2 along the other axis is proportional to a distance between the major axis and Parent 2 (σ2=βd2, where d2: the distance between parent 3 and the axis connecting parent 1 with Parent 2). FIG. 27 illustrates an example of two variables.

This crossover operator is effective to functions wherein strong dependence exists between variables, and multimodal functions. This is conceivably because the UNDX undergoes the global search in the early stage of search where distances are large between parents and undergoes the local search in the final stage where the distances are close between parents and it can accomplish the search little dependent upon the coordinate system.

First Embodiment by the Designing Method of Optical System

In the designing method of optical system of the first embodiment according to the present invention, the effectiveness concerning the global search capability of the GA will be verified by experiments with scalar evaluation values being set by linear combination under a given tradeoff ratio of resolution R and distortion D.

Figure 28:
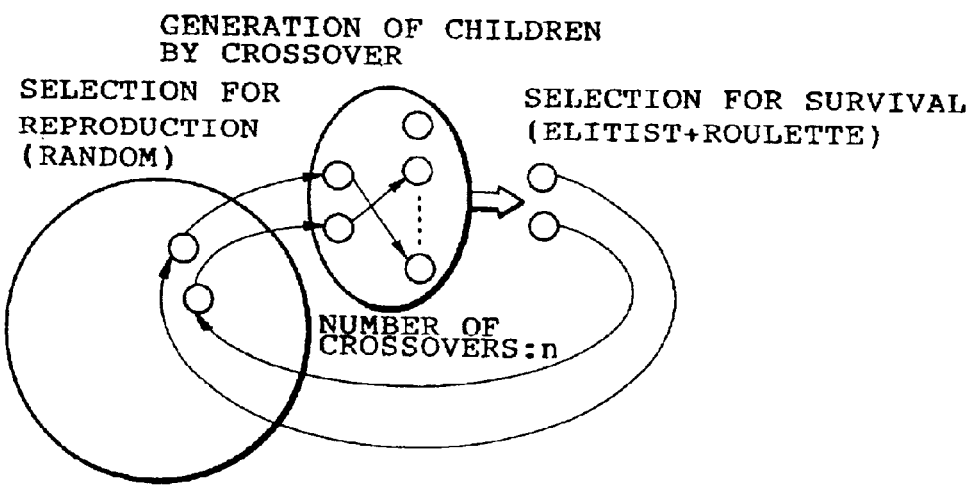
FIG. 28 is a drawing for explaining a generation alteration model in the designing method of optical system (the first embodiment) according to the present invention.

Used as a generation alteration model of the GA in Embodiment 1 is the MGG model shown in FIG. 28 (Satoh, H., Yamamura, M. and Kobayashi, S.: Minimal Generation Gap Model for GAs Considering Both Exploration and Exploitation, Proceedings of IIZUKA '96, pp. 494–497 (1996)). In this generation alteration model, n crossovers are carried out each with two individuals randomly selected as parents from a population. Then alteration of generation is done by returning one elitist individual and one individual selected by roulette selection out of the parent and child individuals into the population.

For verifying the effectiveness of the designing method in this first embodiment, optimization was done for the lens system of three lenses and the lens system of four lenses. For the lens system of four lenses, three experiments were conducted with different design specifications. In the all experiments, the number of individuals in the population was 100, the number of crossovers n was 100, $\alpha$ of UNDX was 0.5, and $\alpha$ thereof was 0.35. The tradeoff ratio of distortion D and resolution R was 1:1.

Experiment 1

Figure 29:
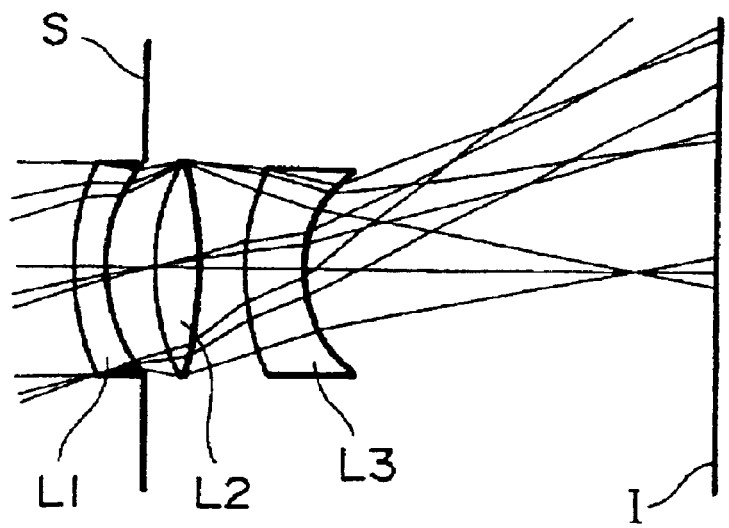
FIG. 29 is a drawing for explaining an example of the initial population in the designing method of optical system (the first embodiment) according to the present invention.
Figure 30:
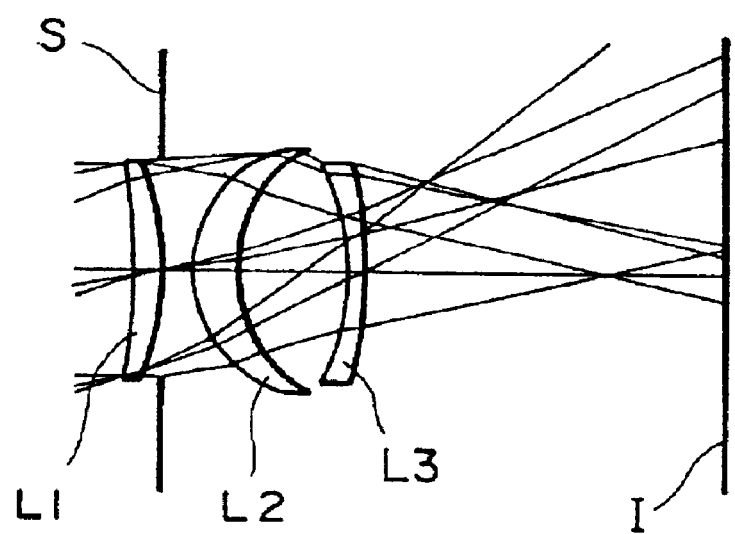
FIG. 30 is a drawing for explaining another example of the initial population in the designing method of optical system (the first embodiment) according to the present invention.
Figure 31:
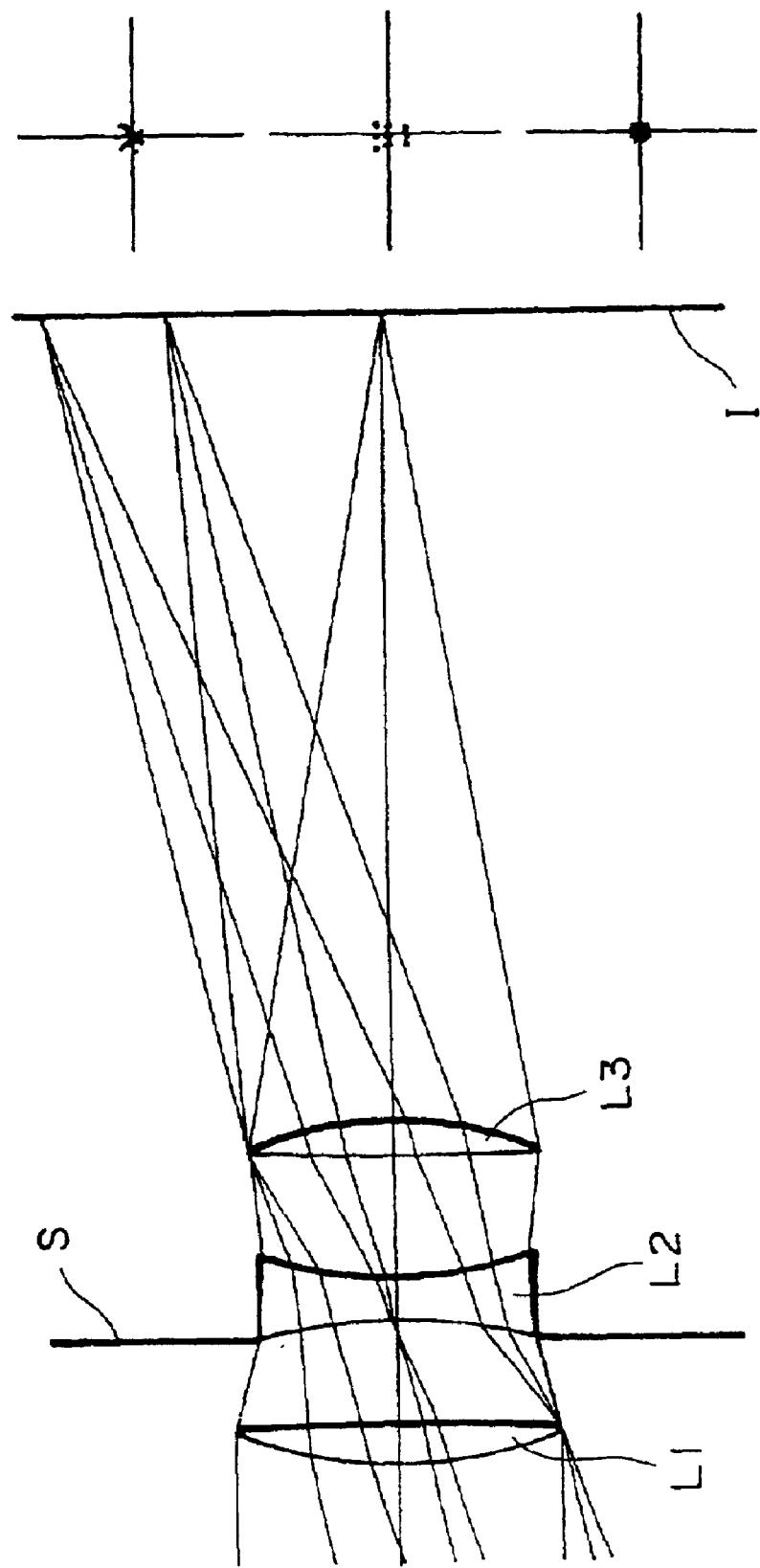
FIG. 31 is a path diagram of an optical system (a lens system) obtained in Experiment 1 of the designing method of optical system (the first embodiment) according to the present invention.
Figure 32:
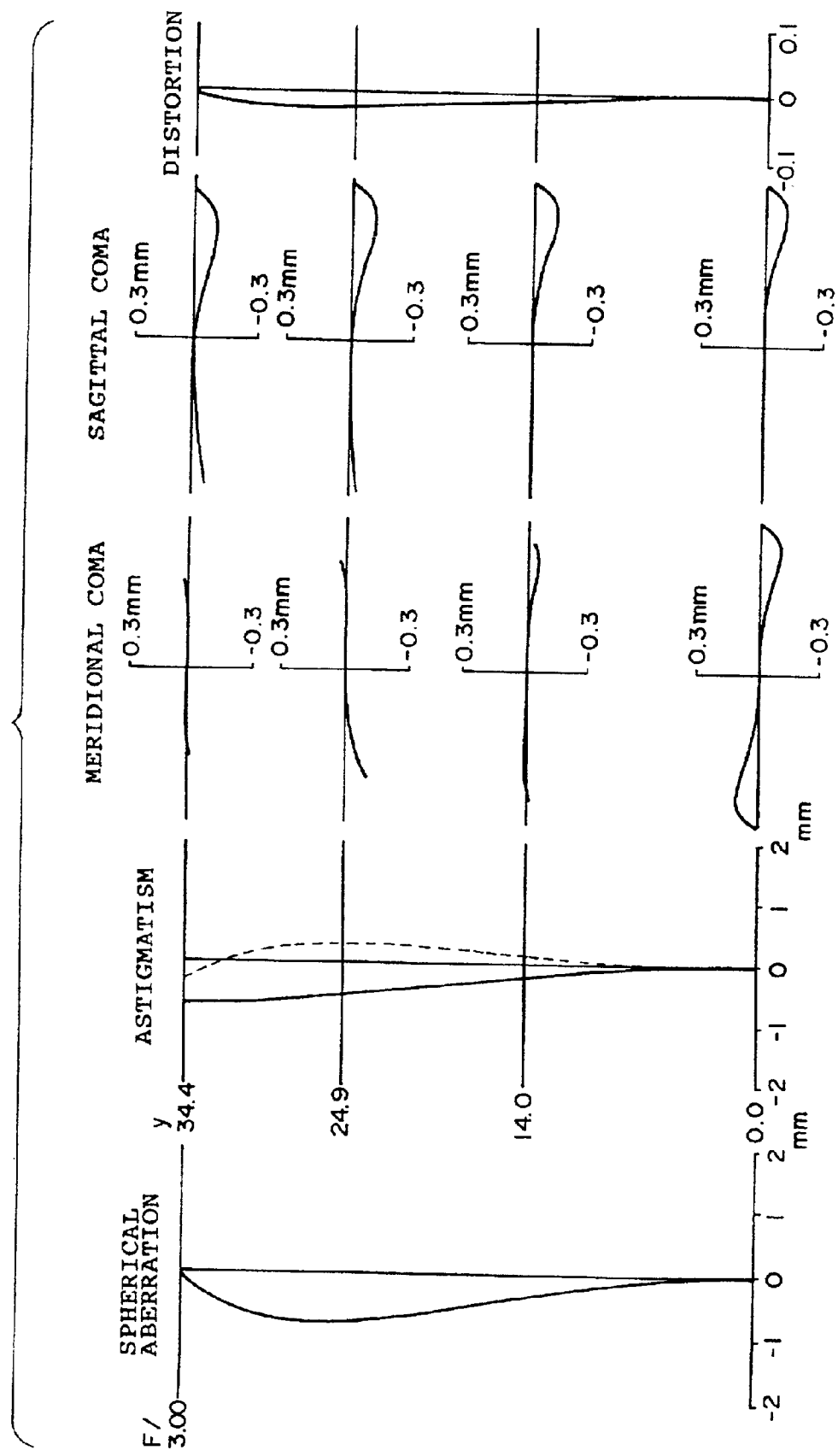
FIG. 32 is an aberration diagram of the lens system shown in FIG. 31.

The optimization of the lens system of three lenses was conducted as Experiment 1 of the first embodiment. The design specifications were as follows; the focal length f=100 mm, the brightness F=3.0, and the field angle 2w=38.0°. This experiment was started from the initial population consisting of random lenses L1 to L3 as shown in FIG. 29 and FIG. 30 and was ended in the stage after evaluation of four million lenses. In these FIG. 29 and FIG. 30, S represents a stop and I the image plane. A lens configuration and spot diagrams of the resultant optical system are shown in FIG. 31 and an aberration diagram thereof in FIG. 32. The spot diagrams are indicated in the range of ±0.5 mm.

Experiment 2

Figure 33:
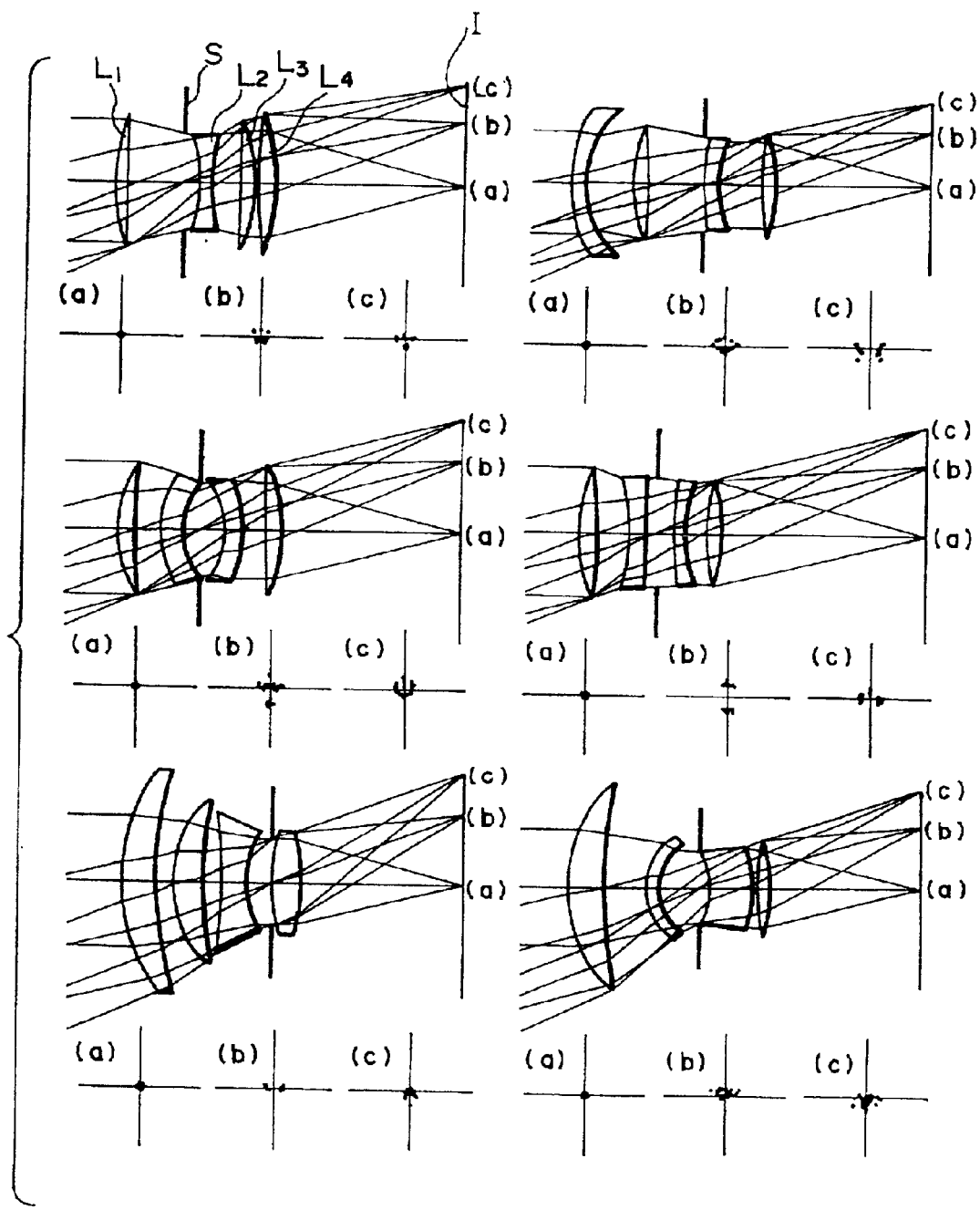
FIG. 33 is a drawing to show path diagrams and spot diagrams of lens systems (focal length 50 mm, brightness F 2.0, field angle 46°) obtained in Experiment 2 of the designing method of optical system (the first embodiment) according to the present invention.

The optimization of the lens system of four lenses was conducted as Experiment 2 of the first embodiment. The design specifications were set in the following three types; the standard lens specifications were f=50 mm, F=3.0, and 2w=46°; the telephoto lens specifications were f=135 mm, F=2.8, and 2w=18.2°; the wideangle lens specifications were f=20 mm, F=5.6, and 2w=92°. As in the case of the lens system of three lenses, the search was started from lenses L1 to L4 of random configuration and the search was ended after one million evaluations. Lens configurations and spot diagrams of resultant optical systems are shown in each of FIG. 33 to FIG. 35. FIG. 33 shows optical systems obtained in the case of the standard lens specifications, FIG. 34 optical systems obtained in the case of the telephoto lens specifications, and FIG. 35 optical systems obtained in the case of the wideangle lens specifications.

In Experiment 1 of the first embodiment, ten trials all resulted in obtaining the lens system having the lenses, i.e., a triplet in the configuration as shown in FIG. 31. The triplet considered to be empirically optimal was obtained by starting the search from the fairly random lens systems without relying on knowledge. It can be said from this result that the effectiveness of the global search of lens system by the GA was verified.

Figure 34:
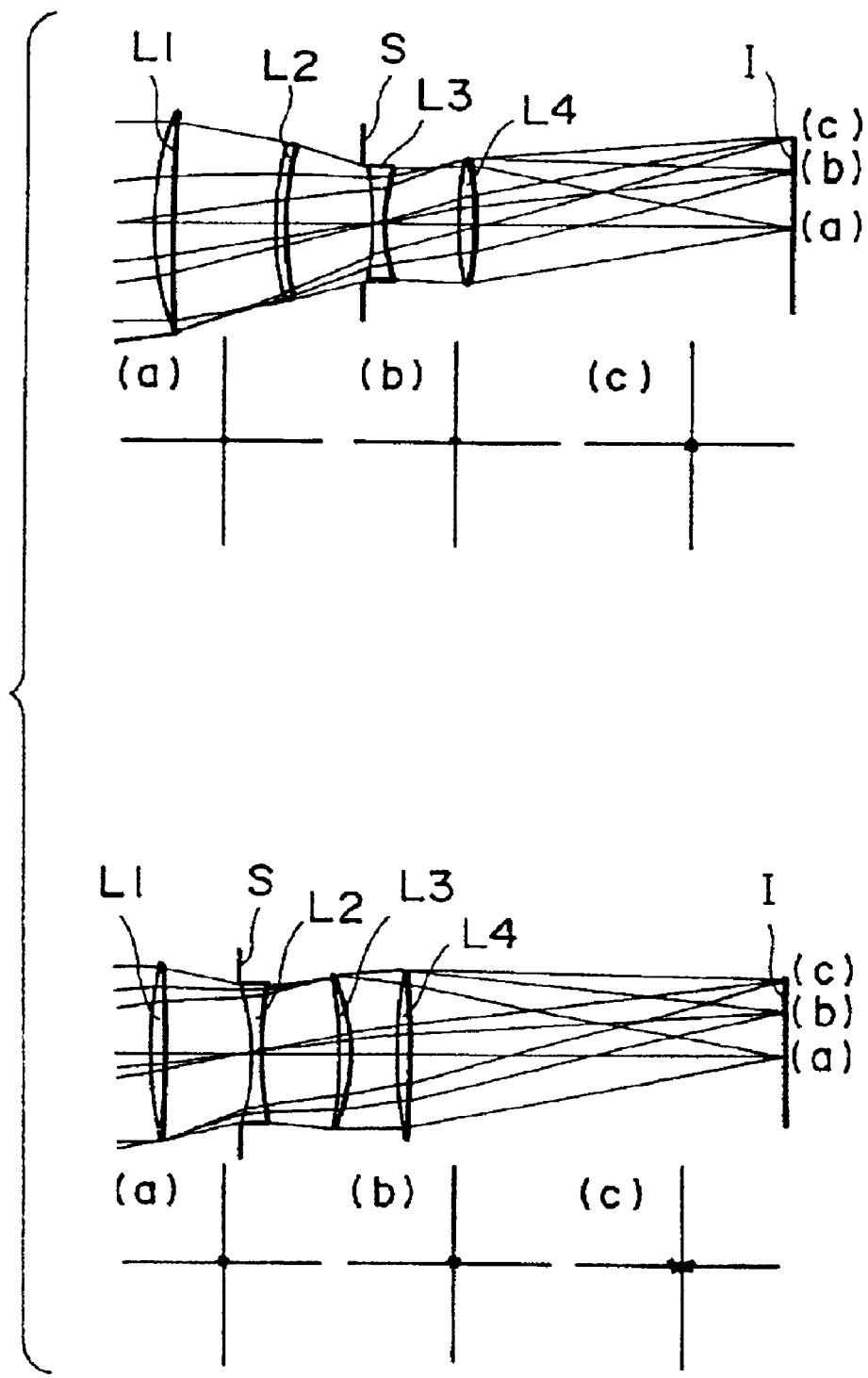
FIG. 34 is a drawing to show path diagrams and spot diagrams of lens systems (focal length 135 mm, brightness F 2.8, field angle 18.2°) obtained in Experiment 2 of the designing method of optical system (the first embodiment) according to the present invention.
Figure 35:
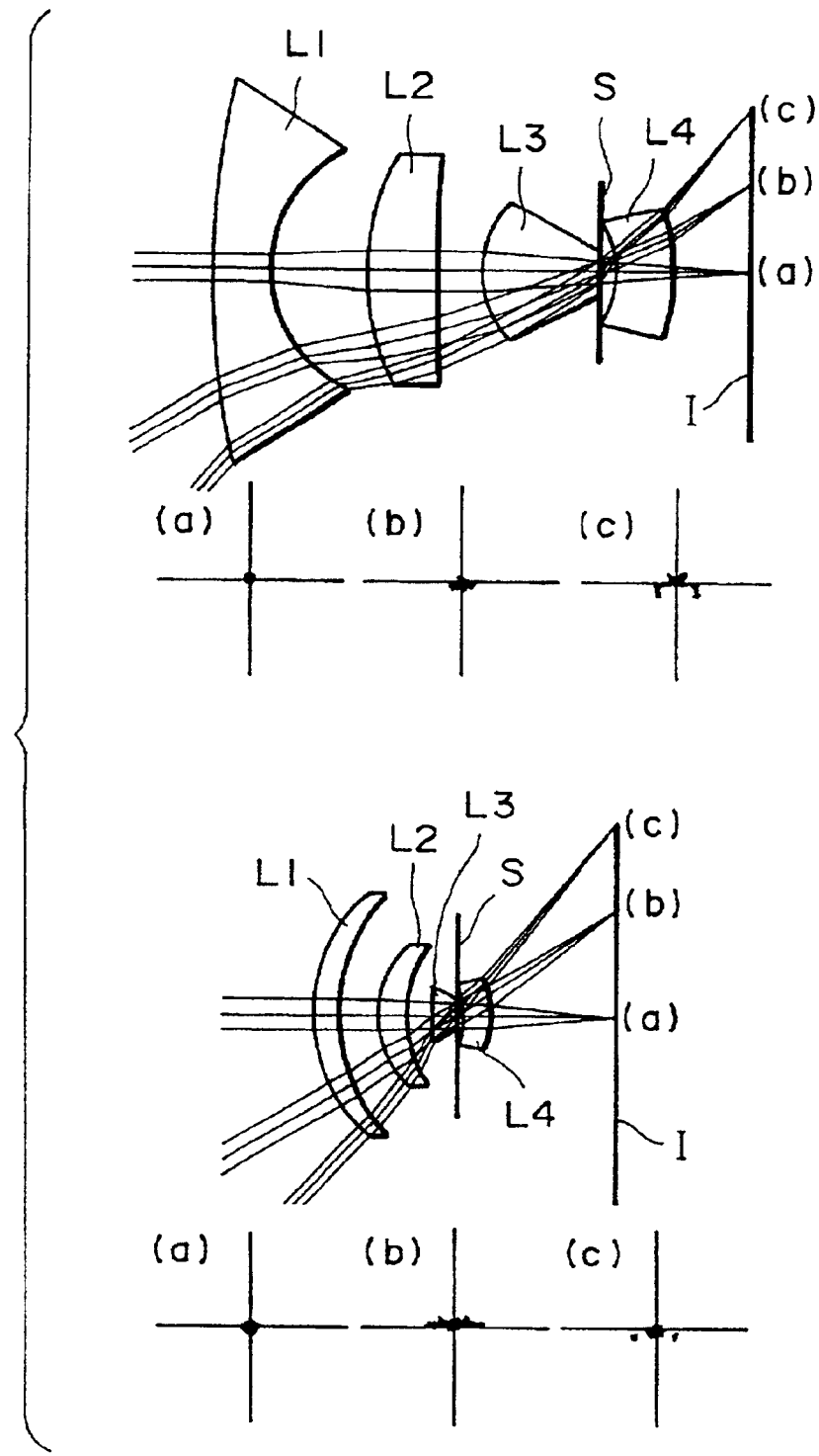
FIG. 35 is a drawing to show path diagrams and spot diagrams of lens systems (focal length 20 mm, brightness F 5.6, field angle 92°) obtained in Experiment 2 of the designing method of optical system (the first embodiment) according to the present invention.
Figure 36:
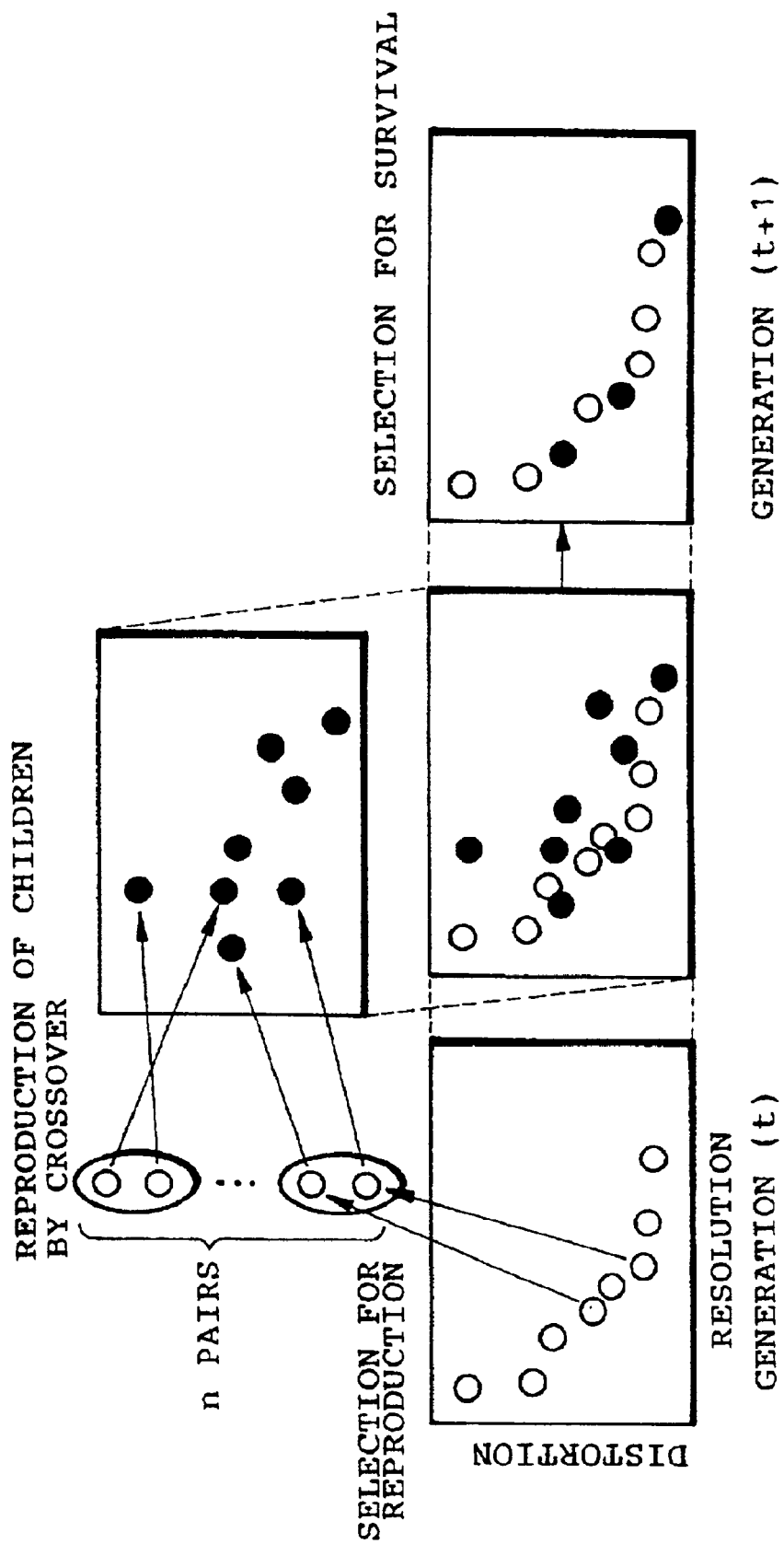
FIG. 36 is a drawing for explaining a generation alteration model in the designing method of optical system (the second embodiment) according to the present invention.

In Experiment 2 the lens systems were also achieved with relatively high performance under the respective design specifications. For either of the telephoto lens and wideangle lens, almost identical configurations were obtained in each trial (two patterns each), as shown in FIG. 34 and FIG. 35. For the standard lens, lenses of various configurations (six patterns) were obtained as shown in FIG. 33.

Second Embodiment by the Designing Method of Optical System

Next, the multi-objective optimization by the GA will be described as the second embodiment according to the present invention.

In this second embodiment two objectives of the distortion and resolution are set explicitly and effectiveness will be verified concerning the multi-objective optimization capability of the GA. In this second embodiment the generation alteration model is a model based on the non-Pareto solution selection strategy (Shigenobu Kobayashi, Koji Yoshida, and Masayuki Yamamura: Generation of Pareto optimal setting tree set by GA, Jinkochinou Gakkai Shi, vol. 11, No. 5, pp. 778–785 (1996)) (see FIG. 36).

A crossover is carried out with n pairs randomly selected from a population. Reproduced children are merged with the existing population and individuals not being Pareto solutions are weeded out, so that a population of the next generation is composed of only Pareto solutions. A Pareto solution is a solution superior in at least one evaluation criterion to the all other solutions. This operation allows the multi-objective optimization to be conducted explicitly without setting the tradeoff ratio between the resolution and distortion.

Figure 37:
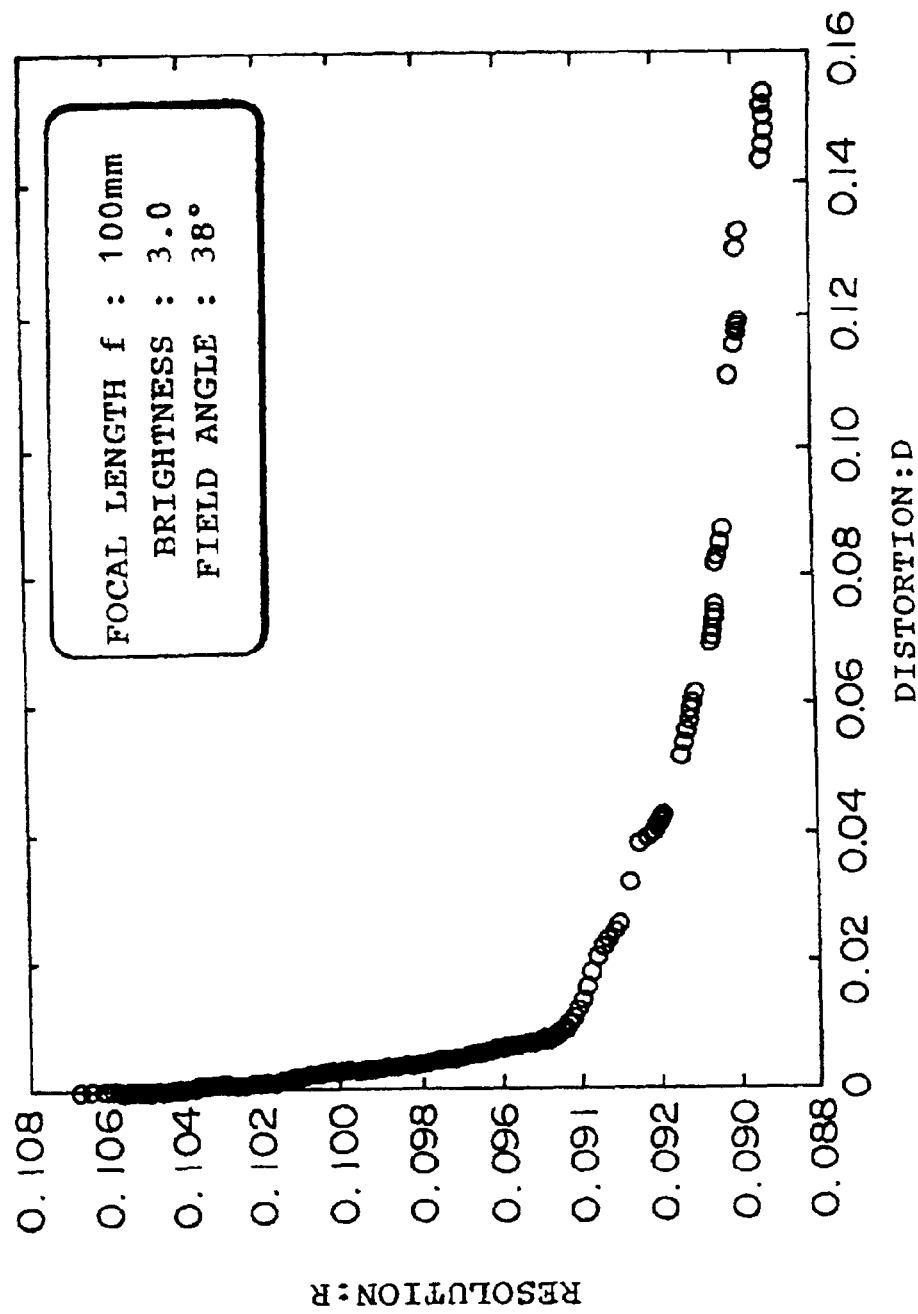
FIG. 37 is a drawing to show a Pareto solution set obtained by the designing method of optical system (the second embodiment) according to the present invention.

In this second embodiment the effectiveness of the multi-objective optimization by the GA will be verified by an experiment with an object of the lens system of three lenses. An initial population prepared includes five Pareto solutions obtained in the search by the single-objective GA, the number of crossovers n is 40, and the number of evaluations is 1,600,000 (the search is carried on up to the evaluation number of 1,600,000). The design specifications of the lens system are the same as in Experiment 1 of the first embodiment described above. FIG. 37 shows plots of the resultant Pareto solution set on the distortion-resolution plane. The number of resultant Pareto solutions is 750.

Also in this second embodiment, if the search is further carried on from the Pareto solution set shown in FIG. 37, the Pareto solution curve will be evolved toward the left bottom corner. However, the rate of evolution is already slow, and it is thus assumed that the curve is sufficiently close to a true Pareto optimal solution curve. It also became apparent that the resolution was improved up to a certain value with no penalty of distortion but a further improvement in the resolution over that value was hard even with a penalty of distortion. Configurations of resultant solutions all are triplets and it is thus considered that the triplets are optimal in the entire region under the design specifications.

Figure 38:
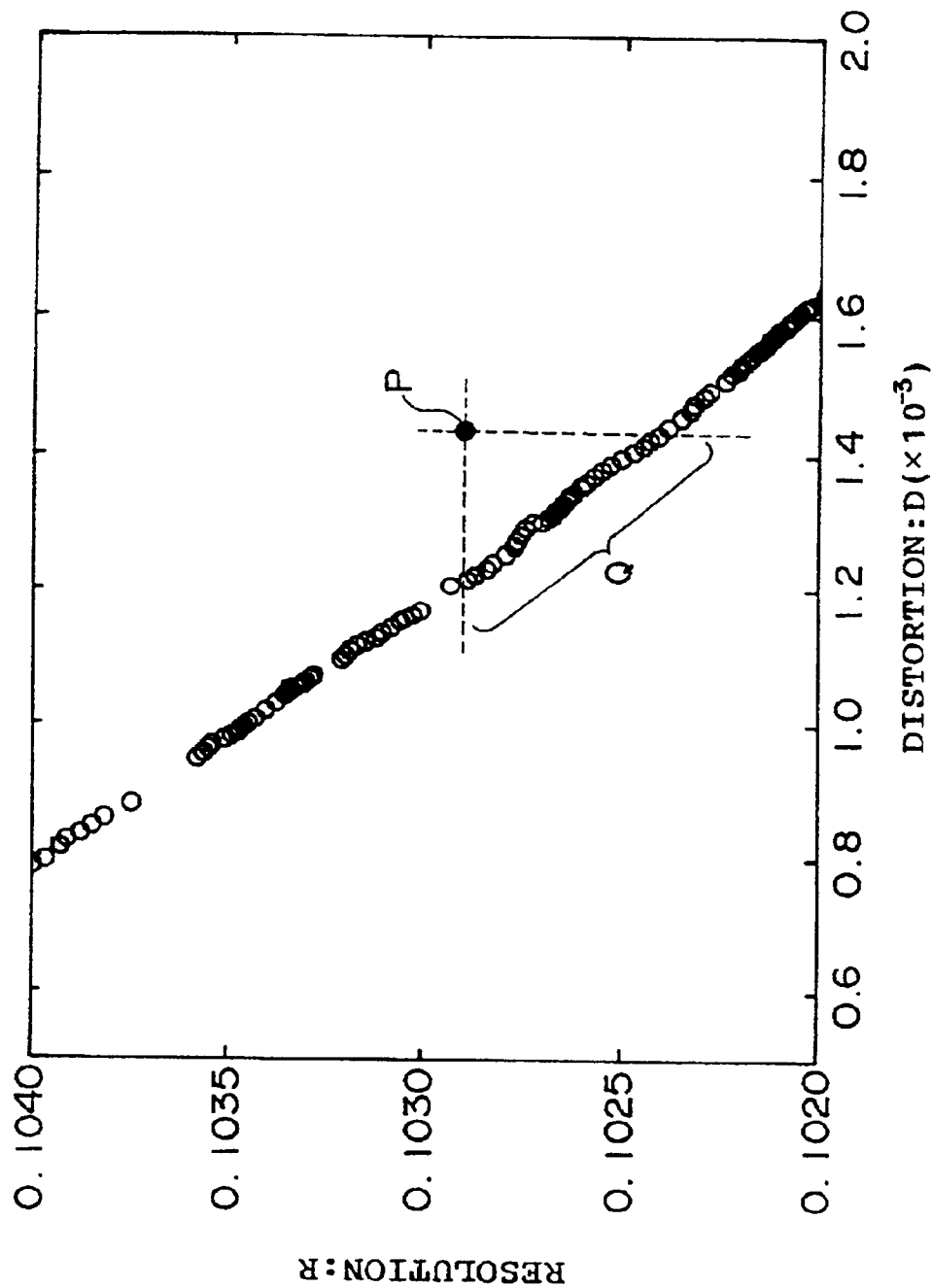
FIG. 38 is a drawing to show a state in which the optimal solution obtained in Experiment 1 of the designing method of optical system (the first embodiment) according to the present invention is plotted on FIG. 37.

FIG. 38 shows a state in which the best solution P (the lens system shown in FIG. 31) obtained in Experiment 1 of the first embodiment described above is plotted on the enlarged view of FIG 37. In the drawing letter Q indicates lens systems dominating the solution found by the single-objective optimization of the evaluation criteria. As also apparent from this FIG. 38, it is clearly seen that the second embodiment (multi-objective optimization) obtains many more excellent solutions that that obtained by the single-objective GA. This conceivably suggests that there is a possibility of making the problem harder if the multi-objective problem is forced to the single-objective problem.

It seems more natural that a plurality of lenses in the tradeoff relation are first obtained by a search and an appropriate lens is selected therefrom according to judgment of selection favored by the designer, rather than the way of converting the problem to the single-objective problem by linear combination of plural evaluation criteria and obtaining one lens by a search.

As described above, the embodiments of the designing method of optical system according to the present invention clarified the effectiveness thereof by the above experiments. Particularly, the multi-objective GA handling the evaluation criteria explicitly permits us to search lenses with different performances at a time.

Since the designing method of optical system according to the present invention employs the principle of successively selecting near-optimal solutions and finally outputting the optimal solution from the two features of the principle of the genetic algorithm, i.e., (1) or (1a), and (2) below, a near solution or the optimal solution can be generated efficiently according to the length of turnaround computation time.

(1) Simultaneous progress of local search and global search in a problem space by only the crossover operator (1a) Simultaneous progress of local search and global search in a problem space by the combination of the crossover operator with the mutation operator (2) Alteration of generation for defining a series of operations with genetic operators as one generation and repetitively effecting the series of operations on finite genes including the elitist gene of each generation.

A chromosome in the genetic algorithm is represented by a string having a length corresponding to the number of parameters (a variable string consisting of variables of genes), in which a gene at a position (locus) of occurrence of each parameter corresponds to each parameter featuring the lens system to be designed.

The crossover operator acts to make a gene of a child from genes of a pair of two parents in such a manner that, as to each parameter, the parameter of the gene of the child takes a value occurring at a predetermined probability in a partial space defined by parameters of the two parents.

When the mutation operator is also used in addition, a gene of a child individual is generated in such a manner that, as to each parameter, a parameter value is a value occurring according to a predetermined continuous occurrence probability distribution of occurrence probabilities increasing with approaching a parameter value of one parent arbitrarily selected.

Since candidates of solutions generated internally can be always evaluated directly, a solution not satisfying the constraint arbitrarily given is allowed to become extinct. Thus, the multi-objective evaluation can be done even in the case of plural objective functions corresponding to the evaluation criteria.

Further, during execution of the GA, the alteration of generation is made so that the elitist solution (or Pareto optimal solution) out of a plurality of genes (satisfying the arbitrary constraint) stored is always preserved and selection is made so that better solutions are more unlikely to become extinct and thus are left in the next generation, thus enabling multi-point simultaneous searches with high efficiency.

Third Embodiment by the Designing Method of Optical System

The third embodiment in the designing method of optical system according to the present invention will be described referring to FIG. 39 to FIG. 41. This third embodiment is an example for obtaining the optimal solution of a lens system for photography, which is a lens system of three lenses the refractive indices of which are known. Namely, the refractive indices of the three respective lenses are set by the user to be constraints.

Figures 39, 41:
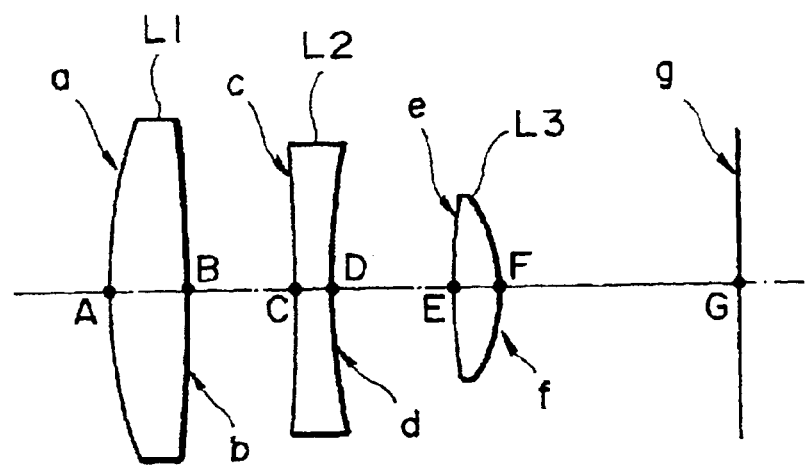
FIG. 39 is a drawing for specifically explaining parameters in the designing method of optical system (the third embodiment) according to the present invention.
FIG. 41 is a drawing to show an example (a real vector) of gene representation representing a plurality of continuous parameters for a lens optical system in the form of continuous values, where in the case of FIG. 39 the field angle, focal length, and refractive indices of glass materials for the respective lenses are preliminarily given and they are constraints.

FIG. 39 is a schematic diagram of the structure of the photographic lens system. In this figure g designates the image plane. The photographic lens system of this figure is an example of the three-lens configuration, in which there are six boundary surfaces of a to f having their respective curvatures, and six distances of d1 to d6 between the boundary surfaces (d1 between A and B, d2 between B and C, d3 between C and D, d4 between D and E, d5 between E and F, and d6 between F and G).

In the case of the photographic lens system of FIG. 39 the refractive indices of spaces between the lens boundary surfaces are preliminarily given, but if degrees of freedom are also given to the refractive indices of the spaces between the lens boundary surfaces the number of parameters will increase by the degrees. Since the field angle and overall focal length of the lens optical system are normally constraints given by the designer, once six (e.g., a–f) are determined out of a–g and five (e.g., d1–d5) out of d1–d6, the two remaining parameters (e.g., g and d6) are determined naturally. This third embodiment becomes a simultaneous optimization problem of ten parameters accordingly.

The distances between the boundary surfaces themselves are used for d1 to d6 (i.e., the necessary conditions are d1–d6>0 in order to avoid physical interference) and an inverse of a radius of curvature is used for indicating each curvature of a–g. The reason why the inverse numbers are used is that use of inverse allows us to handle the change in curvature as continuous change on the parameter space, thereby being ready for transition of surface configuration into the both convex and concave spaces with small change of a flat surface (having the radius of curvature of the infinity).

There are a variety of evaluation criteria for lens system and, corresponding thereto, a variety of performance functions can be defined. Famous criteria are five evaluation criteria represented by the Seidel's five aberrations, which can also be applied to this embodiment. For brevity of description, however, this embodiment shows an example using two conflicting evaluation criteria, using the ray tracing by spot diagrams.

Figure 40:
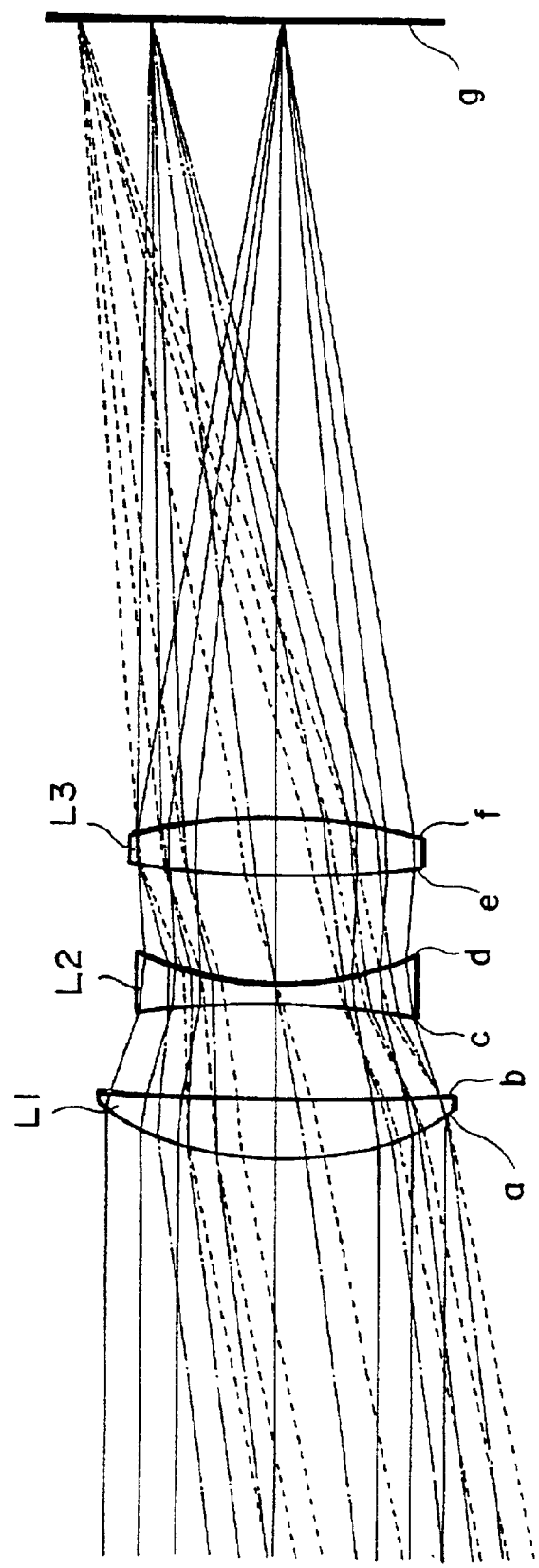
FIG. 40 is a drawing to show a converging state of various beams on the image plane, where the spot diagram is used, as an example for evaluating the photographic lens of FIG. 39.

FIG. 40 illustrates a photographic lens system generally called a triplet type. In the drawing the left side is the object side while the right side is the image side. When light is assumed to come from the infinity on the object side and to be represented by a parallel beam, this beam will be converged at one point on the image plane g. An image formed on the entire image plane can be evaluated by consideration on typical beams coming from the left of the same drawing, including a parallel beam parallel to the optic axis of the lens system (rays indicated by solid lines in the drawing), a parallel beam an angle of which to the optic axis is the maximum field angle in the specifications of the lens system (rays indicated by dashed lines in the drawing), and a parallel beam an angle of which to the optic axis is approximately a half of the maximum field angle in the specifications of the lens system (rays indicated by chain lines in the drawing).

For example, let us consider the degree of this convergence as an evaluation criterion and evaluate the degree of convergence by dispersion of image-plane arrival points of three rays, the paraxial ray of the above beams, a ray on the maximum outside diameter (normally, a diameter corresponding to the diameter of the entrance pupil) of the above beams, and rays on intermediate diameters (for example, diameters equal to approximately 70% and 80% of the maximum outside diameter) between the two rays, from the image-plane arrival position of the paraxial ray. This evaluation criterion approximately stands for the resolution of the image formed on the image plane, if the sagittal aberration, coma, and flare are ignored. When this dispersion is checked for the above three types of parallel beams, approximate evaluation can be made as to the resolution of the formed image.

For example, let us consider another evaluation criterion of measuring a deviation between a position where the principal ray actually reaches the image plane and a position where it should impinge theoretically, for each of the above three types of parallel beams. An evaluation value is obtained by overall evaluation of deviations from the theoretical values of the three principal rays obtained corresponding to the respective principal rays (for example, by measuring the standard deviation from the mean value of the deviations) and it approximately corresponds to the distortion of the formed image.

When the multi-objective optimization is carried out by using two different evaluation criteria and minimizing the both two objective functions corresponding to the two evaluation criteria (resolution and distortion) as described above, it will result in obtaining many multi-objective optimal solutions (Pareto optimal solutions), including solutions in which one of values of the two objective functions is very small while the other is large, and solutions in which the both are moderately small.

In the embodiment of the designing method of optical system according to the present invention, the genetic operator in the genetic algorithm being one of the evolutionary computation methods is the crossover operator for directly operating continuous values, or the combination of the crossover operator for directly operating continuous values with the mutation operator for directly handling continuous values.

FIG. 41 illustrates a gene representation of ten parameters of continuous values featuring the lens system in the three-lens configuration shown in FIG. 39. In each of a–e and d1–d5 in the same drawing a parameter of the corresponding lens system is stored in the form of continuous value. Among such genes, n (n>1) genes satisfying the minimum constraints are reproduced arbitrarily.

Then the crossover operator for directly handling continuous values is applied to a pair of two genes selected properly. With the crossover operator, an occurrence probability distribution of new-born genes is set on a space of a parameter (a) from corresponding parameters in two genes (for example, let av1 be a value of the parameter a of one gene and av2 be a value of the parameter a of the other gene).

This occurrence probability distribution normally has a configuration in which occurrence probabilities become higher with getting near av1 and av2. Then selected from the partial space defined by this occurrence probability distribution are two values of the parameter a (for example, av3 and av4) that occur according to the occurrence probabilities and that a new-born gene should have. This operation is effected on the all parameters (the ten parameters in the example of FIG. 41).

This third embodiment can also employ a method for handling the individual parameters independently of each other or a method for simultaneously selecting some parameters or the all parameters in consideration of correlation between parameters as in the NDX. In this way a pair of two genes are sampled with replacement Pc×n times according to a preset crossover rate Pc from a population of n genes so as to be modified so that a gene of better evaluation result is more likely to be selected. The crossover operator is again applied to the sampled gene population.

This operation increases the number of genes in the gene group from n to n×(1+2Pc). In the case of a single performance function (i.e., in the case of a single evaluation criterion or in the case of a plurality of evaluation criteria being combined so as to be expressed by one performance function), a gene of the best evaluation value is always left and sampling without replacement is carried on so that genes of better evaluation values are more likely to be selected and left, before the number of genes in the gene group reaches n. The other 2×n×Pc genes are eliminated. A population of n new genes is reproduced in this way. The population of genes reproduced in this way is called the first generation of genetic algorithm. Repetition of such generation alteration will find the optimal solution sooner or later if a sufficient computation time is permitted. Unless a sufficient computation time is given, a solution with good quality consistent with the computation time can be generated efficiently.

When the multi-objective optimization is carried out with plural performance functions, only multi-objective optimal genes are left out of the population of the all (n×(1+2Pc)) genes after generation of new-born genes (or the multi-objective optimal genes are always left while genes being not multi-objective optimal and numbering k (k>1) times the number of the multi-objective optimal genes are also left), and the other genes are allowed to become extinct, thus forming a gene population of a new generation. In this case, however, care is needed, because the number of genes n in the gene population varies generation from generation.

As the genetic operator for directly handling continuous values, the mutation operator for directly handling continuous values can also be used, as well as the crossover operator for directly handling continuous values. In this case, genes are randomly sampled with replacement Pm×n×(1+2Pc) times according to the mutation rate Pm preliminarily set, from the population of (n×(1+2Pc)) genes after the application of the crossover operator. Then new-born genes being mutants are reproduced so that an arbitrary (one or more) parameter of the genes is altered arbitrarily (or in a probability distribution biased to the neighborhood of its original value). Immediately after the application of the mutation operator, the number of genes in the gene group is n×(1+Pm)×(1+2Pc). Then genes to be left in the next generation are selected out of this gene population in the same manner as above, thus generating the gene population of the next generation.

The above embodiments were described using the typical parameters represented by the radii of curvatures of the boundary surfaces and the distances between the boundary surfaces, but it is needless to mention that the optimal solution can be gained with additional parameters of continuous values related to the lens designing, such as the refractive indices of the three respective lenses and the pressure between the lenses.

As described above, the designing method of optical system according to the present invention employs the principle of successively selecting near-optimal solutions and finally presenting the optimal solution from the two features of the principle of the genetic algorithm, and, therefore, a near solution or the optimal solution can be reproduced efficiently according to the length of turnaround computation time.

Fourth Embodiment by the Designing Method of Optical System

Figure 42:
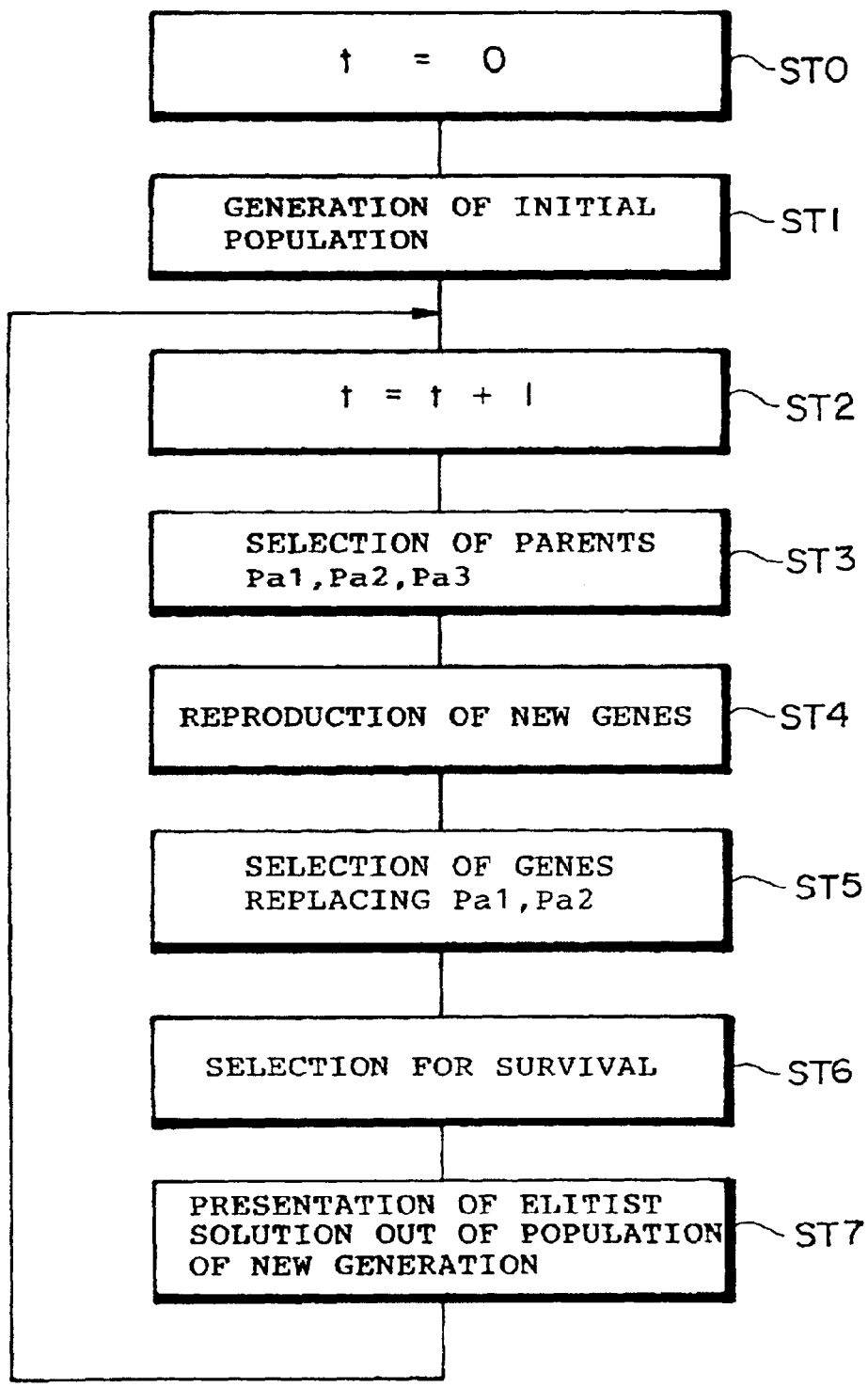
FIG. 42 is a flowchart for explaining the designing method of optical system (the fourth embodiment of the designing method of optical system according to the present invention)

The fourth embodiment in the designing method of optical system according to the present invention will be described referring to FIG. 42 and FIG. 43.

In this fourth embodiment FIG. 39 explained previously will be used as a figure for defining parameters. FIG. 42 is a drawing to show the flowchart for explaining procedures of the designing method of optical system according to the fourth embodiment and FIG. 43 is a drawing to schematically show the operations in the fourth embodiment.

The individual of the optical system shown in FIG. 39 has the parameters including the curvatures a–f of the lens surfaces (boundary surfaces) of the respective lenses L1–L3, the surface-to-surface distances (distances between the boundary surfaces) AB=d1, BC=d2, CD=d3, DE=d4, EF=d5, FG=d6, the refractive indices of media between the lens surfaces nab=n1, nbc=n2, ncd=n3, nde=n4, nef=n5, nfg=n6, and Abbe's numbers vab=v1, vbc=v2, vcd=v3, vde=v4, vef=v5, vfg=v6.

A chromosome of this optical system is represented by a string of genes of -a-b-c-d-e-f-d1-d2-d3-d4-d5-d6-n1-n2-n3-n4-n5-n6-v1-v2-v3-v4-v5-v6-.

In this example the curvatures a–f of the respective lens surfaces are continuous values and the surface-to-surface distances d1–d6 are also continuous values. In the above chromosome of the fourth embodiment values (alleles) of the genes corresponding to the curvatures and surface distances are continuous values.

Next, the operation of the fourth embodiment will be described referring to FIG. 42 and FIG. 43.

Here is described an example in which, for handling the curvatures a–f of the respective lens surfaces and the surface-to-surface distances d1–d6 in common dimensions, each parameter is first normalized in the range of −2.048 to 2.048. This makes influence on each ray continuously equivalent. For example, let us consider a lens system characterized by the following parameters.

|      | Curvature | Lens distance | Refractive index |
|------|-----------|---------------|------------------|
| (L1) | 0.0100    | 8             | 1.5              |
| (L2) | −0.0083   | 5             | 1.8              |
| (L3) | −0.0077   |               |                  |

When in the above lens system the curvature of the lens surface (the final surface) located closest to the image plane is changed (bent) in order to obtain a desired focal length, the above lens system is represented in the form of a vector of at most four dimensions or less. When the final surface is not bent, the above lens system is represented in the form of a vector of at most five dimensions or less.

When the above lens system is expressed in the form of a five-dimensional vector without normalization (note that the refractive indices are fixed values), the vector is (0.0100, −0.0083, −0.0077, 8, 5). For normalizing each parameter (each vector component), the maximum and minimum need to be set as to at least the curvatures and lens distances (glass, air).

This setting of maximum and minimum is done by the user (designer). For example, the curvatures are set in the range of −0.5 to +0.5, the surface distances with glass in between as a medium (corresponding to the thicknesses of lenses) are set in the range of 0.1 to 50, and the surface distances with air in between as a medium (the aerial distances between the lenses) are set in the range of 0.1 to 100. In this case, a normalized value of each parameter is defined as follows.

(normalized value)=4.096×(value of parameter)/(maximum of parameter−minimum of parameter)

Accordingly, the normalized vector is given as (0.04096, −0.0339968, −0.0315392, 0.6567, 0.41042).

In this fourth embodiment 0 is first set as an initial value into the parameter t indicating the generation (step ST0).

Then a plurality of lens data for the components of the above parameters a–f, d1–d6, n1–n6, and v1–v6 are reproduced to form an initial population (step ST1). In this step random numbers are used for generation of plural parameters to form the initial population. On this occasion each parameter made of a random number is normalized as described above. If an optical system characterized by these parameters (a candidate of an optical system to be designed) satisfies predetermined constraints and if all rays incident into this optical system can reach the image plane, the parameters for this optical system are used as an initial population. The above constraints are preferably, for example, conditions for eliminating optical systems that cannot exist physically (for example, optical systems having a negative surface-to-surface distance) (for efficient search). Such constraints can be set by the designer himself or herself on the occasion of setting the maximums and minimums of the curvatures and the other parameters.

Since in this fourth embodiment the field angle and overall focal length of the optical system are the constraints given by the designer, values satisfying the above constraints, obtained by tracing of paraxial rays in the optical system, are used for the curvature f of the lens surface closest to the image plane in the optical system and the distance d6 from the lens surface closest to the image plane thereto. In this fourth embodiment the refractive indices of the respective lenses L1 to L3 are given preliminarily and the medium between the lenses L1–L3 is the air. Thus, the chromosome of the optical system in this embodiment is given as -a-b-c-d-e-d1-d2-d3-d4-d5-.

In this case, the above initial population includes a plurality of individuals having different chromosomes.

Figure 43:
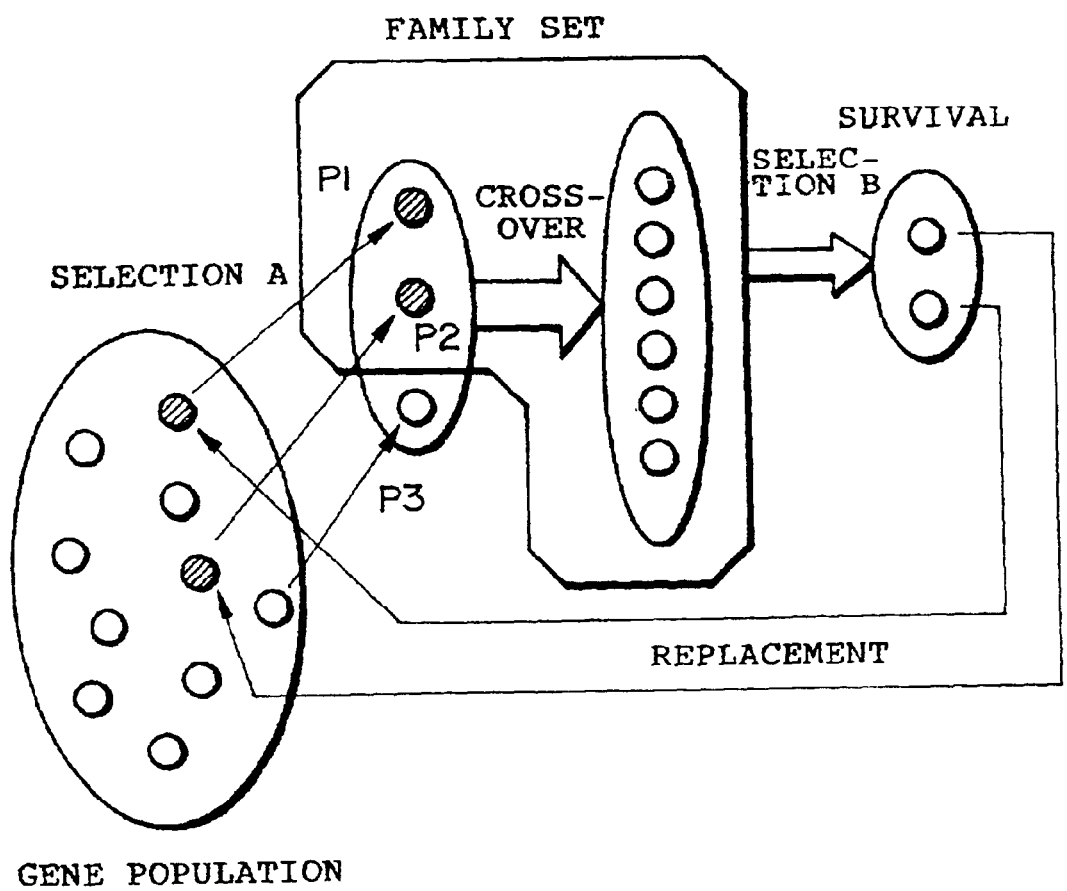
FIG. 43 is a drawing to schematically show operations in the designing method of optical system (the fourth embodiment) according to the present invention.

Subsequently, 1 is added to the generation parameter t (step ST2), and thereafter, as shown in FIG. 43, a set of three parents Pa1, Pa2, Pa3 are selected from the above initial population (step ST3). If t>2, a set of three parents Pa1, Pa2, Pa3, are not selected from the initial population, but from a population of the generation (t−1) one before the current generation (t).

In step ST4 new genes are reproduced from the parents Pa1, Pa2, Pa3 selected in above step 3. Namely, the crossover is effected. The crossover operator in this fourth embodiment is the UNDX (Uni-modal Normal Distribution Crossover) out of the genetic operators for directly handling continuous values. Therefore, in the following description, the operation in step ST4 with application of UNDX will be described referring to FIG. 44.

Figure 44:
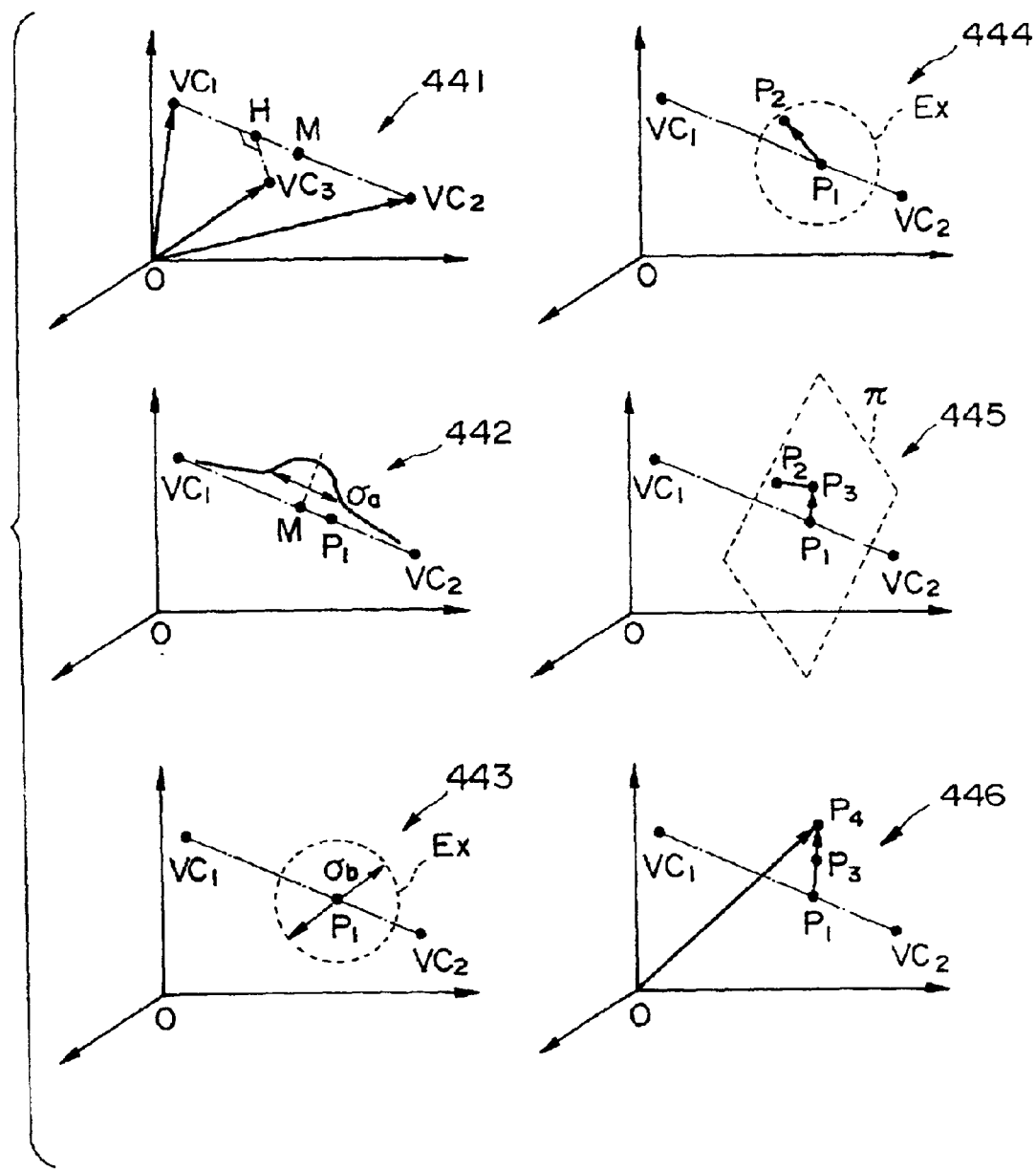
FIG. 44 is a drawing for explaining the crossover operator where the UNDX is applied.

First, considering a space of n dimensions corresponding to the number of genes that the chromosomes of individuals have, each individual is expressed by a vector of the n dimensions. In this fourth embodiment, since a chromosome is composed of the ten genes -a-b-c-d-e-d1-d2-d3-d4-d5- as described above, n=10 and each individual is expressed by a vector of the ten dimensions (a, b, c, d, e, d1, d2, d3, d4, d5). In FIG. 44 each individual is represented as a three-dimensional vector for illustration's sake.

Substep ST4-1

First, as shown by 441 in FIG. 44, substep ST4-1 is carried out to set points VC1, VC2, VC3 on the space, corresponding to the parents Pa1, Pa2, Pa3 selected in step ST3. Here, let M be a middle point between the point VC1 and the point VC2 and H be the length of a perpendicular from the point VC3 to a line segment VC1-VC2.

Substep ST4-2

Next, as shown by 442 in FIG. 44, substep ST4-2 is carried out to reproduce normal random deviates with the middle point as an expectation and σa as a standard deviation. According to the normal random deviates, a point P1 is reproduced on the segment VC1–VC2 (the point P1 is generated on the segment VC1–VC2 in a probability according to such a normal distribution that the middle point M is at the vertex).

Substep ST4-3

Further, as shown by 443 in FIG. 44, substep ST4-3 is carried out to generate a probability space Ex of an n-dimensional normal distribution according to n normal random deviates with the point P1 as an expectation and σb as a standard deviation. In this embodiment the probability space is the one of ten-dimensional normal distribution.

Substep ST4-4

As shown by 444 in FIG. 44, this substep ST4-4 is carried out to reproduce a point P2 according to the n-dimensional normal random deviates having the probability space Ex of the n-dimensional normal distribution reproduced in above substep ST4-3. Namely, the point P2 is reproduced in the probability according to the n-dimensional normal distribution.

Substep ST4-5

As shown by 445 in FIG. 44, this substep ST4-5 is carried out to set a hyperplane π perpendicular to the vector VC1–VC2, including the point P1. The hyperplane π is a plane of the (n−1) dimensions obtained by subtracting 1 from the number of dimensions of the space. In this embodiment the hyperplane is of nine dimensions. A point P3 is defined at a point where a perpendicular from the point P2 to the hyperplane π falls.

Substep ST4-6

As shown by 446 in FIG. 44, this substep ST4-6 is carried out to generate a point P4 capable of constituting a vector P1–P4 having a component parallel to a vector P1–P3 starting from the point P1 and having a length according to normal random deviates with the point P1 as an expectation and σc as a standard deviation. Here, σc is proportional to the n-th power root of a distance H-VC3 between the point H and the point VC3 in step ST4-1.

The n-dimensional coordinates of the point P4 reproduced by above steps ST4-1 to ST4-6 correspond to the n parameters a, b, c, d, e, d1, d2, d3, d4, d5 of a chromosome of a new-born gene or a child. In this step ST4 of the fourth embodiment the substeps ST4-1 to ST4-6 described above are repeated m times, whereby m new genes are reproduced from the three parents Pa1, Pa2, Pa3.

After completion of above step ST4, evaluation values are calculated for the set (family set) of the m new-born genes reproduced in this step ST4 and the two parents Pa1, Pa2. In this fourth embodiment the evaluation values (fitness values) are expressed by a single evaluation criterion or by one performance function φ consisting of a set of plural evaluation criteria. For example, when there are k evaluation criteria abe(1), abe(2), . . . , abe(k), they can be linearly combined with weights on the respective evaluation criteria abe(1), abe(2), . . . , abe(k). Namely, the performance function φ is given as φ=W1*abe(1)+W2*abe(2)+ . . . +Wk*abe(k). Then an individual with the best evaluation value and an individual selected by roulette selection are selected from the above family set (step ST5).

The roulette selection is a technique for selecting an individual in a predetermined probability in proportion to a fitness value (evaluation value) of each individual or in proportion to the ranking of the fitness value. For example, let us consider an example of four individuals A, B, C, D. In the former fitness value proportion method, supposing the fitness value of individual A is 40, that of individual B 60, that of individual C 100, and that of individual D 200, the probability of selection of individual A is 10%, that of individual B 15%, that of individual C 25%, and that of individual D 50% (A:B:C:D=10:15:25:50). In the latter fitness value ranking proportion method, the probability of selection of individual A is 10%, that of individual B 20%, that of individual C 30%, and that of individual D 40% (A:B:C:D=1:2:3:4). The fourth embodiment employs the latter fitness value ranking proportion method (ranking method), but it should be noted that the invention is not limited to this method.

Further, in step S6 the individuals except for the two individuals selected in above step S5 are allowed to become extinct (selection). Then the selected individuals replace the parents Pa1, Pa2 in the initial population. This replacement of the parents in the population by the selected individuals is called the alteration of generation.

Subsequently in step ST7, an individual having the best evaluation value is outputted out of the individuals in the population after the alteration of generation (presentation of the best solution) and the operation of step ST2 is repeated.

Here, above steps ST2 to ST7 are called the first generation of the genetic algorithm. In the second generation and after, three parents Pa1, Pa2, Pa3 are selected from the population after the alteration of generation.

Repetitive operations of such alteration of generation will automatically reproduce an optical system as a globally optimal solution independent of the initial solution given.

The fourth embodiment described above uses only the crossover operator, but the mutation operator may also be used in addition to this crossover operator.

An example of application of the mutation operator in addition to the crossover operator will be described. In this fourth embodiment above steps ST5 and ST6 select genes to be left in the next generation from the set (family set) of the m new-born genes and the two parents Pa1, Pa2.

In the case of the mutation operator being applied, new chromosomes are sampled at random Pm×(m+2) times according to the preset mutation rate Pm out of the set (family set) of the m new-born genes and two parents Pa1, Pa2. Then new genes of mutants are reproduced by changing an arbitrary (one or more) chromosome out of the genes in the sampled chromosomes on an arbitrary basis (or according to a probability distribution biased to the neighborhood of its original value). After that, genes to be left in the next generation are selected from the set of the m new-born genes, the new-born genes reproduced as mutants, and the two parents Pa1, Pa2. Namely, the two parents Pa1, Pa2 in the population are replaced by an individual of the best evaluation value and an individual selected by roulette selection from this set.

In this fourth embodiment it is also possible to apply only the mutation operator without application of the crossover operator. In this case, instead of above steps ST3 to ST6, new chromosomes are sampled at random by the number of times according to the mutation rate Pm out of the population consisting of the chromosomes corresponding to the plural lens data. Then mutants are generated by changing an arbitrary (one or more) gene of the sampled chromosomes according to a probability distribution biased to the vicinity of its original value. Then chromosomes to be left in the next generation are selected from this set of mutants.

Next described is an example of the multi-objective optimization in the fourth embodiment. In steps ST5 and ST6 of the fourth embodiment, one performance function φ is used at the time of selection of the individual of the best evaluation value and selection of the individual by roulette selection from the set (family set) of the m new-born genes and two parents Pa1, Pa2, as described above. These two individuals selected then replace the two parents Pa1, Pa2 in the population. This means that even cases of presence of plural evaluation criteria are handled in the form of a single performance function by linearly combining these evaluation criteria.

In the case of the multi-objective optimization, steps ST110 and ST150–ST170 below are executed in place of above steps ST1 and ST5–ST7.

Figure 45:
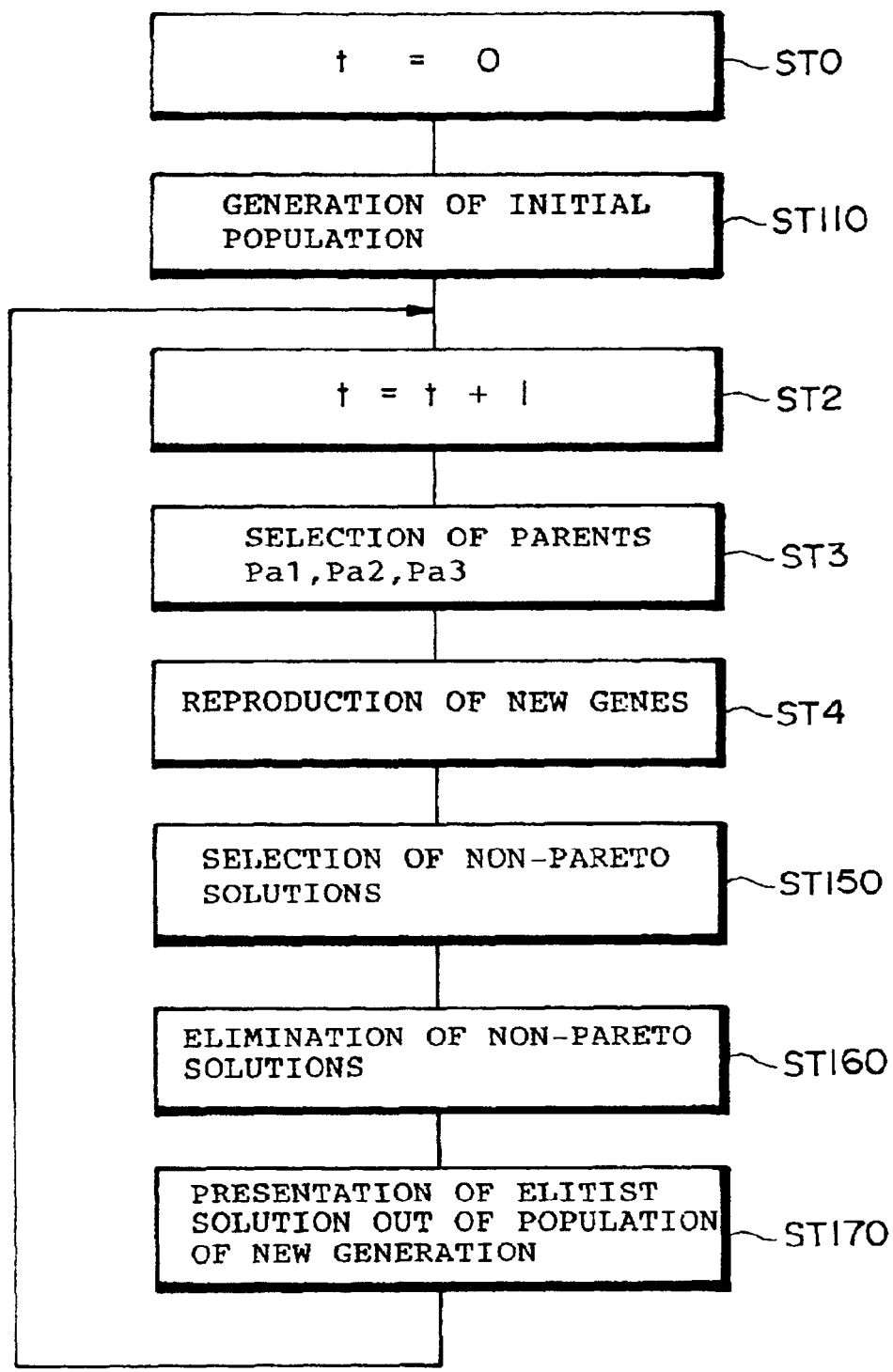
FIG. 45 is a flowchart for explaining the operation where the multi-objective optimization is effected in the designing method of optical system of the fourth embodiment according to the present invention.
Figure 46:
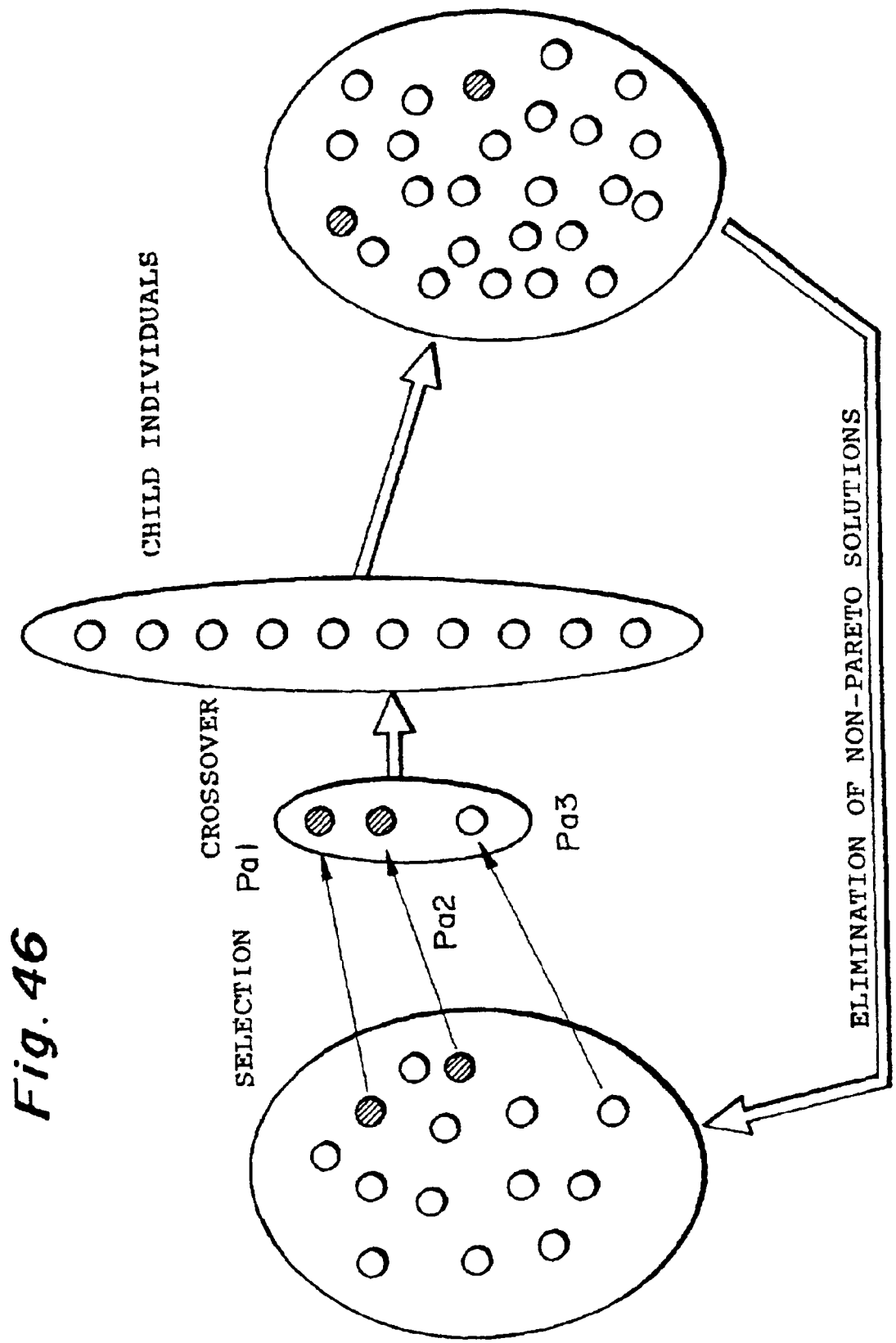
FIG. 46 is a drawing to schematically show operations where the multi-objective optimization is effected in the designing method of optical system of the fourth embodiment according to the present invention.

The operation of the multi-objective optimization will be described using the flowchart shown in FIG. 45 and the schematic diagram of operations shown in FIG. 46.

Step ST110 is different from above step ST1 in that evaluation values of plural performance functions φ1–φk are calculated according to a plurality of (k) evaluation criteria of plural individuals (lens data) in the initial population.

Next, step ST150 is a step of calculating each of evaluation values of plural performance functions φ1–φk for each individual in the set (family set) of the m new-born genes reproduced in above step ST4 and the two parents Pa1, Pa2. Then individuals not being Pareto optimal (non-Pareto solutions) are selected from these evaluation values. Here, a Pareto optimal solution means, under presence of plural evaluation criteria, a solution superior in at least one evaluation criterion out of the plural evaluation criteria to the other solutions.

Subsequently, step ST160 is carried out to weed out individuals not being Pareto optimal. This step eliminates individuals inferior to the other individuals in the all evaluation functions among the evaluation values of the plural performance functions φ1–φk. The Pareto optimal individuals left herein compose a population of the next generation and in the next generation parents for the crossover operator are selected from this population.

After completion of step ST160, step ST170 is carried out to output the Pareto optimal individuals obtained in above step ST160, and then the steps are repeated in order from step ST2.

After that, steps ST2–ST4 and steps S150–S160 are repeated in the same manner, thereby effecting the multi-objective optimization of individuals in the population.

Also in the case of the multi-objective optimization as described, the mutation parameter described above can also be applied in addition to the crossover operator. Further, the mutation parameter can also be applied instead of the crossover operator.

The execution of the above steps (steps ST110, ST2–ST4, and ST150–ST170) permits the multi-objective optimization to be effected even with presence of plural evaluation criteria for optical system and without placing the tradeoff ratio (weights) on these evaluation criteria. This results in always preserving the elitist individual out of plural chromosomes in the population and selecting better individuals to be left in the next generation according to such predetermined probabilities that better individuals are more unlikely to be weeded out, thus enabling the multi-point simultaneous search with efficiency.

In the Pareto optimization described above, the number of individuals in the population differs depending upon the generation. The Pareto optimization described above has such an advantage that the population size does not become too large, because non-Pareto solutions are weeded out in order.

The fourth embodiment described above employed the UNDX as a crossover operator, but, instead thereof, BLX-α or NDX can also be applied.

It can also be contemplated that, for example, some of plural evaluation criteria are linearly combined to form plural performance functions and these performance functions are subjected to the multi-objective optimization.

Described below are application examples where the designing method of optical system according to the fourth embodiment is applied to an optical system consisting of fifteen lenses.

Application 1

Application 1 of the fourth embodiment is to design a projection optical system for transferring a circuit pattern on a mask onto a wafer at a demagnification ratio.

In this Application 1, the evaluation criteria of the optical system are those (1) to (16) listed below and the performance functions are those obtained by linearly combining some evaluation criteria.

(1) Spherical aberration at the maximum numerical aperture (2) Spherical aberration at 75% of the maximum numerical aperture (3) Sagittal image surface at the maximum object height (4) Meridional coma of upper rays at the maximum object height and at 70% of the maximum numerical aperture (5) Meridional coma of lower rays at the maximum object height and at 70% of the maximum numerical aperture (6) Meridional coma of upper rays at the maximum object height and at 50% of the maximum numerical aperture (7) Meridional coma of lower rays at the maximum object height and at 50% of the maximum numerical aperture (8) Meridional coma of upper rays at 75% of the maximum object height and at 70% of the maximum numerical aperture (9) Meridional coma of lower rays at 75% of the maximum object height and at 70% of the maximum numerical aperture

(10) Meridional coma of upper rays at 75% of the maximum object height and at 50% of the maximum numerical aperture

(11) Meridional coma of lower rays at 75% of the maximum object height and at 50% of the maximum numerical aperture

(12) Meridional coma of upper rays at 50% of the maximum object height and at 70% of the maximum numerical aperture

(13) Meridional coma of lower rays at 50% of the maximum object height and at 70% of the maximum numerical aperture

(14) Meridional coma of upper rays at 50% of the maximum object height and at 50% of the maximum numerical aperture

(15) Meridional coma of lower rays at 50% of the maximum object height and at 50% of the maximum numerical aperture

(16) Distortion at the maximum object height

In this Application 1 constraints (restraint conditions) of (17) to (19) listed below are given.

(17) A distance from the lens surface closest to the reticle thereto, WD>25

(18) Magnification of the overall system, β=−3.0 (in the ray tracing from the wafer side to the reticle side)

(19) Distances between the lens surfaces, d<25

In this Application 1, parameters to be altered in designing of the optical system are the curvatures of the respective lens surfaces and surface distances. The refractive index n of glass materials of the lens elements is preliminarily given as n=1.56384.

Under the above preconditions, the parameters in the designing method of optical system according to the fourth embodiment are set as listed below.

Size of initial population: 50
Number of Crossovers: 300,000
Number of children generated by crossover operator: 20
σa of UNDX: 0.5×VC1VC2
σb of UNDX: 1
σc of UNDX: $0.35 \times (VC1VC2)^{1/n}$ The projection optical system represented by Table 1 below was generated by above Application 1. In Table 1, β is the magnification from the reduced side (the wafer side) to the enlarged side (the reticle side), L the conjugate length (object-image distance), NA the reduced-side numerical aperture, and WD the distance from the lens surface closest to the reticle thereto. In Table 1 below, numerals in the left end column represent surface numbers from the wafer surface, r radii of curvature, d surface distances, and n indices of refraction.

TABLE 1

β = −3.0
L = 380.52758
NA = 0.30
WD = 24.96409

| | r | d | n |
|---|---|---|---|
| 0 | ∞ | 12.49751 | 1.000000 |
| | | | (conjugate plane on wafer side) |
| 1 | −120.85562 | 18.23479 | 1.563840 |
| 2 | −70.82037 | 12.67890 | 1.000000 |
| 3 | −92.19251 | 7.16914 | 1.563840 |
| 4 | −59.21449 | 17.55595 | 1.000000 |
| 5 | −2708.99510 | 18.44782 | 1.563840 |
| 6 | −132.78761 | 6.51286 | 1.000000 |
| 7 | ∞ | 8.63269 | 1.000000 |
| | | | (aperture stop) |
| 8 | 173.72702 | 17.51225 | 1.563840 |
| 9 | −238.22683 | 12.06856 | 1.000000 |
| 10 | −101.43114 | 17.11040 | 1.563840 |
| 11 | −203.60368 | 15.33085 | 1.000000 |
| 12 | 166.15887 | 5.69882 | 1.563840 |
| 13 | −238.28227 | 3.88554 | 1.000000 |
| 14 | −81.50201 | 6.11086 | 1.563840 |
| 15 | −78.07944 | 6.05381 | 1.000000 |
| 16 | 74.48074 | 12.50264 | 1.563840 |
| 17 | −220.48073 | 11.91135 | 1.000000 |
| 18 | −82.31072 | 8.08050 | 1.563840 |
| 19 | 275.42052 | 19.38991 | 1.000000 |
| 20 | −67.68594 | 9.24998 | 1.563840 |
| 21 | −210.48779 | 7.57457 | 1.000000 |
| 22 | −244.62903 | 15.02358 | 1.563840 |
| 23 | −48.44360 | 9.91096 | 1.000000 |
| 24 | 69.69555 | 8.01551 | 1.563840 |
| 25 | 97.21932 | 10.30374 | 1.000000 |
| 26 | −28.90898 | 14.32626 | 1.563840 |
| 27 | 102.56872 | 7.92284 | 1.000000 |
| 28 | 43.32668 | 8.22930 | 1.563840 |
| 29 | 2828.72964 | 10.81079 | 1.000000 |
| 30 | 243.23452 | 16.81079 | 1.563840 |
| 31 | 39.78134 | 24.96409 | 1. 000000 |
| 32 | ∞ | | (conjugate plane on reticle side) |

Figure 47:
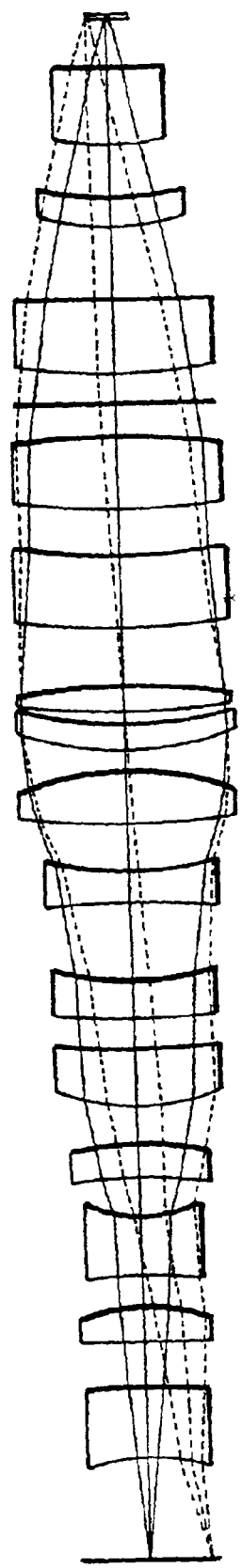
FIG. 47 is a path diagram of a projection optical system (No. 1) generated by the designing method of optical system (the fourth embodiment) according to the present invention.
Figure 48:
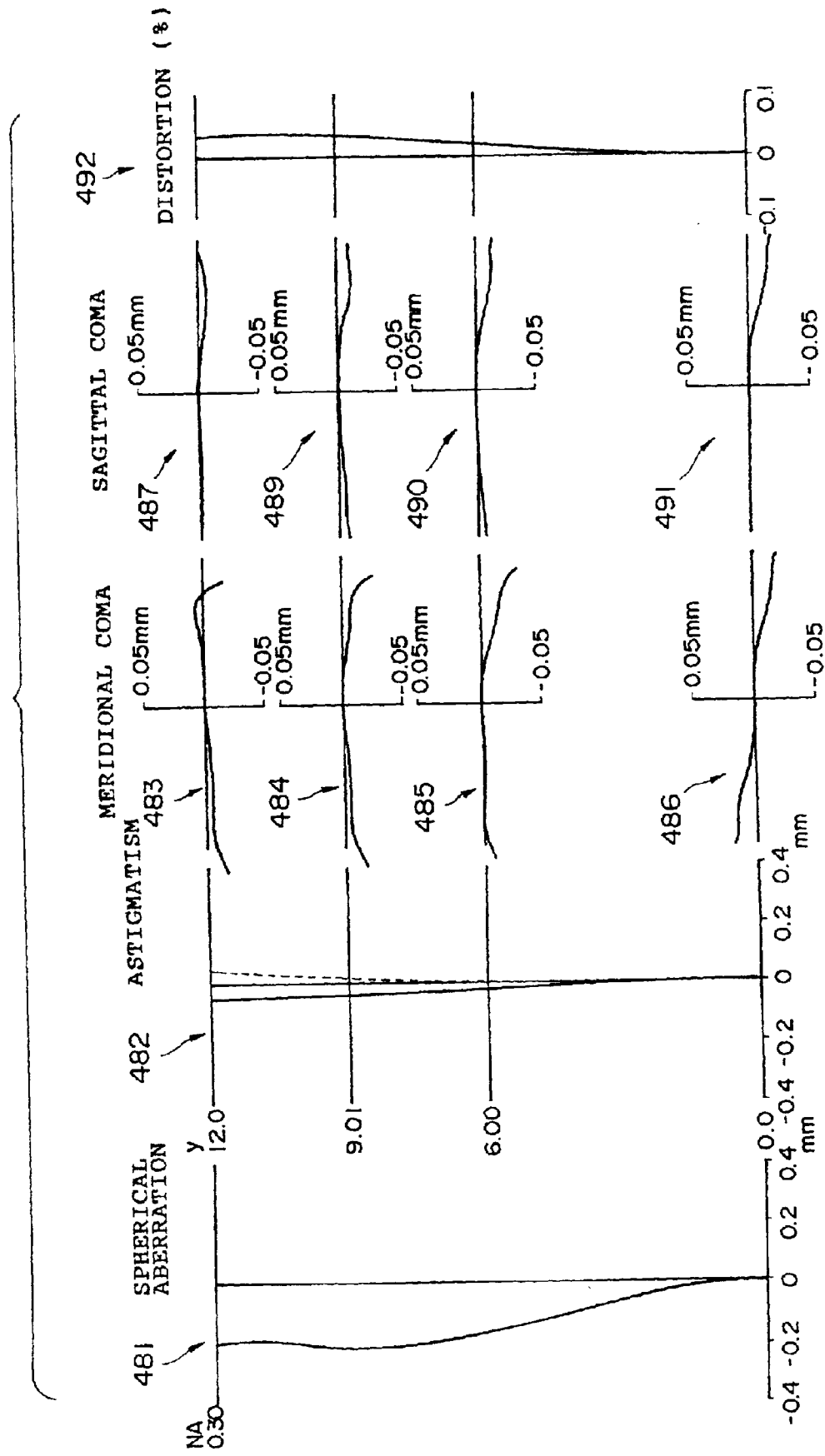
FIG. 48 is an aberration diagram of the projection optical system shown in FIG. 47.

FIG. 47 is a cross-sectional view of the projection optical system represented in above Table 1 and FIG. 48 is an aberration diagram to show aberrations thereof. Here, 481 in FIG. 48 is a spherical aberration diagram, 482 in FIG. 48 is an astigmatism diagram, 483 in FIG. 48 shows the meridional coma at the maximum object height, 484 in FIG. 48 the meridional coma at 75% of the maximum object height, 485 in FIG. 48 the meridional coma at 50% of the maximum object height, 486 in FIG. 48 the meridional coma on the optic axis, 487 in FIG. 48 the sagittal coma at the maximum object height, 488 in FIG. 48 the sagittal coma at 75% of the maximum object height, 490 in FIG. 48 the sagittal coma at 50% of the maximum object height, 491 in FIG. 48 the sagittal coma on the optic axis, and 492 in FIG. 48 a distortion diagram. In the astigmatism diagram of 482 in FIG. 48 the dashed line indicates the meridional image surface and the solid line the sagittal image surface. In FIG. 48 NA denotes the numerical aperture and Y the object height.

Figure 49:
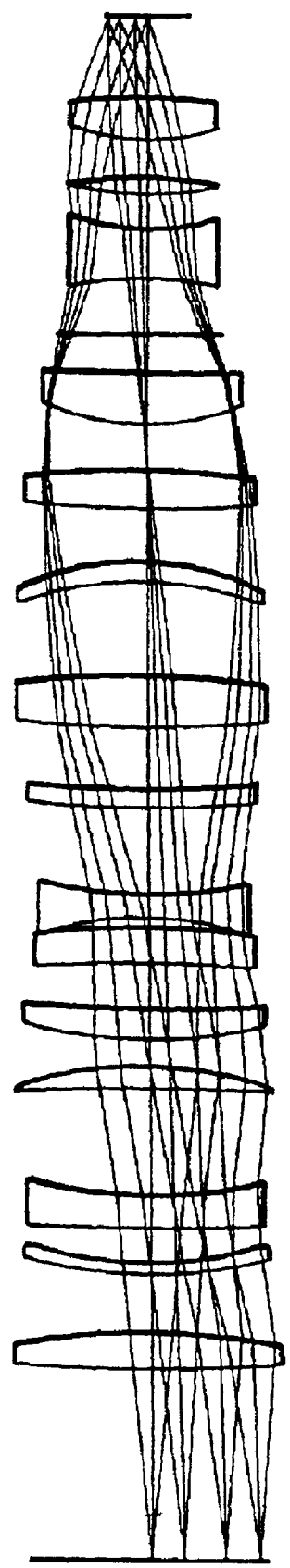
FIG. 49 is a path diagram of a projection optical system (No. 2) generated by the designing method of optical system (the fourth embodiment) according to the present invention.

FIG. 49 is a cross-sectional view of the projection optical system as Application 2 where twenty four thousand crossovers were carried out under conditions that the size of initial population was 400 and fifty children were generated.

By the designing method of optical system in each of Applications 1 and 2 as described above, a good solution (individual) can be obtained even though the number of lens elements is large.

Although the glass materials for the respective lenses were predetermined in above Application 1 and Application 2, it is needless to mention that they can be defined as parameters. On this occasion, since the glass Materials often exist discretely, the genetic parameters used should be those for handling discrete values.

As described above, the designing method of optical system according to the present invention has the effect of generating the optical system as a globally optimal solution independent of the initial solution given. Since the present invention utilizes the genetic parameters for handling the continuous values explicitly, child individuals of the next generation generated from parent individuals can succeed to characters (properties) of the parent individuals and this succession to characters is repeated, thus achieving the effect of eliminating wasteful searches and thus obtaining the optimal solution or the near-optimal solution within a shorter time. Further, the designing method of optical system of the present invention also has the effect that a plurality of optical systems can be generated simultaneously as multi-objective optimal solutions that must exist corresponding to a plurality of conflicting evaluation criteria.

What is claimed is:

1. A determining method of movement sequence for determining an order of measurement of a plurality of measurement target areas, which is executed prior to an alignment step in which while the plurality of measurement target areas provided on a substrate are successively moved into a preset measuring area of a measuring system, positions of the respective measurement target areas moved into the measuring area are measured, thereby achieving alignment between a transfer position of a pattern of an original plate and each chip area on the substrate, said determining method of movement sequence comprising an arithmetic step of obtaining a solution of a most preferable movement sequence with respect to an overall movement time between said plurality of measurement target areas, by using a predetermined search technique, said arithmetic step comprising:

a first step of generating a group including a plurality of executable movement sequences out of a group of movement sequence candidates, each indicating a measurement order of said plurality of measurement target areas; and a second step of selecting a movement sequence that can accomplish a movement operation between said plurality of target areas in the shortest time, out of said group generated.

2. The method according to claim 1, further comprising a pre-step carried out prior to said arithmetic step, said pre-step being a step of producing a movement time management table in which for each of said plurality of measurement target areas, a movement time is recorded as a time necessary for movement of the target area of interest from a position thereof at the time of completion of position measurement of either one of said plurality of measurement target areas into said measuring area of the measuring system.

3. The method according to claim 2, wherein said movement time management table includes such information that for a pair of measurement target areas selected out of said plurality of measurement target areas, after completion of the position measurement of one measurement target area selected, the other measurement target area selected is prohibited from moving from a position thereof at the time of completion of the position measurement of the one measurement target area selected into said measuring area of the measuring system.

4. The method according to claim 1, wherein said search technique includes at least one of a method based on operations-research technique, an evolutionary computation method, and a combination thereof.

5. The method according to claim 4, wherein said method based on operations-research technique includes at least one of a linear programming method, a Lin and Kernighan's approach, and a k-OPT method.

6. The method according to claim 5, wherein said linear programming method is a method arranged in such a manner that when there exist plural near solutions to the best solution of a movement sequence to be obtained, a plurality of good solutions are generated by recomputation with change in a method for selecting one specific solution or with change in a search start point and a most preferable, good solution with respect to the overall movement time between said plurality of measurement target areas is selected out of the plurality of good solutions thus generated.

7. The method according to claim 5, wherein said combination method including said linear programming method is a method arranged in such a manner that, using a plurality of first good solutions obtained by said linear programming method for a movement sequence to be obtained, as initial solutions, a plurality of second good solutions are generated by the Lin and Kernighan's approach or the k-OPT method and a most preferable, second good solution with respect to the overall movement time between said plurality of target areas is selected out of said plurality of second good solutions thus generated.

8. The method according to claim 1, wherein said search technique obtains a solution of a most preferable movement sequence with respect to the overall movement time between said plurality of target areas by use of a genetic algorithm, using constraint satisfying solutions generated at random, as initial solutions.

9. The method according to claim 1, wherein said search technique obtains a solution of a most preferable movement sequence with respect to the overall movement time between said plurality of target areas by use of a genetic algorithm, using solutions obtained by at least one of a linear programming method, a Lin and Kernighan's approach, a k-OPT method, and a combination thereof, as starting solutions.

10. The method according to claim 9, wherein an execution time of said arithmetic step using said genetic algorithm is shortened by improvement in solutions of movement sequences updated on occasion during execution of said genetic algorithm by one of the Lin and Kernighan's approach and the k-OPT method.

11. The method according to claim 9, wherein said genetic algorithm has a mutation operator, said mutation operator having an operator for changing an order of measurement of measurement target areas selected from said plurality of measurement target areas.

12. A determining method of movement sequence for determining an order of measurement of a plurality of alignment marks as becoming measurement targets provided on a substrate, which is executed prior to an alignment step in which while the plurality of alignment marks are successively moved into a preset measuring area of a measuring system, positions of the respective alignment marks moved into the measuring area are measured, thereby achieving alignment between a transfer position of a pattern of an original plate and each chip area on the substrate, said determining method of movement sequence comprising an arithmetic step of obtaining a solution of a most preferable movement sequence with respect to an overall movement time between said plurality of alignment marks, by use of a predetermined search technique, said arithmetic step comprising:

at least a first step of generating a group including a plurality of executable movement sequences out of a group of movement sequence candidates, each indicating a measurement order of said plurality of alignment marks; and a second step of selecting a movement sequence that can accomplish a movement operation between said plurality of alignment marks in the shortest time, out of said group generated.

13. The method according to claim 12, further comprising a pre-step carried out prior to said arithmetic step, said pre-step being a step of producing a movement time management table in which for each of said plurality of alignment marks, a movement time is recorded as a time necessary for movement of the alignment mark of interest from a position thereof at the time of completion of position measurement of either one of said plurality of alignment marks into said measuring area of the measuring system.

14. The method according to claim 13, wherein said movement time management table includes such information that for a pair of alignment marks selected out of said plurality of alignment marks, after completion of the position measurement of one alignment mark selected, the other alignment mark selected is prohibited from moving from a position thereof at the time of completion of the position measurement of the one alignment mark selected into said measuring area of the measuring system.

15. An alignment apparatus for successively measuring positions of a plurality of alignment marks as becoming measurement targets provided on a substrate and performing alignment between a transfer position of a pattern of an original plate and each chip area on the substrate by use of a statistical arithmetic method based on information of the positions of the respective alignment marks obtained, said positioning apparatus comprising:

a measuring device for measuring each of the positions of said plurality of alignment marks;

a moving device for effecting relative movement between said plurality of alignment marks and a measuring area of said measuring device;

an arithmetic section for generating a group of a plurality of executable movement sequences out of a group of movement sequence candidates, each indicating a measurement order of said plurality of alignment marks, and selecting a movement sequence that accomplishes a movement operation between said plurality of alignment marks within the shortest time, out of said group generated; and a control section for controlling said moving device so as to successively move said plurality of alignment marks into the measuring area of said measuring device, according to a solution of the movement sequence obtained by said arithmetic section.

16. The apparatus according to claim 15, further comprising a memory for storing a movement time management table in which for each of said plurality of alignment marks, a movement time is recorded as a time necessary for movement of the alignment mark of interest from a position thereof at the time of completion of position measurement of either one of said plurality of alignment marks into said measuring area of the measuring device.

17. The apparatus according to claim 16, wherein said movement time management table stored in said memory includes such information that for a pair of alignment marks selected out of said plurality of alignment marks, after completion of the position measurement of one alignment mark selected, the other alignment mark selected is prohibited from moving from a position thereof at the time of completion of the position measurement of the one alignment mark selected into said measuring area of the measuring device.

18. The apparatus according to claim 15, wherein said arithmetic section executes a search technique of at least one of a method based on operations-research technique, an evolutionary computation method, and a combination thereof.

19. A mark detecting method of sequentially detecting a plurality of areas to be detected on a substrate by using a detecting device having a predetermined detecting field, said method comprising:

a determining step of determining an order for positioning each of the areas to be detected into the predetermined detecting field by using at least one of a Lin and Kernighan's approach, a k-OPT method, an evolutionary computation method and a combination thereof; and a movement step of moving the substrate so as to sequentially position each of the areas to be detected into the predetermined detecting field in accordance with the order determined in said determining step.

20. The method according to claim 19, wherein the order determined in said determining step is a solution of a most preferable movement sequence, based on an overall movement time between the areas to be detected.

21. The method according to claim 20, wherein said determining step comprises:

a first step of generating a group including a plurality of executable movement sequences out of a group of movement sequence candidates each indicating a visiting order of the areas to be detected; and a second step of selecting a movement sequence that accomplish a movement operation between the areas to be detected in the shortest time, out of said group generated in said first step.

22. The method according to claim 19, wherein the evolutionary computation method includes a genetic algorithm.

23. The method according to claim 19, wherein each of the areas to be detected has an alignment mark.

24. The method according to claim 23, wherein a plurality of shot area are provided on the substrate, each of the alignment marks in the areas to be detected is associated with one of the shot areas, and each of the shot areas has ones of the alignment marks in the areas to be detected.

25. A method of exposing a predetermined pattern onto each of a plurality of shot areas on a substrate, said method comprising:

a detecting step of sequentially detecting a plurality of areas to be detected on the substrate by using a detecting apparatus having a predetermined detecting field, each of the areas to be detected having an alignment mark, said detecting step comprising:

a determining step of determining an order of positioning each of the areas to be detected into the predetermined detecting field by using at least one of a Lin and Kernighan's approach, a k-OPT method, an evolutionary computation method and a combination thereof; and a movement step of moving the substrate so as to sequentially position each of the areas to be detected into the predetermined detecting field in accordance with the order determined in said determining step; and a transferring step of controlling a position of the substrate, based on the detected results in said detection of alignment mark, and sequentially transferring the predetermined pattern onto the shot areas.

26. A method of manufacturing a device, comprising:

a detecting step of sequentially detecting a plurality of areas to be detected on the substrate by using a detecting apparatus having a predetermined detecting field, each of the areas to be detected having an alignment mark, said detecting step comprising:

a determining step of determining an order of positioning each of the areas to be detected into the predetermined detecting field by using at least one of a Lin and Kernighan's approach, a k-OPT method, an evolutionary computation method and a combination thereof; and a movement step of moving the substrate so as to sequentially position each of the areas to be detected into the predetermined detecting field in accordance with the order determined in said determining step; and a transferring step of controlling a position of the substrate, based on the detected results in said detection of alignment mark, and sequentially transferring a device pattern onto the shot areas.

27. A mark detecting method of detecting a plurality of measurement marks associated with a plurality of shot areas arranged on a substrate, said method comprising the steps of:

a first step of detecting at least one of a plurality of first measurement marks provided associated with a predetermined shot area out of the shot areas; and a second step of detecting at least one of a plurality of second measurement marks provided associated with a shot area different from the predetermined shot area, before detecting all of the first measurement marks.

28. The method according to claim 27, further comprising a third step of detecting one or more remaining first measurement marks which are not detected in said first step, after said second step.

29. A method of exposing a predetermined pattern onto each of a plurality of shot areas on a substrate, said method comprising:

a detecting step of detecting a plurality of measurement marks provided associated with a plurality of shot areas arranged on a substrate said detecting step comprising:
  a first step of detecting at least one of plurality of first measurement marks provided associated with a predetermined shot area out of the shot areas;
  a second step of detecting at least one of a plurality of second measurement marks provided associated with a shot area different from the predetermined shot area, before detecting all of the first measurement marks; and
  a third step of detecting one or more remaining first measurement marks which are not detected in said first step, after said second step; and
a transferring step of controlling a relative position between each of the shot areas on the substrate and the predetermined pattern, based on the detected results in said detection of alignment mark, and sequentially transferring the predetermined pattern onto the shot areas.

30. A method of manufacturing a device, comprising:
a detecting step of detecting a plurality of measurement marks provided associated with a plurality of shot areas arranged on a substrate, said detecting step comprising:
  a first step of detecting at least one of plurality of first measurement marks provided associated with a predetermined shot area out of the shot areas;
  a second step of detecting at least one of a plurality of second measurement marks provided associated with a shot area different from the predetermined shot area, before detecting all of the first measurement marks; and
  a third step of detecting one or more remaining first measurement marks which are not detected in said first step, after said second step; and
a transferring step of controlling a relative position between each of the shot areas on the substrate and the predetermined pattern, based on the detected results in said detection of alignment mark, and sequentially transferring a device pattern onto the shot areas.

31. A mark detecting apparatus which sequentially detects a plurality of areas to be detected on a substrate by using a detecting device having a predetermined detecting field, said apparatus comprising:
  a determining device which determines an order for positioning each of the areas to be detected into the predetermined detecting field by using at least one of a Lin and Kernighan's approach, a k-OPT method, an evolutionary computation method and a combination thereof; and
  a movement device which is electrically connected to the determining device and which moves the substrate so as to sequentially position each of the areas to be detected into the predetermined detecting field, based on the order determined by said determining device.

32. The apparatus according to claim 31, wherein the order determined by said determining device is a solution of a most preferable movement sequence, based on an overall movement time between said areas.

33. The apparatus according to claim 32, wherein the evolutionary computation method includes a genetic algorithm.

34. The apparatus according to claim 32, wherein each of the areas to be detected has an alignment mark.

35. The apparatus according to claim 34, wherein a plurality of shot areas are provided on the substrate, each of the alignment marks in the areas to be detected is associated with one of the shot areas, and each of the shot areas has ones of the alignment marks in the areas to be detected.

36. An exposure apparatus that sequentially exposes a predetermined pattern onto each of a plurality of shot areas on a substrate, said exposure apparatus comprising:
  a mark detecting apparatus sequentially detecting a plurality of areas to be detected on the substrate by using a detection apparatus having a predetermined detecting field, each of the areas to be detected having an alignment mark, said detection apparatus comprising:
    a determining device which determines an order for positioning each of the areas to be detected into the predetermined detecting filed by using at least one of a Lin and Kernighan's approach, a k-OPT method, an evolutionary computation method and a combination thereof; and
    a movement device which is electrically connected to the determining device and which moves the substrate so as to sequentially position each of the areas to be detected into the predetermined detecting field, based on the order determined by said determining device; and
  a transferring control apparatus which is electrically connected to the mark detecting apparatus and controls a position of the substrate, based on the detected results in the detection of alignment mark by said mark detecting apparatus, and sequentially transfers the predetermined pattern onto the plurality of shot areas.

37. A mark detecting apparatus which detects a plurality of measurement marks associated with a plurality of shot areas arranged on a substrate, said apparatus comprising:
  a detecting device that detects at least one of a plurality of first measurement marks provided associated with a predetermined shot area out of the shot areas; and
  a control device, electrically connected to said detecting device, that controls said detecting device to detect at least one of a plurality of second measurement marks associated with a shot area different from the predetermined shot area, before detecting all of the first measurement marks.

38. The apparatus according to claim 37, wherein said control device controls said detecting device to detect a part of the first measurement marks, detect second measurement marks after detecting the part of the first measurement marks, and detect one or more remaining first measurement marks other than the part of the first measurement marks, after detecting the second measurement marks.

39. An exposure apparatus that exposes a predetermined pattern onto each of a plurality of shot areas on a substrate, said exposure apparatus comprising:
  a mark detecting apparatus sequentially detecting a plurality of areas to be detected on the substrate by using a detection apparatus having a predetermined detecting field, each of the areas to be detected having an alignment mark, said detection apparatus comprising:
    a determining device which determines an order for positioning each of the areas to be detected into the predetermined detecting field by using at least one of a Nearest Neighbor method, a Lin and Kernighan's approach, a k-OPT method, an evolutionary computation method and a combination thereof; and
    a control device which is electrically connected to the determining device and controls said detecting device so as to detect a part of the first measurement marks, detect second measurement marks after detecting the part of the first measurement marks, and detect one or more remaining first measurement marks, which are not measured after detecting the second measurement marks; and a transferring control apparatus which is electrically connected to the mark detecting apparatus and controls a position of the substrate, based on the detected results in the detection of alignment mark by said mark detecting apparatus, and sequentially transfers the predetermined pattern onto the plurality of shot areas.

* * * * *